United States Patent
Sasago et al.

(10) Patent No.: US 7,190,017 B2
(45) Date of Patent: Mar. 13, 2007

(54) SEMICONDUCTOR DEVICE AND METHOD OF MANUFACTURING THE SAME

(75) Inventors: Yoshitaka Sasago, Kokubunji (JP); Takashi Kobayashi, Tokorozawa (JP)

(73) Assignee: Hitachi, Ltd., Tokyo (JP)

( * ) Notice: Subject to any disclaimer, the term of this patent is extended or adjusted under 35 U.S.C. 154(b) by 288 days.

(21) Appl. No.: 11/022,773

(22) Filed: Dec. 28, 2004

(65) Prior Publication Data

US 2005/0151168 A1   Jul. 14, 2005

Related U.S. Application Data

(63) Continuation of application No. 10/457,656, filed on Jun. 10, 2003, now Pat. No. 6,849,502.

(30) Foreign Application Priority Data

Jun. 21, 2002   (JP)   ............................ P2002-182027

(51) Int. Cl.
   *H01L 29/76*   (2006.01)
(52) U.S. Cl. ................................ 257/314
(58) Field of Classification Search ............... 257/314
   See application file for complete search history.

(56) References Cited

U.S. PATENT DOCUMENTS

| | | |
|---|---|---|
| 5,095,344 A | 3/1992 | Harari |
| 6,060,357 A | 5/2000 | Lee |
| 6,638,822 B2 | 10/2003 | Chang |
| 2002/0182806 A1 | 12/2002 | Kim |
| 2003/0017671 A1 | 1/2003 | Lee et al. |

FOREIGN PATENT DOCUMENTS

JP   2694618   6/1989

OTHER PUBLICATIONS

Hitoshi Kume, "Flash Memory Technology", Applied Physics, vol. 65, Nov. 1996, pp. 1114-1124 (with English Translations of Tables 4, 5 and 6).

*Primary Examiner*—Carl Whitehead, Jr.
*Assistant Examiner*—Monica D. Harrison
(74) *Attorney, Agent, or Firm*—Reed Smith LLP; Stanley P. Fisher, Esq.; Juan Carlos A. Marquez, Esq.

(57) ABSTRACT

Reliability of a semiconductor device having a nonvolatile memory comprising first through third gate electrodes is enhanced. With a flash memory having first gate electrodes (floating gate electrodes), second gate electrodes (control gate electrodes) and third gate electrodes, isolation parts are formed in a self-aligned manner against patterns of a conductor film for forming the third gate electrodes by filling up the respective isolation grooves and a gate insulator film for select nMISes in a peripheral circuit region is formed prior to the formation of the isolation parts. By so doing, deficiency with the gate insulator film for the select nMISes, caused by stress occurring to the isolation parts, can be reduced. Further, with the semiconductor device including the case of stacked memory cells, the patterns of the conductor film for forming the third gate electrodes, serving as a mask for forming the isolation parts in the self-aligned manner, can be formed without misalignment against channels.

12 Claims, 77 Drawing Sheets

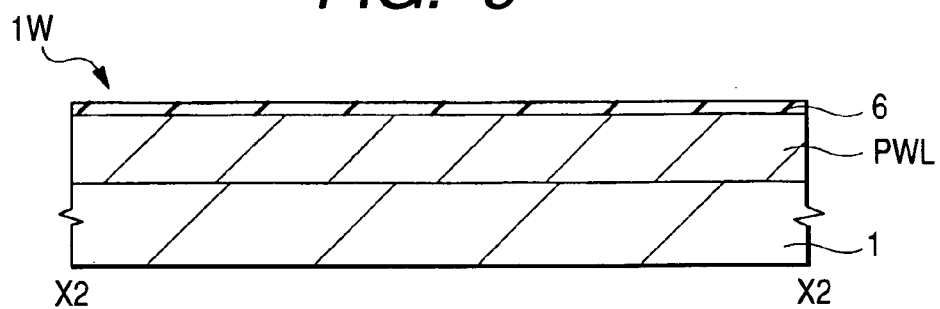
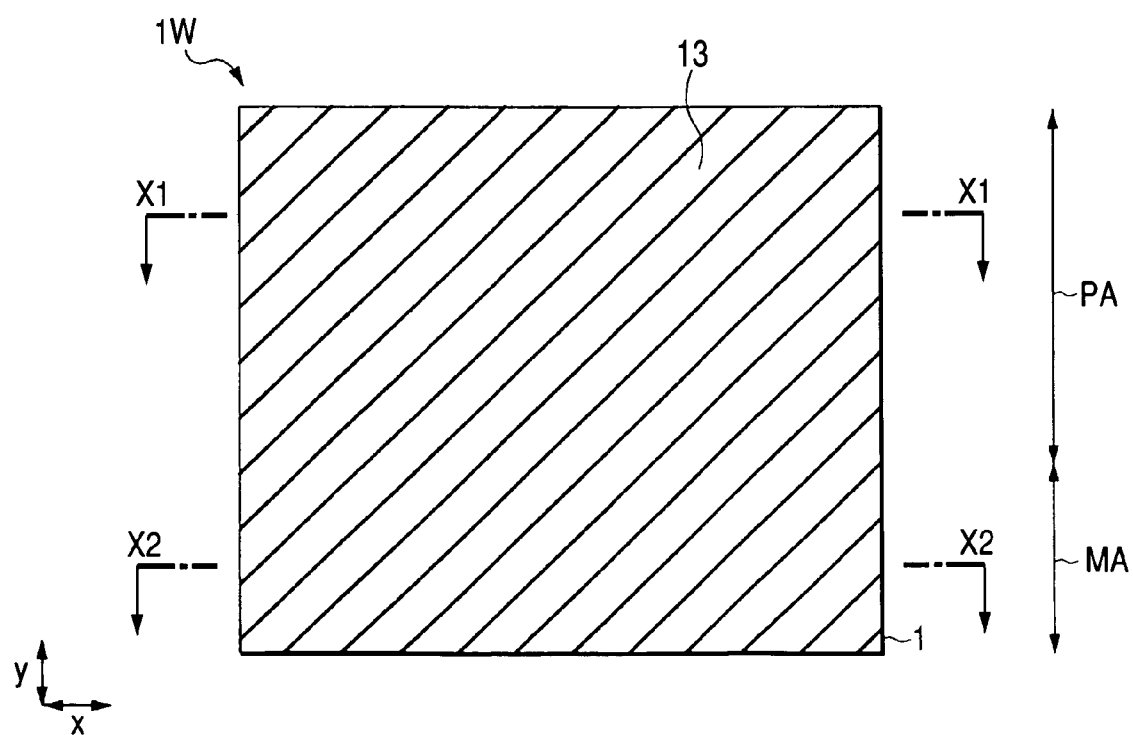

SEMICONDUCTOR DEVICE AND METHOD OF MANUFACTURING THE SAME

This application is a Continuation application of nonprovisional U.S. Ser. No. 10/457,656 filed on Jun. 10, 2003 now U.S. Pat. No. 6,849,502. Priority is claimed based upon U.S. application Ser. No. 10/457,656 filed on Jun. 10, 2003, which claims the priority date of Japanese Patent Application 2002-182027 filed on Jun. 21,2002.

BACKGROUND OF THE INVENTION

1. Field of the Invention

The present invention relates to technology concerned with a semiconductor device and a method of manufacturing the same, and in particular, to technology effective for application to a method of manufacturing a semiconductor device having a nonvolatile memory capable of electrically programming and erasing.

2. Description of the Related Art

There has been known the so-called flash memory capable of bulk erasing among semiconductor devices having a nonvolatile memory capable of electrically programming and erasing. Because the flash memory excels in portability and impact resistance, and is capable of electrically bulk erasing, there has been a rapid increase in demand for it as a memory device for use in a personal digital assistant such as a portable personal computer, digital still camera, and so forth in recent years. Reduction in bit cost, due to contraction in memory cell area, is an important factor for achieving expansion of its market, and as described in, for example, "Applied Physics" issued by the Society of Applied Physics, Vol. 65, No. 11, Nov. 10, 1996, pp. 1114–1124, there have since been proposed various memory cell schemes intended to attain such a purpose.

Further, for example, virtual ground memory cells using three-layered polysilicon gates are disclosed in JP, 2694618, B. That is, this memory cells each have semiconductor regions and three gates, formed in a well of a semiconductor substrate. The three gates include a floating gate formed on top of the well, a control gate formed so as to extend over the well and the floating gate, and an erase gate formed between the control gate and the floating gate, adjacent to each other. The three gates are made of polysilicon, and are isolated from each other by an insulator film, respectively, the floating gate being also isolated from the well. The control gate is connected to control gates adjacent thereto so as to be aligned in the direction of row lines, constituting a word line. This is a virtual ground memory cell array wherein source and drain diffusion layers are formed so as to be aligned in the direction of column lines, orthogonal to the direction of the row lines, and the diffusion layers are in common use with adjacent memory cells. By so doing, relaxation of pitches in the direction of the column lines is aimed at. The erase gate is disposed so as to be parallel with a channel as well as the word line between adjacent word lines (control gates).

As tasks to be tackled, in common with all those memory cells, there can be cited the following problems attributable to the fact that a repetition pattern of isolation regions and channel regions tends to have narrower pitches as a result of reduction in memory cell size. First, the formation of the isolation regions at narrower pitches will result in occurrence of large stress in the course of oxidation processes such as gate oxidation of surrounding transistors, gate oxidation of the floating gates of memory cells, and so forth, so that quality deficiencies occur to a substrate, leading to occurrence of a leak between the source and the drain of transistors to thereby create a cause for malfunction. Further, a gate oxide cannot be formed to a uniform thickness due to stress, resulting in occurrence of a problem such as a kink to the volt-ampere characteristic of the transistors, and so forth. Still further, not only the upper surface of the substrate but also sidewall faces thereof undergo oxidation at the time of the gate oxidation, so that the channel width of the transistor will be reduced, thereby disabling the transistor to obtain sufficient current.

As a stack-type flash memory technology developed to solve those problems described above, there has been reported, for example, a technology whereby shallow groove isolation are formed by use of floating gates as a mask. Adverse effects of stress occurring at the time of the gate oxidation can be avoided by forming the gate oxide prior to the formation of the shallow groove isolation.

Now, in contrast to the stack-type flash memory cell, a split-gate memory cell, which is another type of memory cell, has many advantages in that programming is executed by injecting channel-hot-electrons generated on the source side, and faster program speed and program operation at lower power consumption can be implemented by taking advantage of a high injection efficiency. However, when down-sizing the split-gate memory cell as well, there naturally exists the problem associated with the formation of the shallow groove isolation at narrow pitches.

SUMMARY OF THE INVENTION

It is therefore an object of the invention to provide a technology capable of enhancing the reliability of a semiconductor device having a nonvolatile memory comprising first through third gate electrodes.

The object, other objects, and novel features of the invention will become apparent from description of the specification with reference to the accompanying drawings.

A representative embodiment of the invention disclosed by the present application is summarized as follows.

That is, a method of manufacturing a semiconductor device having a plurality of nonvolatile memory cells each comprising a first gate electrode serving as a floating gate electrode, a second gate electrode serving as a control gate electrode and a third gate electrode, according to the invention, comprises the steps of defining an isolation groove in a self-aligned manner in respective isolation regions of a peripheral circuit region using patterns of a conductor film for forming the third gate electrodes as a mask after forming a gate electrode film for transistors for peripheral circuits, and forming isolation parts in a self-aligned manner against the patterns of the conductor film for forming the third gate electrodes by filling up the respective isolation grooves.

Further, another representative embodiment of the invention disclosed by the present application is summarized as follows.

That is, the invention provides a method of manufacturing a semiconductor device, further comprising the steps of forming respective gate electrodes for the transistors for the peripheral circuits by patterning the patterns of the conductor film for forming the third gate electrodes, defining a plurality of holes reaching the respective gate electrodes of the transistors such that the respective holes for connection to the gate electrodes, adjacent to each other, are disposed in a staggered arrangement so as to be deviated in directions opposite to each other, and forming separate wiring layers insulated from each other such that the separate wiring layers insulated from each other are electrically connected with the respective holes reaching the gate electrodes, adjacent to each other, Still further, the invention provides a method of manufacturing a semiconductor device, wherein when forming first semiconductor regions to be formed on a semiconductor substrate so as to be extended along a longitudinal side of the third gate electrodes, a boundary line at an end of a first masking pattern covering a peripheral region, on the side of the memory region, is positioned away from a boundary line at respective ends of the third gate electrodes, on the side of the peripheral region, towards the peripheral region.

BRIEF DESCRIPTION OF THE DRAWINGS

FIG. 9 is a sectional view taken on line X2—X2 in FIG. 7;

FIG. 10 is a plan view of the wafer 1W, in a step of subsequent to the step shown in FIG. 7;

FIG. 126 is a sectional view taken on line Y6—Y6 in FIG. 123;

FIG. 127 is a sectional view taken on line Y5—Y5 in FIG. 123, in a step of the method of manufacturing the semiconductor device, subsequent to the step shown in FIG. 123; and FIG. 128 is a sectional view taken on line Y6—Y6 in FIG. 123, in a step of the method of manufacturing the semiconductor device, subsequent to the step shown in FIG. 123.

DETAILED DESCRIPTION OF THE PREFERRED EMBODIMENTS

Figure 1:
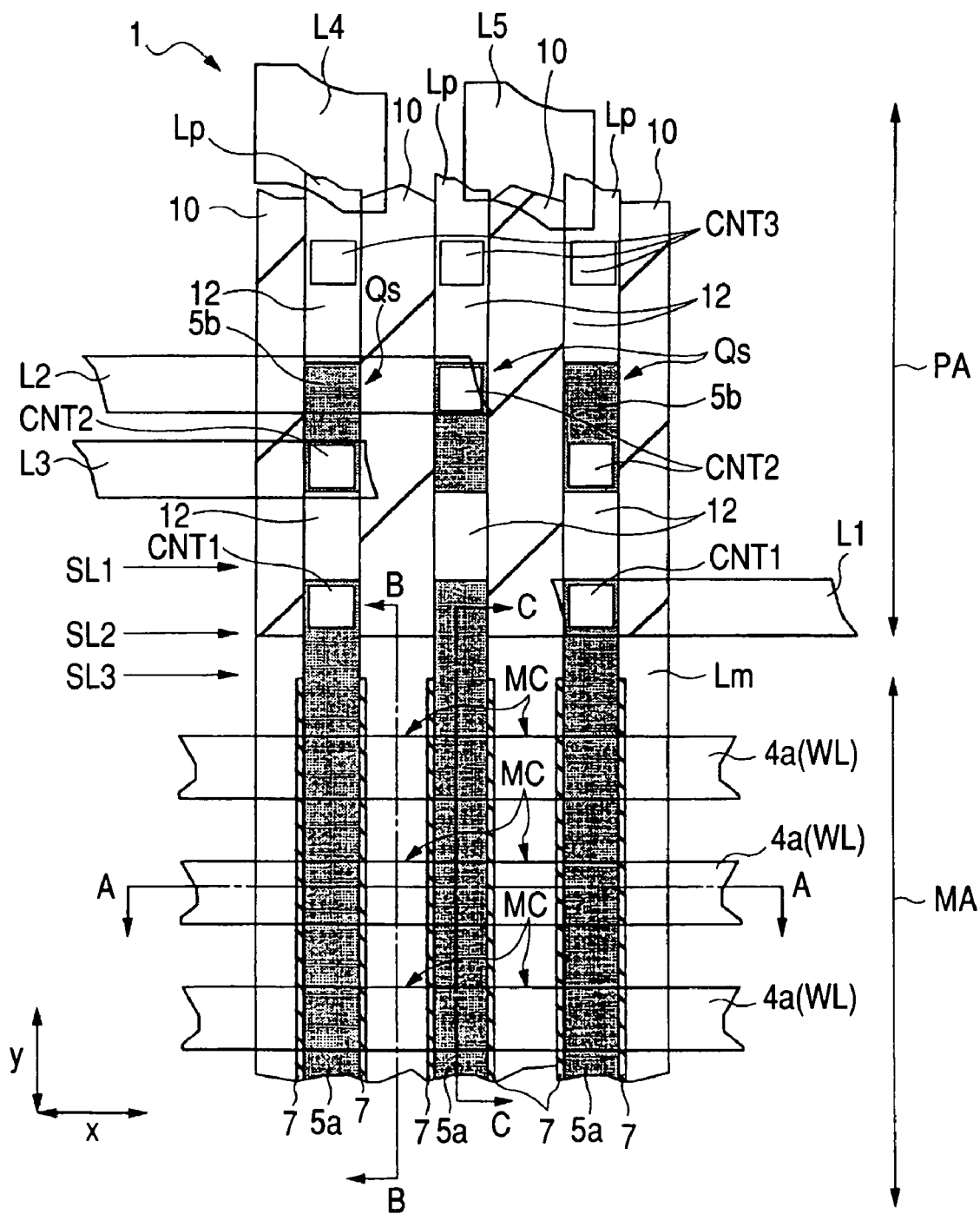
FIG. 1 is a plan view of an embodiment of a semiconductor device according to the invention, showing the principal part thereof by way of example.

With reference to preferred embodiments of the invention, description will be given hereinafter by dividing the same into a plurality of sections or a plurality of the preferred embodiments as necessary for the sake of convenience, however, it is to be pointed out that respective descriptions are not unrelated to each other unless explicitly expressed otherwise, but one thereof is related to variations, details, supplementary description, and so forth, of part or the whole of the rest. Further, with reference to the preferred embodiments described hereinafter, when reference is made to numbers etc. (including the number of pieces, numerical values, quantities, scopes, etc.) of elements, the invention is not limited to such specific numbers unless explicitly expressed otherwise or evidently limited to specific numbers on a theoretical basis, so that the numbers may be more than, or less than the specific numbers. Furthermore, with reference to the preferred embodiments described hereinafter, it goes without saying that constituent elements (including elements, steps, etc.) are not necessary essential unless explicitly expressed otherwise or considered evidently essential on a theoretical basis. Similarly, with reference to the preferred embodiments described hereinafter, when reference is made to shape, position, relationship, etc. of the constituent elements, and so forth, those substantially approximate to, or analogous to the shape etc. are deemed to be included unless explicitly expressed otherwise or considered evidently otherwise on a theoretical basis. The same applies to the numerical values and the scopes as described above. Further, in all figures for use in describing the embodiments of the present invention, parts having the same function are denoted by like reference numerals, omitting repeated description thereof. With reference to the figures for use in describing the preferred embodiments of the invention, there are cases where even plan views are provided with hatched parts for easy viewing. Still further, with reference to the embodiments of the present invention, a MIS•FET (Metal Insulator Semiconductor Field Effect Transistor) representative of field effect transistors is referred to simply as a MIS, a p-channel MIS FET is referred to simply as a pMIS, and an n-channel MIS FET is referred to simply as an nMIS. Herein, a MOS (Metal Oxide Semiconductor) •FET represents the lower concept of the MIS.

The embodiments of the present invention are described in detail hereinafter with reference to the accompanying drawings.

Embodiment 1

Figure 2:
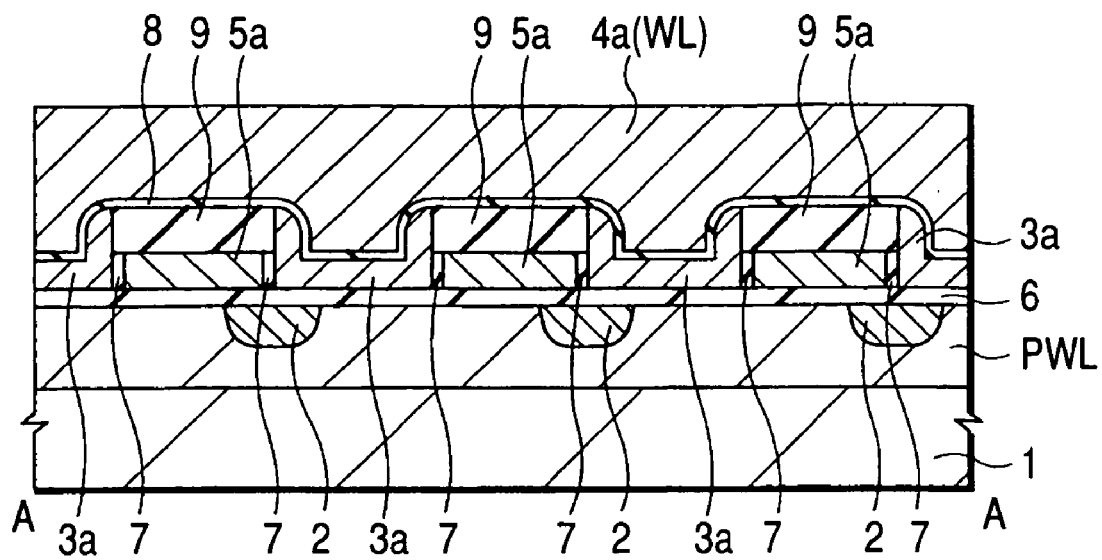
FIG. 2 is a sectional view taken on line A—A in Fig.
Figure 3:
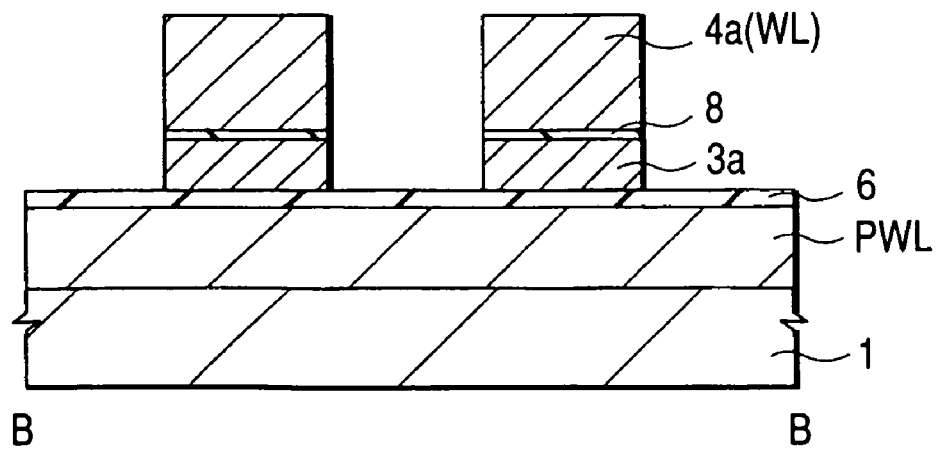
FIG. 3 is a sectional view taken on line B—B in Fig.
Figure 4:
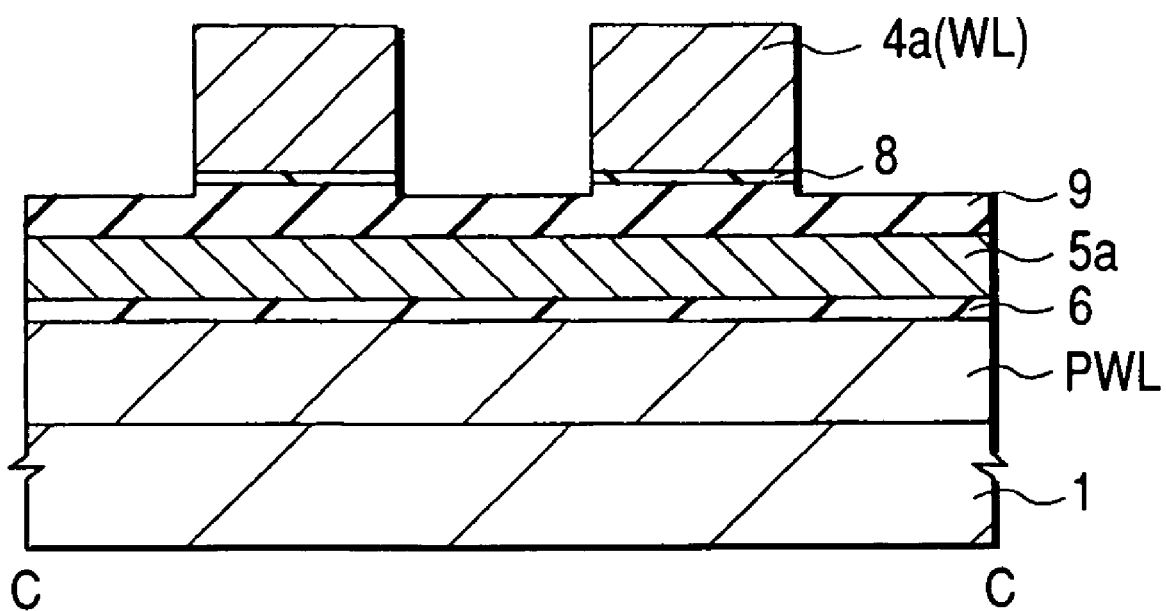
FIG. 4 is a sectional view taken on line C—C in FIG. 1.

FIG. 1 is a plan view of an embodiment of a semiconductor device according to the invention, showing the principal part of a memory region MA and a peripheral circuit region PA. FIGS. 2 through 4 are sectional views taken on lines A—A, B—B, and C—C, in FIG. 1, respectively. In FIG. 1, some parts of constituent members are omitted for easy viewing.

The semiconductor device according to the embodiment 1 has a plurality of nonvolatile memory cells MC of the so-called flash memory, and the respective memory cells MC comprise n-type diffusion layers 2 for use as a source and a drain, respectively, in a p-type well PWL formed in an active region (a first active region) Lm on the top surface of a semiconductor substrate (hereinafter referred to merely as a substrate) 1, a first gate electrode (floating gate electrode) 3a, a second gate electrode (control gate electrode) 4a, and a third gate electrode 5a. The substrate 1 is made of, for example, p-type single crystal silicon. The p-type well PWL is formed by introducing, for example, boron (B) or boron difluoride (BF2) therein by the ion implantation method while the n-type diffusion layers 2 is formed by introducing, for example, phosphorus (P) or arsenic (As) therein by the ion implantation method.

In the respective memory cells MC, the first gate electrode 3a having the function of the floating gate electrode is disposed in a region where it (the first gate electrode 3a) is overlapped with the second gate electrode 4a in the same plane inside a plurality of gaps between the third gate electrodes 5a, adjacent to each other. The second gate electrode 4a having the function of the control gate electrode is extended in the direction of row lines (the x-direction), constituting a word line (WL), and a plurality of the second gate electrodes 4a are disposed at predetermined intervals along the y-direction in FIG. 1 so as to be parallel with each other. The respective third gate electrodes 5a are extended in the y-direction, and are disposed at predetermined intervals along the x-direction in FIG. 1 so as to be parallel with each other. A band-like wiring layer L1 extending in the x-direction in FIG. 1 is formed in the upper layer at respective ends of the third gate electrodes 5a so as to overlie the respective ends in the same plane. The wiring layer L1 is electrically connected with every other third gate electrode 5a of the plurality of the third gate electrodes 5a through a contact hole CNT1, respectively. That is, power is supplied to the third gate electrodes 5a from the wiring layer L1 through the respective contact holes CNT1.

The first gate electrode 3a and the p-type well PWL are isolated from each other by a gate insulator film (first insulator film) 6, the first gate electrode 3a and the third gate electrode 5a are isolated from each other by an insulator film (a fourth insulator film) 7, the first gate electrode 3a and the second gate electrode 4a (the word line WL) are isolated from each other by an insulator film (a fifth insulator film) 8, and the third gate electrode 5a and the second gate electrode 4a (the word line WL) are isolated from each other by an insulator film (a second insulator film) 9, and the insulator film 8, respectively.

The n-type regions 2 for use as the source and the drain of each of the memory cells MC are disposed so as to be extended in the direction (the y-direction) orthogonal to the direction (the x-direction) in which the word line WL is extended, functioning as a local source line for connecting together the respective sources of the plurality of the memory cells MC disposed along the direction (the y-direction) of the column lines, and functioning as a local bit line for connecting together the respective drains of the plurality of the memory cells MC disposed along the direction of the column lines, respectively. That is, the semiconductor device according to the present embodiment is the so-called contactless memory cell array having no contact hole for every memory cell.

Respective channels of the memory cells MC are formed in the direction (the x-direction) orthogonal to an alignment of the n-type regions 2. Two end faces (side faces) of the respective third gate electrodes 5a are positioned so as to oppose two end faces (side faces) among the end faces (side faces) of the respective first gate electrodes 3a, oriented in the direction orthogonal to the word line WL, and to the direction in which the channels are extended through the intermediary of the insulator film 7, respectively. Further, each of the third gate electrodes 5a is disposed so as to be embedded in a gap between the first gate electrodes 3a adjacent to each other, existing along the direction (the y-direction) orthogonal to the word line WL as well as the direction in which the channels are extended. Furthermore, the first gate electrodes 3a adjacent to each other are at positions symmetrical about the respective third gate electrodes 5a while the third gate electrodes 5a adjacent to each other are at positions symmetrical about the respective first gate electrodes 3a.

With the embodiment 1, a pair of the diffusion layers 2, 2, for use as the source and the drain, respectively, are at positions asymmetrical with reference to the respective first gate electrodes 3a, thereby constituting an offset structure in which the diffusion layer 2 on one side of the pair is not overlapped with the respective first gate electrodes 3a in the same plane. Further, with the embodiment 1, the third gate electrodes 5a are disposed so as to partially overlap the diffusion layers 2 in the same plane, respectively. As a result, in the case of the embodiment 1, a channel is formed in a portion of the well PWL, under the respective third gate electrodes 5a as well, and the respective third gate electrodes 5a function as a gate for controlling the channel existing thereunder. In other word, the memory cells MC each are regarded as a split-gate transistor comprising the first gate electrode 3a, and the third gate electrode 5a.

Meanwhile, in the peripheral circuit region PA, there are disposed a plurality of select nMISes (first transistors) Qs that can contribute to selection of a memory cell MC as desired. The select nMISes Qs are formed in a plurality of active regions (second active regions) Lp in band-like form, extending in the y-direction of FIG. 1, in the peripheral circuit region PA, on the top surface of the substrate 1, respectively. The respective active regions Lp are device-forming regions defined by isolation parts 10 having a groove-like form in plane geometry, and, in the case of the embodiment 1, the respective active regions Lp are formed in a self-aligned manner by a conductor film pattern for forming the third gate electrodes 5a as described later. Accordingly, the respective active regions Lp are formed in such a state as extended along a direction in which the third gate electrodes 5a are extended, and in such a state as having a width substantially identical to a width (a dimension in the direction of the short side thereof, that is, the dimension in the transverse direction) of each of the third gate electrodes 5a. With the embodiment 1, since the respective active regions Lp for forming the respective select nMISes Qs therein are formed in the self-aligned manner with the use of the conductor film pattern for forming the third gate electrodes 5a, it is possible to enhance accuracy of relative positioning between the respective select nMISes Qs and the respective third gate electrodes 5a as well as accuracy of positions where the respective select nMISes Qs are formed. This enables an area occupied by the memory region to be reduced. Furthermore, it is possible to enhance the electrical characteristics of circuits between the memory region MA and the peripheral circuit region PA.

The respective select nMISes Qs have a gate electrode 5b, diffusion layers (second semiconductor regions) 12 for use as a source and drain, respectively, formed in portions of the substrate 1 (the second active region Lp), on each side (each side in the y-direction of FIG. 1) of the gate electrode 5b, and a gate insulator film interposed between the gate electrode 5b, and the substrate 1. A channel of each of the select nMISes Qs is formed in a portion of the substrate 1, directly underneath the gate electrode 5b. The gate electrode 5b is made of, for example, polysilicon, and is formed along the longitudinal direction of the second active region Lp to a length enabling two of the contact holes CNT1 to be disposed. One contact hole (hole) CNT2 is connected to the respective gate electrodes 5b, which are electrically connected with wiring layers (first and second wiring layers) L2, L3, respectively, extended in a straight line along the x-direction of the FIG. 1, respectively, through the respective contact holes CNT2. That is, power is supplied to the respective electrodes 5b of the select nMISes Qs from the wiring layers L2, L3, respectively, through the respective contact holes CNT2. In this connection, with the embodiment 1, the respective contact holes CNT2 for the electrodes 5b of the select nMISes Qs, adjacent to each other in the x-direction of the FIG. 1, are disposed so as to stagger with each other in the y-direction of the FIG. 1. As a result, the wiring layer L2 is electrically connected to the electrode 5b corresponding to the even-number-th one of a plurality of the electrodes 5b disposed along the x-direction of the FIG. 1 while the wiring layer L3 is electrically connected to the electrode 5b corresponding to the odd-number-th one of the plurality of the electrodes 5b disposed along the x-direction of the FIG. 1. A gate insulator film of each of the select nMISes Qs is equal in thickness to the gate insulator film 6 underneath the respective first gate electrodes 3a of the memory cells MC. However, the thickness of the gate insulator film of each of the select nMISes Qs may be rendered larger than that of the gate insulator film 6 underneath the respective first gate electrodes 3a of the memory cells MC. By so doing, the gate dielectric breakdown voltage of the select nMISes Qs can be enhanced.

Wiring layers L4, L5, extended in parallel with each other, along the y-direction of the FIG. 1, indicate global bit lines, respectively. The wiring layers L4, L5 are electrically connected with one of diffusion layers 12 of each of the select nMISes Qs through a contact hole CNT3, respectively. That is, when implementing power supply to the diffusion layers 2 serving as local bit lines, power is supplied from the wiring layers L4, L5, respectively, to the one of the diffusion layers 12 of each of the select nMISes Qs through the respective contact holes CNT3, and further to the other of the diffusion layers 12 of each of the select nMISes Qs via the respective select nMISes Qs, thereby supplying power to the respective diffusion layers 2 connected with the other of the diffusion layers 12.

A boundary line SL1 in FIG. 1 indicates a terminating end of a mask for use at the time of forming the diffusion layers 2, and a portion of the substrate 1, above the boundary line SL1, is covered with the mask while a portion of the substrate 1, below the boundary line SL1, is exposed out of the mask. In FIG. 1, the boundary line SL1 is positioned above the respective ends of the third gate electrodes 5a, and below the respective gate electrodes 5b of the nMISes Qs for use in the peripheral circuit region PA. Further, a boundary line SL2 indicates a terminating end of the respective isolation parts 10, in the longitudinal direction, while a boundary line SL3 indicates respective terminating ends of the insulator films 7, in the longitudinal direction.

Figure 5:
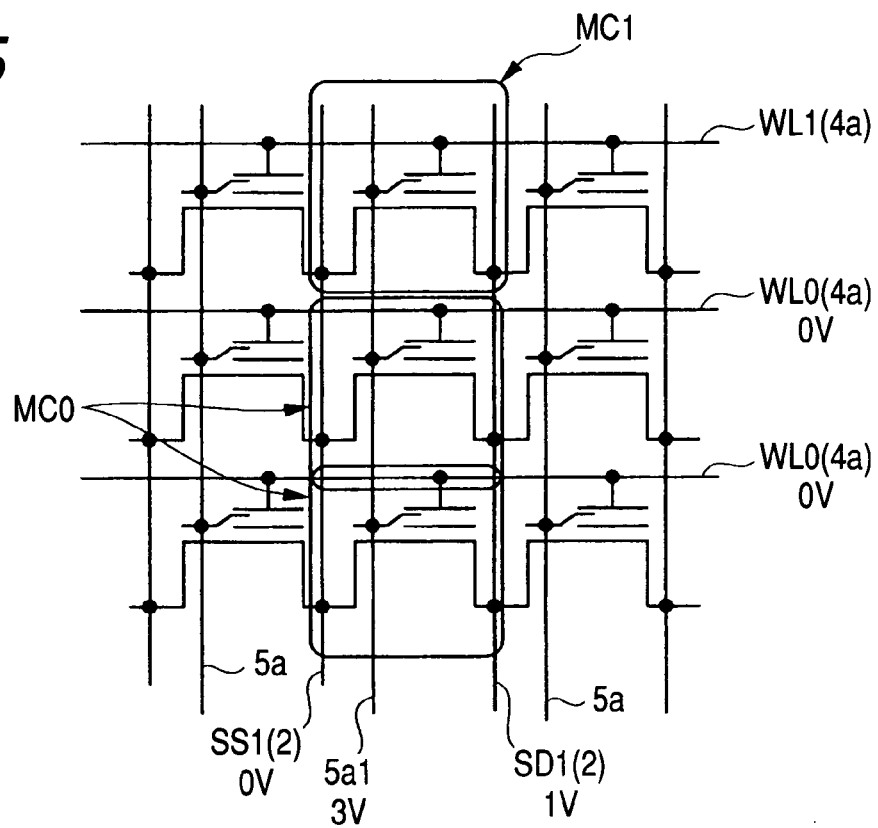
FIG. 5 is a circuit diagram for use in describing memory operation of the semiconductor device shown in FIG. 1.
Figure 6:
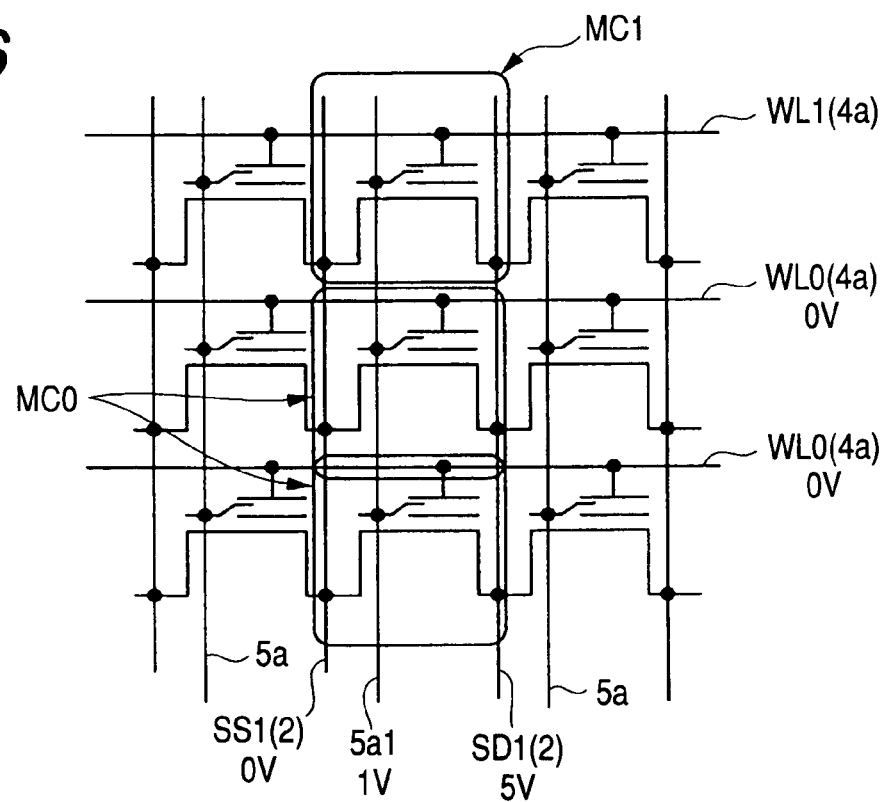
FIG. 6 is another circuit diagram for use in describing memory operation of the semiconductor device shown in FIG. 1.

Now, memory operation of the semiconductor device according to the embodiment 1 is described hereinafter with reference to FIGS. 5 and 6. FIG. 5 is a circuit diagram of part of the memory region for use in describing data read operation, and FIG. 6 is a circuit diagram of part of the memory region, for use in describing data program operation. In FIGS. 5 and 6, the memory cell MC as selected is denoted by a memory cell MC1, and the memory cell MC as unselected by a memory cell MC0. Further, a source line as selected is denoted by a source line SS1, and a bit line as selected is denoted by a bit line SD1. Furthermore, the word line WL as selected is denoted by a word line WL1, the word line WL as unselected by a word line WL0, the third gate electrode 5a as selected by a third gate electrode 5a1, and the third gate electrode 5a as unselected by a third gate electrode 5a.

At the time of reading data, as show in FIG. 5, a voltage at, for example, about 3V is applied to the third gate electrode 5a1 as selected, thereby forming the channel in a portion of the well PWL, under the gate electrode 5a1, and a voltage is applied to the word line WL1 for a selected bit. By doing so, the threshold voltage of the memory cell MC1 as selected is determined. Data of the memory cell MC1 as selected is thereby read. At the time of programming data, as show in FIG. 6, a voltage at, for example, about 13V is applied to the second gate electrode 4a (that is, the word line WL1) of the memory cell MC1 as selected, a voltage at, for example, about 5V is applied to the bit line SD1 (the drain) as selected, and a voltage at, for example, about 1V is applied to the third gate electrode 5a1 as selected, holding the source line SS1 and the well PWL at 0V. The channel is thereby formed in a portion of the well PWL, under the gate electrode 5a1, and hot electrons are generated in the channel at an end of the first gate electrode 3a, on the source side, whereupon electrons are injected into the first gate electrode 3a. With the embodiment 1, the third gate electrode 5a can also be used as an erase gate for pulling out electrons from the first gate electrode 3a adjacent thereto at the time of erasing.

Figure 7:
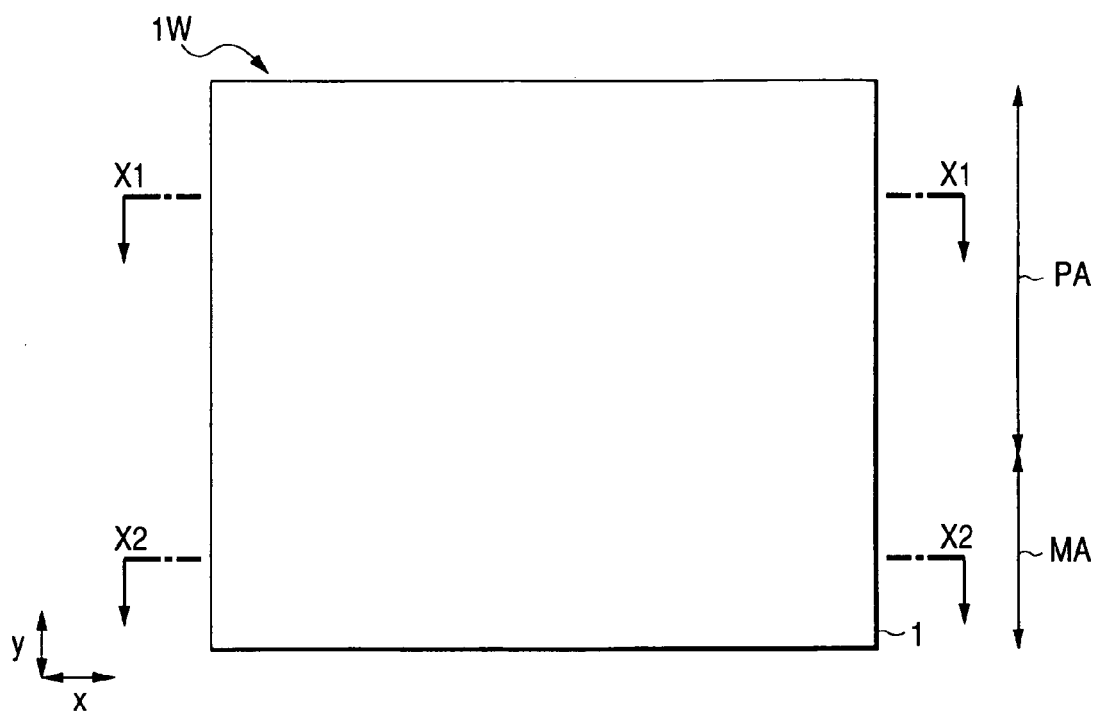
FIG. 7 is a plan view of the principal part of a wafer, in a step of the method of manufacturing the semiconductor device shown in FIG. 1.
Figure 8:
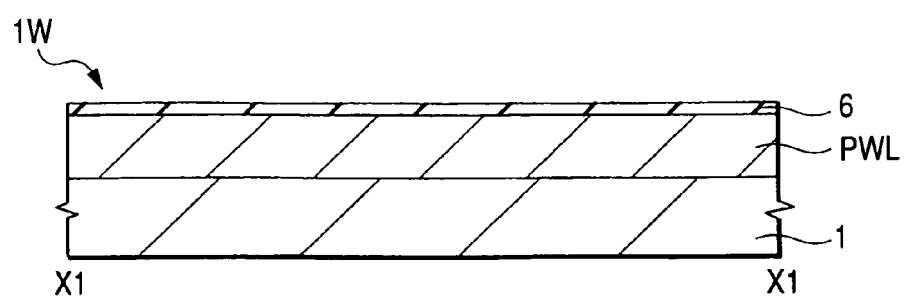
FIG. 8 is a sectional view taken on line X1—X1 in FIG. 7.
Figure 11:
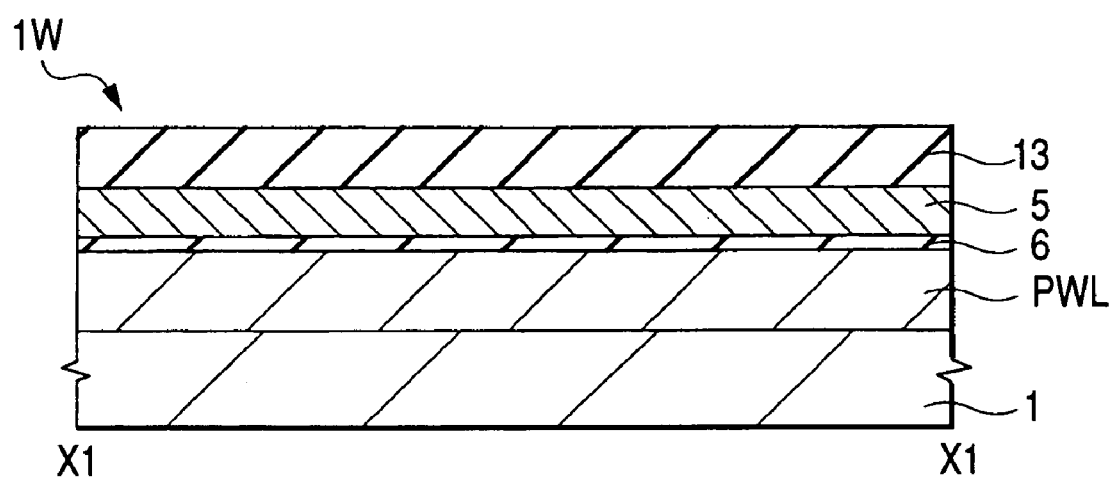
FIG. 11 is a sectional view taken on line X1—X1 in FIG. 10.
Figure 12:
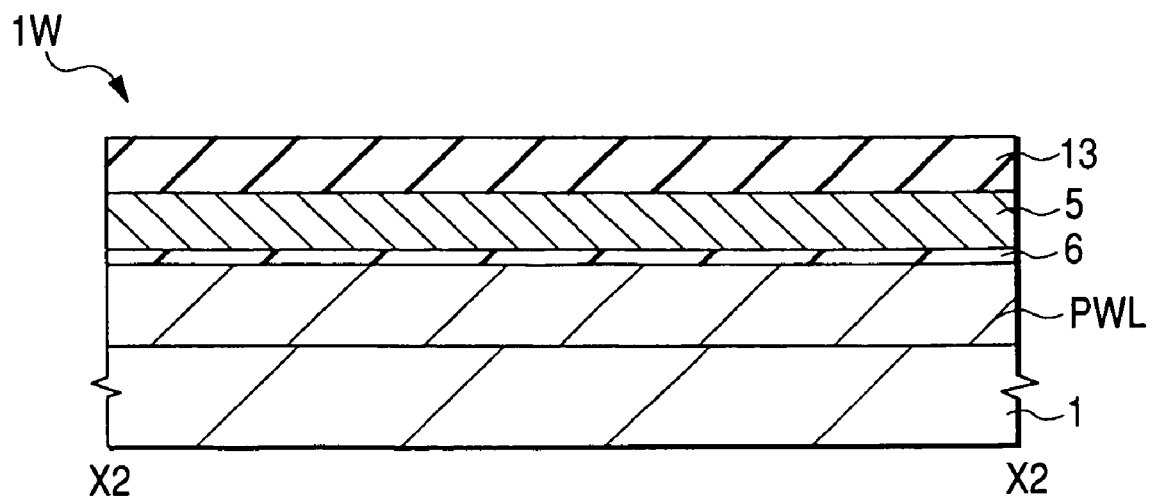
FIG. 12 is a sectional view taken on line X2—X2 in FIG. 10.

Next, a method of manufacturing the semiconductor device according to the embodiment 1 is described by way of example. FIG. 7 is a plan view of the semiconductor device according to the embodiment 1, in a step of the method of manufacturing the same, showing the boundary between the memory region MA and the peripheral circuit region PA of a wafer 1W, and the surroundings thereof, and FIGS. 8, and 9 are sectional views taken on lines X1—X1 and X2—X2 of FIG. 7, respectively. FIG. 10 is a plan view of the wafer 1W in a step of the method of manufacturing the semiconductor device, subsequent to the step shown in FIG. 7, showing the boundary between the memory region MA and the peripheral circuit region PA of the wafer 1W, and the surroundings thereof, and FIGS. 11, and 12 are sectional views taken on lines X1—X1 and X2—X2 of FIG. 10, respectively.

First, as shown FIGS. 7 through 9, after forming a p-type (first-conductivity type) well PWL in the substrate 1 made of p-type single crystal silicon making up the wafer 1W substantially circular in plane geometry, a gate insulator film (first insulator film) 6 for the memory cell, made up of a silicon oxide film about 10 nm thick, is formed by, for example, the thermal oxidation method. At this point in time, gate insulator films for the select nMISes and other peripheral transistors, respectively, are also formed. Subsequently, as shown in FIGS. 10 through 12, a conductor film (first conductor film) 5 made of polysilicon doped with, for example, phosphorus (P), and so forth, and an insulator film (second insulator film) 13, made up of a silicon nitride film are sequentially deposited in that order on top of the gate insulator film 6. The conductor film 5 is a film for forming the third gate electrodes. The conductor film 5 and the insulator film 13 can be deposited by the CVD (Chemical Vapor Deposition) method. The insulator film 13 corresponds to the insulator film 9 shown in FIGS. 2 and 4.

Figure 13:
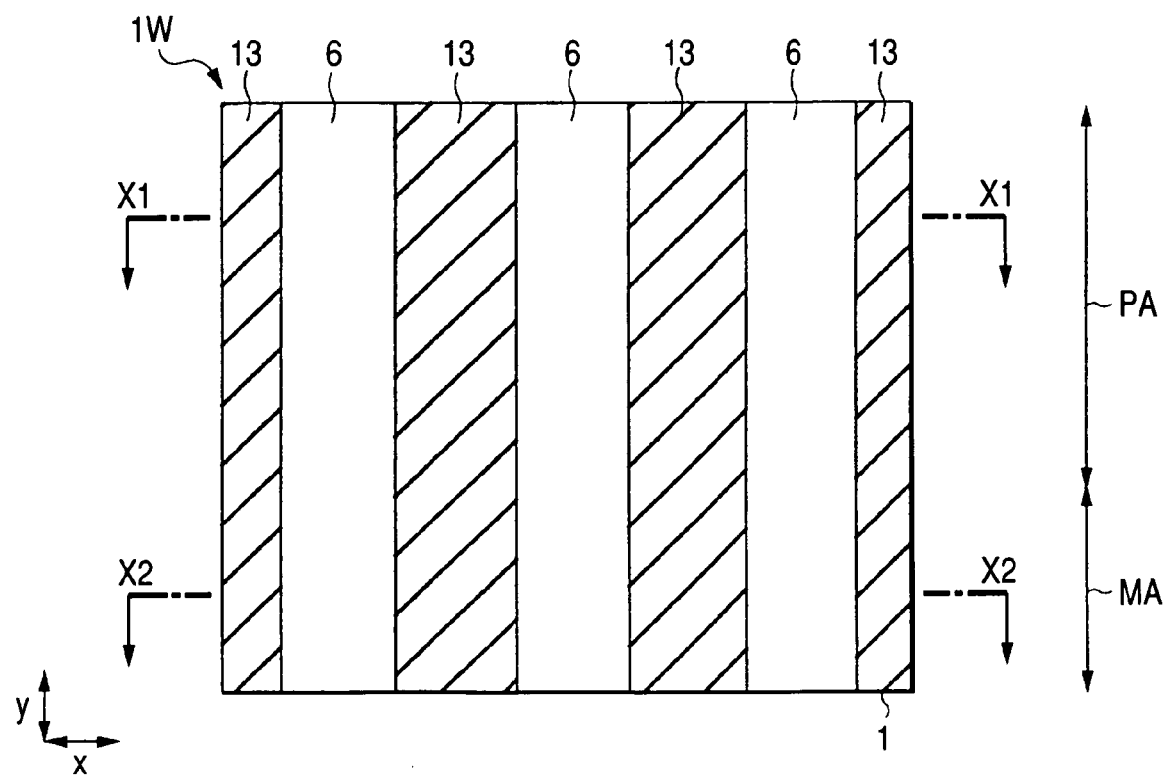
FIG. 13 is a plan view of the wafer 1W, in a step of the method of manufacturing the semiconductor device, subsequent to the step shown in FIG. 10.
Figure 14:
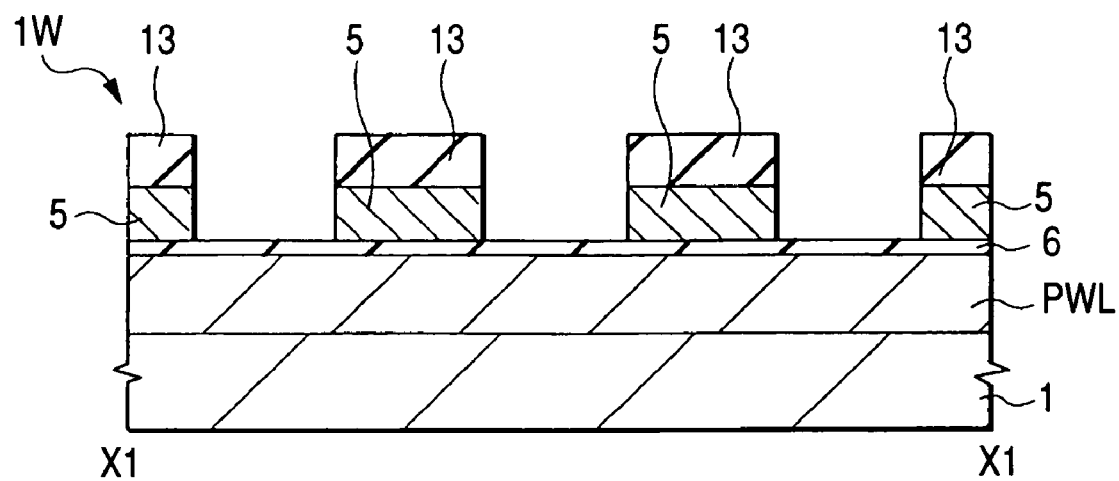
FIG. 14 is a sectional view taken on line X1—X1 in FIG. 13.
Figure 15:
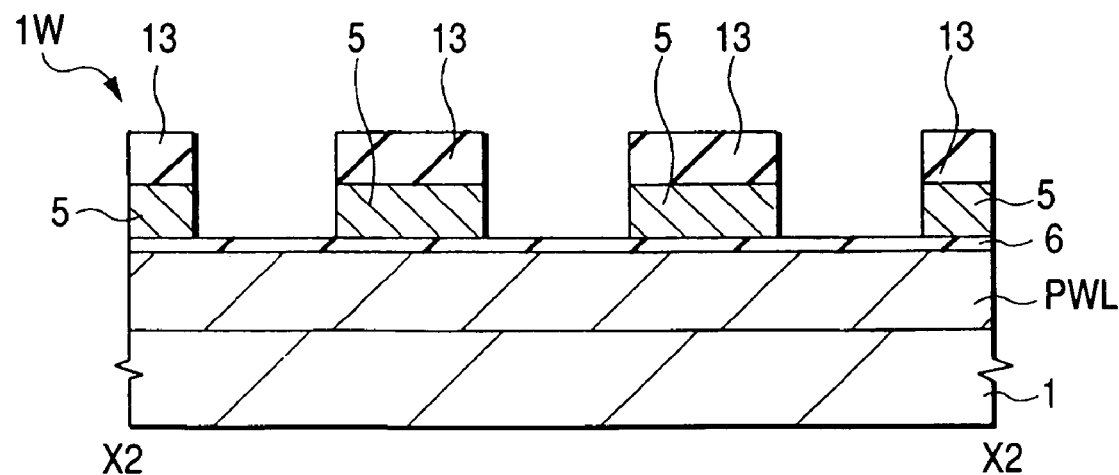
FIG. 15 is a sectional view taken on line X2—X2 in FIG. 13.
Figure 17:
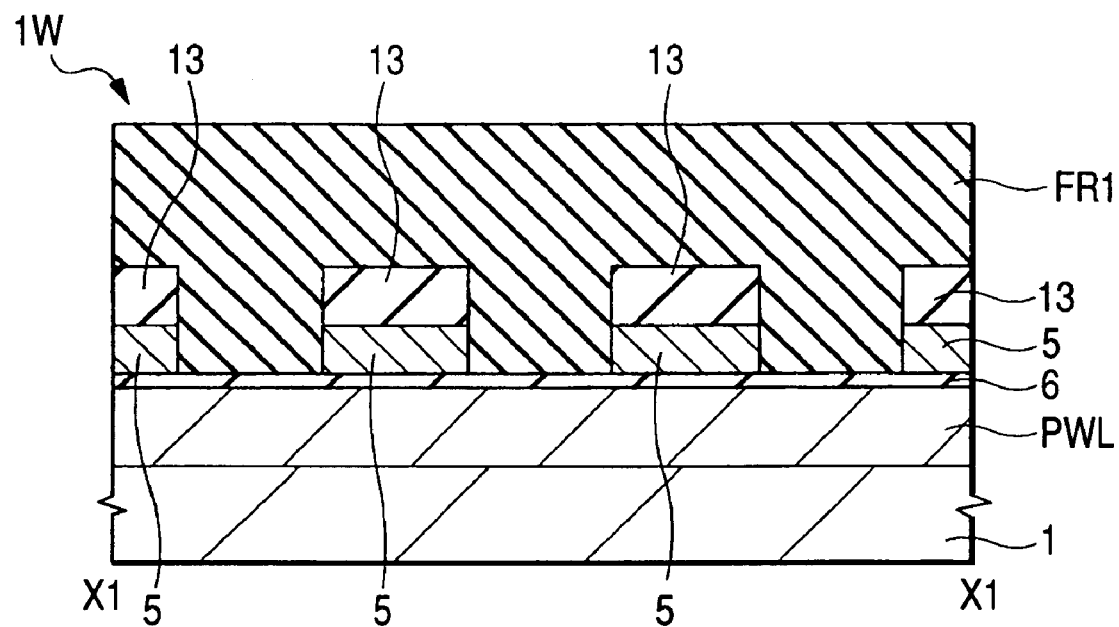
FIG. 17 is a sectional view taken on line X1—X1 in FIG. 16.
Figure 18:
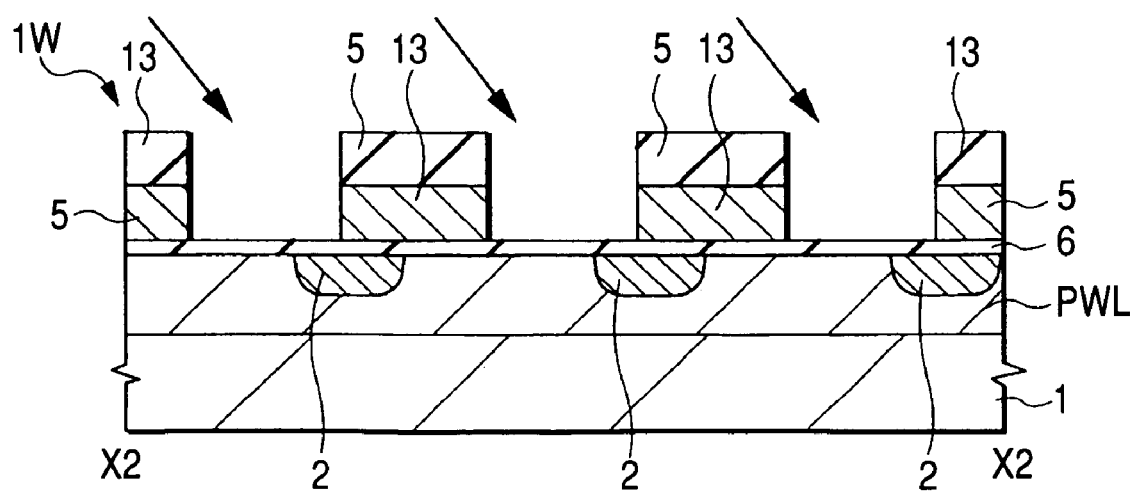
FIG. 18 is a sectional view taken on line X2—X2 in FIG. 16.

FIG. 13 is a plan view of the wafer 1W in a step of the method of manufacturing the semiconductor device, subsequent to the step shown in FIG. 10, showing the boundary between the memory region MA and the peripheral circuit region PA of the wafer 1W, and the surroundings thereof, and FIGS. 14, and 15 are sectional views taken on lines X1—X1 and X2—X2 of FIG. 13, respectively. Further, FIG. 16 is a plan view of the wafer 1W in a step of the method of manufacturing the semiconductor device, subsequent to the step shown in FIG. 13, showing the boundary between the memory region MA and the peripheral circuit region PA of the wafer 1W, and the surroundings thereof, and FIGS. 17, and 18 are sectional views taken on lines X1—X1 and X2—X2 of FIG. 16, respectively.

First, as shown in FIGS. 13 through 15, the insulator film 13 and the conductor film 5 are patterned by use of lithographic and dry etching techniques. By such patterning, patterns (first patterns) of the insulator film 13 and the conductor film 5, in band-like shape in plane geometry, respectively, extending in the y-direction of FIG. 13, are formed in the shape of stripes. In this stage of processing, the respective patterns of the insulator film 13 and the conductor film 5 are extended across the boundary between the memory region MA and the peripheral circuit region PA. Subsequently, as shown in FIGS. 16 through 18, the n-type diffusion layers (first semiconductor regions) 2 to serve as the source and the drain of each of the memory cells are formed by implanting, for example, arsenic (As) ions into the well PWL by the tilted ion implantation method. In this case, with the use of, for example, a photo resist (hereinafter referred to merely as a resist) pattern (first masking pattern) FR1 serving as a mask, there is formed a region where arsenic ions are not implanted. The boundary of the region is denoted by a boundary line SL1. The resist pattern FR1 is removed after the step of forming the diffusion layers 2.

The diffusion layers 2 each perform the function of the source line or bit line of each of the memory cells. At the time of the ion implantation, the patterns of the insulator film 13 and the conductor film 5 function as the mask, thereby forming the diffusion layers 2 in a self-aligned manner against the patterns of the conductor film 5. Since the patterns of the insulator film 13 and the conductor film 5 are formed in the shape of the stripes extending in the y-direction, the diffusion layers 2 are formed so as to be extended in the y-direction. Further, since the diffusion layers 2 are formed by the tilted ion implantation method, injected ions are shielded by the patterns of the insulator film 13 and the conductor film 5, so that the diffusion layers 2 are formed not throughout an entire region between the respective patterns of the conductor film 5, adjacent to each other. Furthermore, since ions are injected from a tilted direction, the diffusion layers 2 are formed under a portion of the respective patterns of the conductor film 5, as well, so that the respective third gate electrodes 5a (refer to FIG. 2) and the respective diffusion layers 2 are formed in such a way as to be partially overlapped with each other, thereby resulting in the formation of the channel in a portion of the well PWL, as well, under the respective third gate electrodes 5a (refer to FIG. 2).

Figure 16:
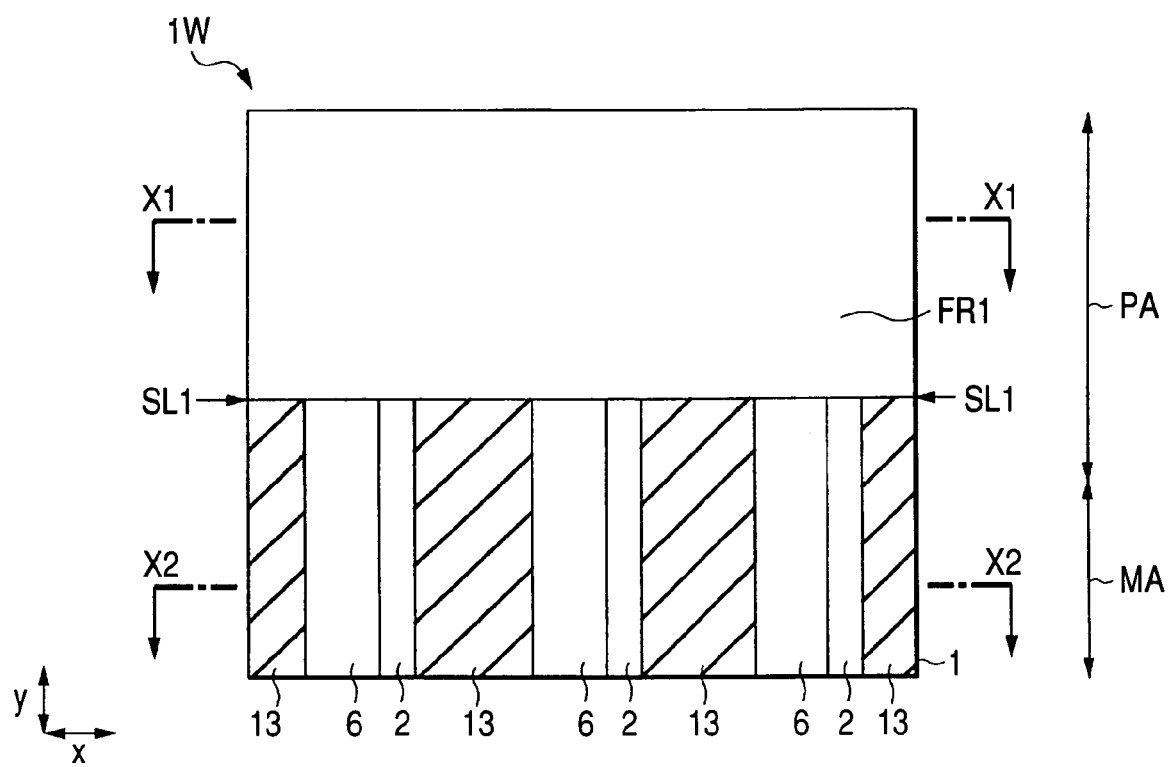
FIG. 16 is a plan view of the wafer 1W, in a step of the method of manufacturing the semiconductor device, subsequent to the step shown in FIG. 13.
Figure 19:
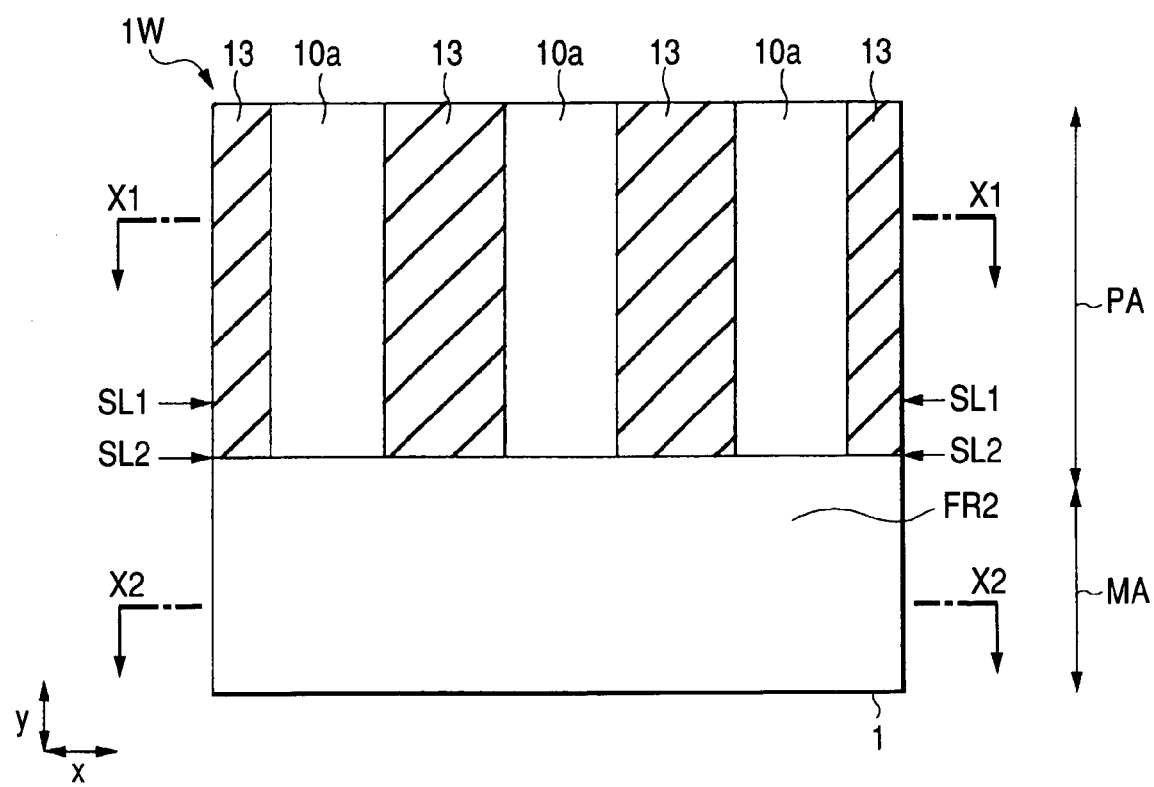
FIG. 19 is a plan view of the wafer 1W, in a step of the method of manufacturing the semiconductor device, subsequent to the step shown in FIG. 16.
Figure 20:
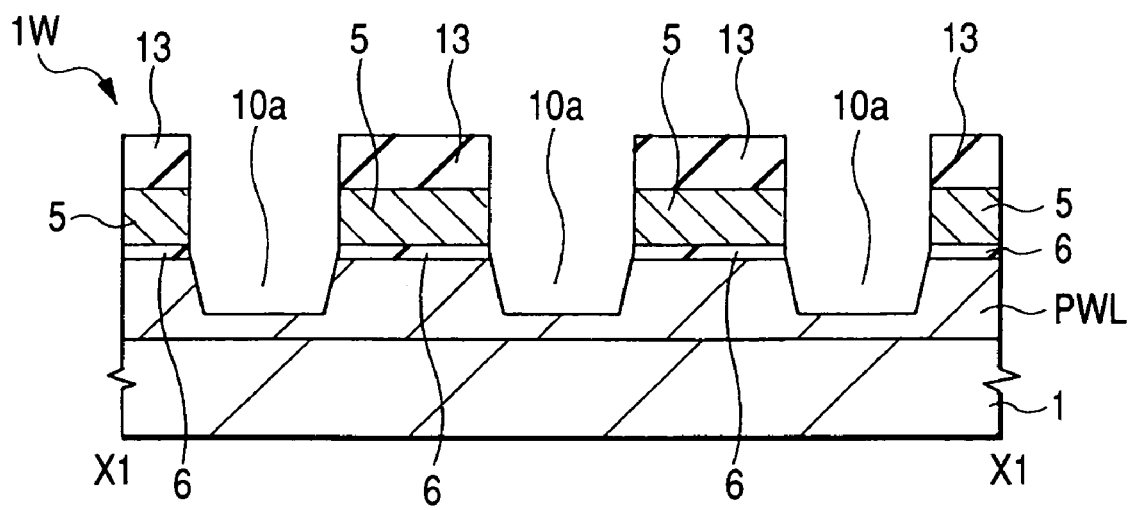
FIG. 20 is a sectional view taken on line X1—X1 in FIG. 19.
Figure 21:
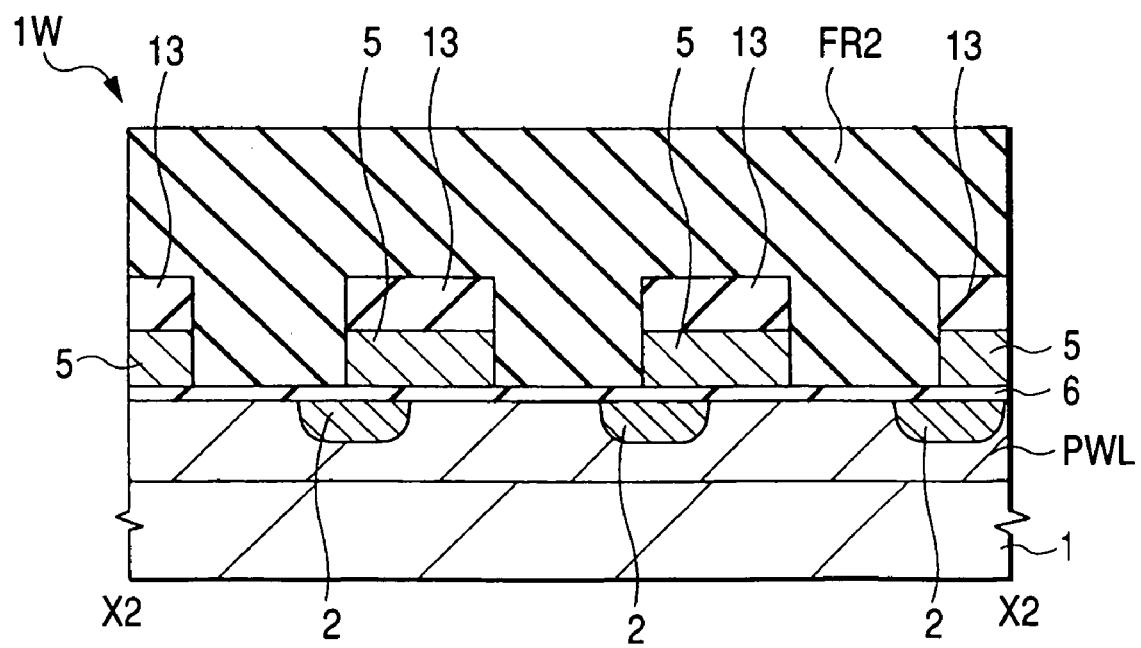
FIG. 21 is a sectional view taken on line X2—X2 in FIG. 19.
Figure 23:
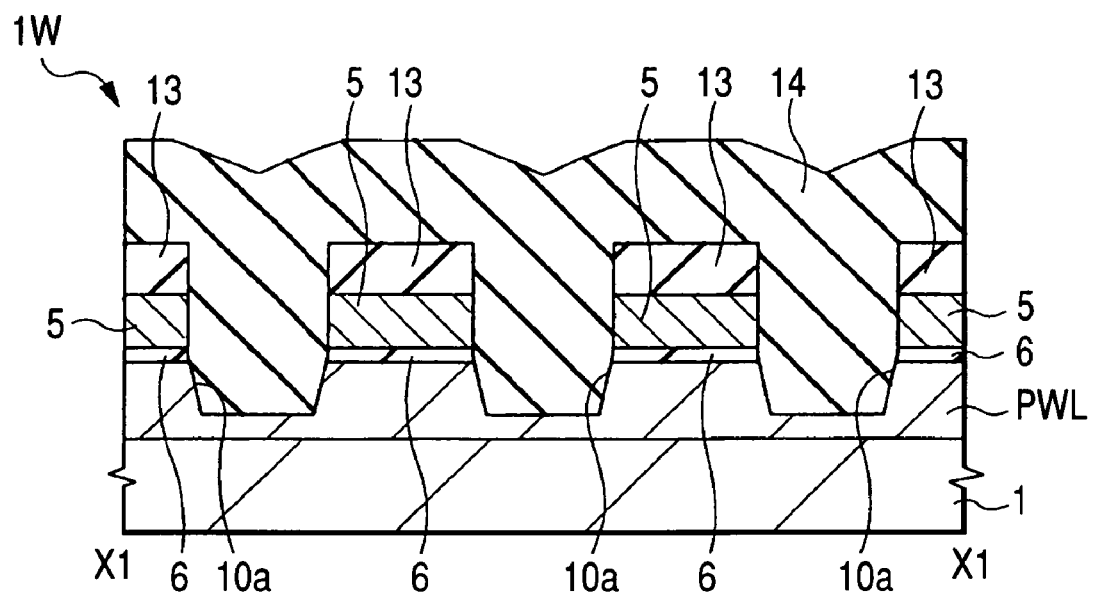
FIG. 23 is a sectional view taken on line X1—X1 in FIG. 22.
Figure 24:
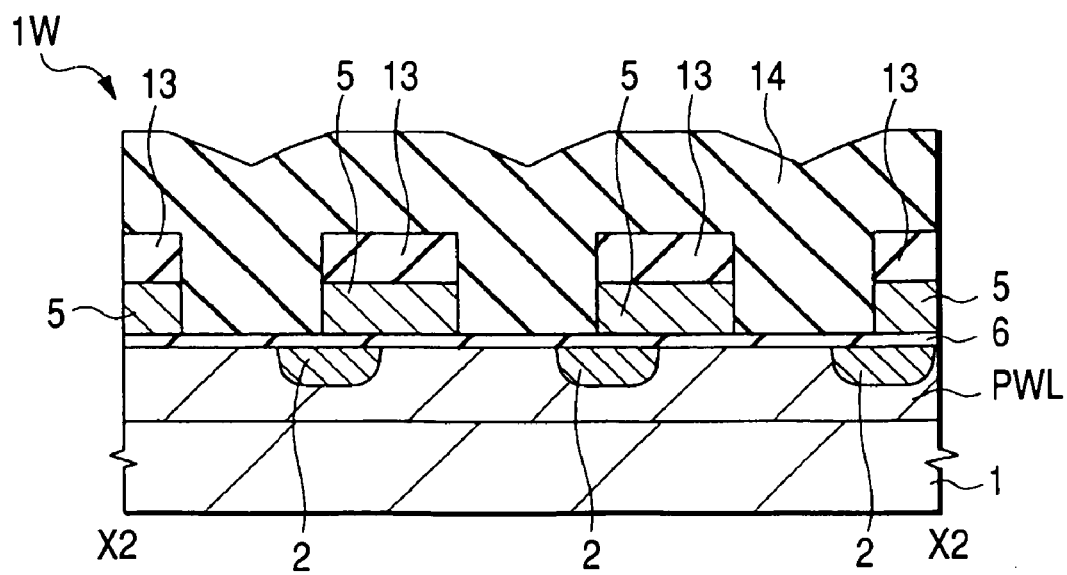
FIG. 24 is a sectional view taken on line X2—X2 in FIG. 22.

FIG. 19 is a plan view of the wafer 1W in a step of the method of manufacturing the semiconductor device, subsequent to the step shown in FIG. 16, showing the boundary between the memory region MA and the peripheral circuit region PA of the wafer 1W, and the surroundings thereof, and FIGS. 20, and 21 are sectional views taken on lines X1—X1 and X2—X2 of FIG. 19, respectively. Further, FIG. 22 is a plan view of the wafer 1W in a step of the method of manufacturing the semiconductor device, subsequent to the step shown in FIG. 19, showing the boundary between the memory region MA and the peripheral circuit region PA of the wafer 1W, and the surroundings thereof, and FIGS. 23, and 24 are sectional views taken on lines X1—X1 and X2—X2 of FIG. 22, respectively.

As shown in FIGS. 19 through 21, by using the patterns of the insulator film 13 and the conductor film 5, patterned in the shape of the stripes, as a mask, portions of the gate insulator film 6 and the well PWL, exposed out of the mask, are first patterned in succession by dry etching, thereby forming an isolation groove 10a is formed between the patterns of the insulator film 13 and the conductor film 5, adjacent to each other, in the peripheral circuit region PA. In this case, by use of, for example, a resist pattern (second masking pattern) FR2, a region that is not etched is formed. The boundary of the region is denoted by the boundary line SL2. At this point in time, the position of the boundary line SL2, in relation to that of the boundary line SL1, is rendered as shown in FIG. 19. More specifically, in a region between the boundary line SL1 and the boundary line SL2, there are formed regions where the diffusion layers 2 are formed in portions of the substrate 1, under the respective patterns of the conductor film 5, and portions of the well PWL are removed by dry etching. The respective isolation grooves 10a are grooves for use as the isolation parts between the select nMISes adjacent to each other, but may be used as grooves for forming the respective isolation parts between other transistors for peripheral circuits. Subsequently, as shown in FIGS. 22 through 24, an insulator film 14 made up of a silicon oxide film etc. is deposited by use of, for example, the CVD method so as to completely full up the respective isolation grooves 10a between the patterns of the insulator film 13 and the conductor film 5 patterned in the shape of the stripes, adjacent to each other. The respective isolation grooves 10a may be used as the isolation parts for the select nMISes and peripheral transistors other than the select nMISes.

Figure 22:
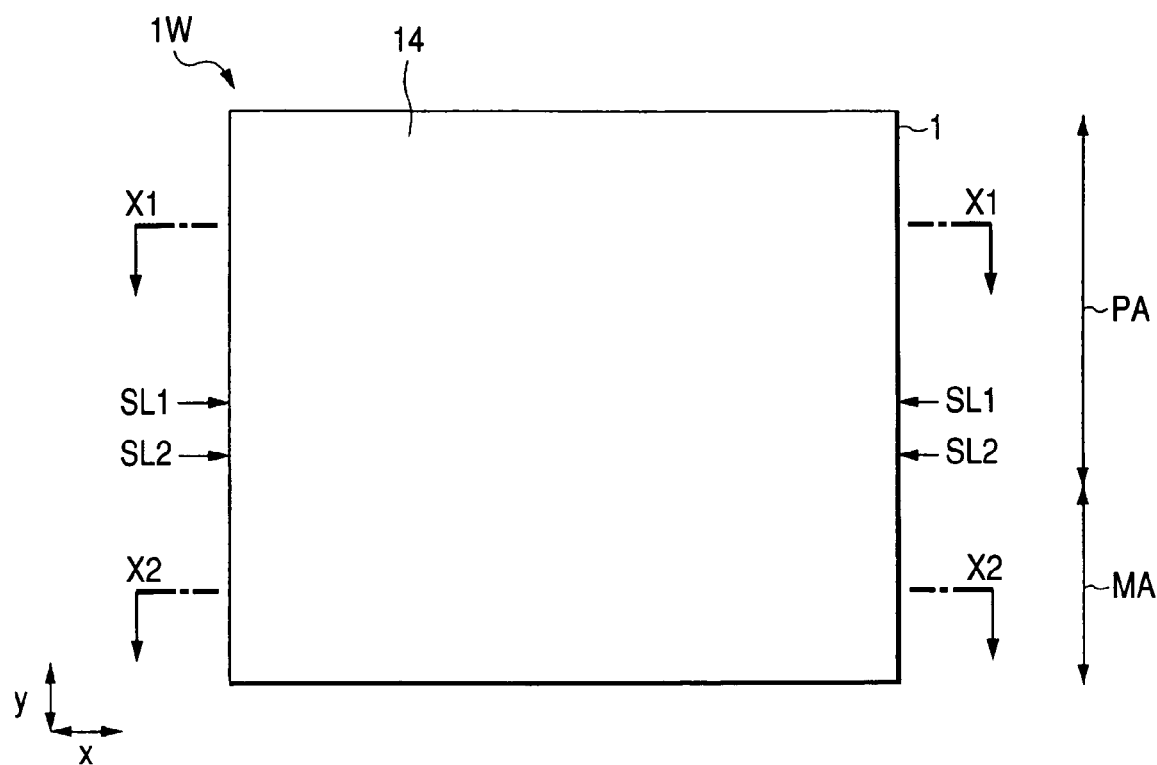
FIG. 22 is a plan view of the wafer 1W, in a step of the method of manufacturing the semiconductor device, subsequent to the step shown in FIG. 19.
Figure 25:
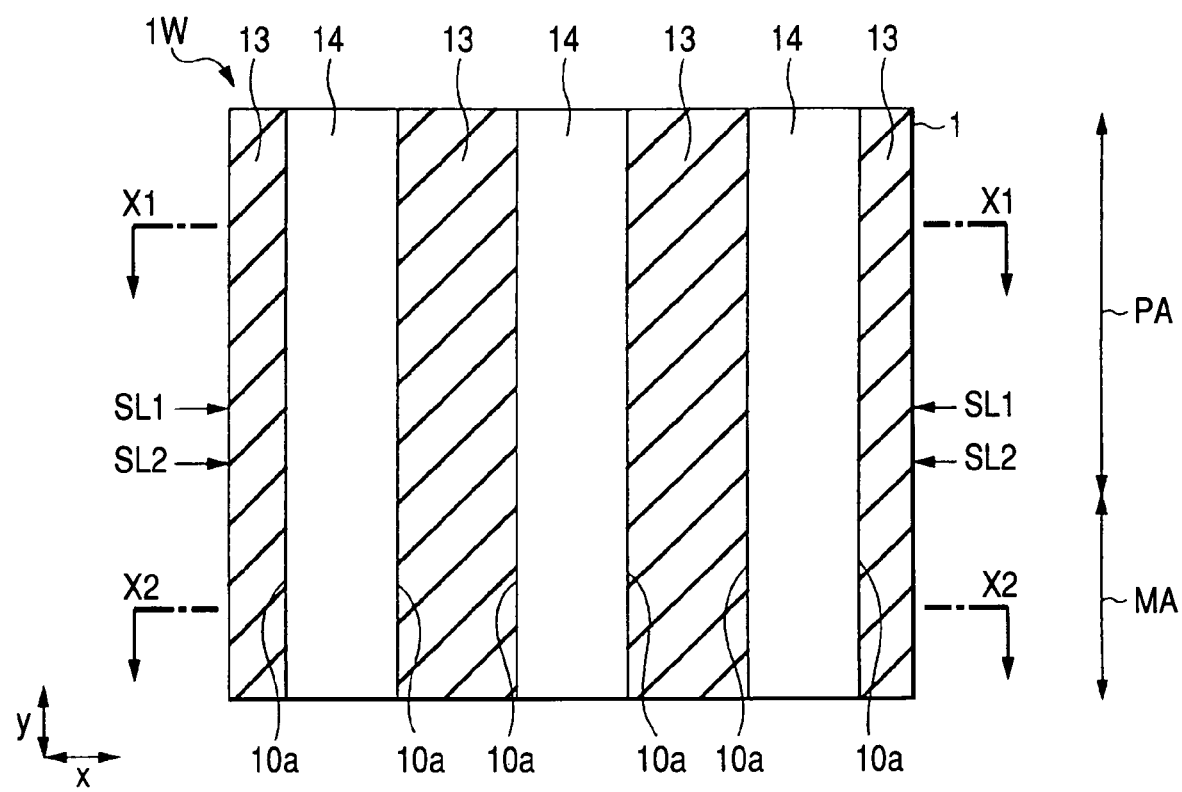
FIG. 25 is a plan view of the wafer 1W, in a step of the method of manufacturing the semiconductor device, subsequent to the step shown in FIG. 22.
Figure 26:
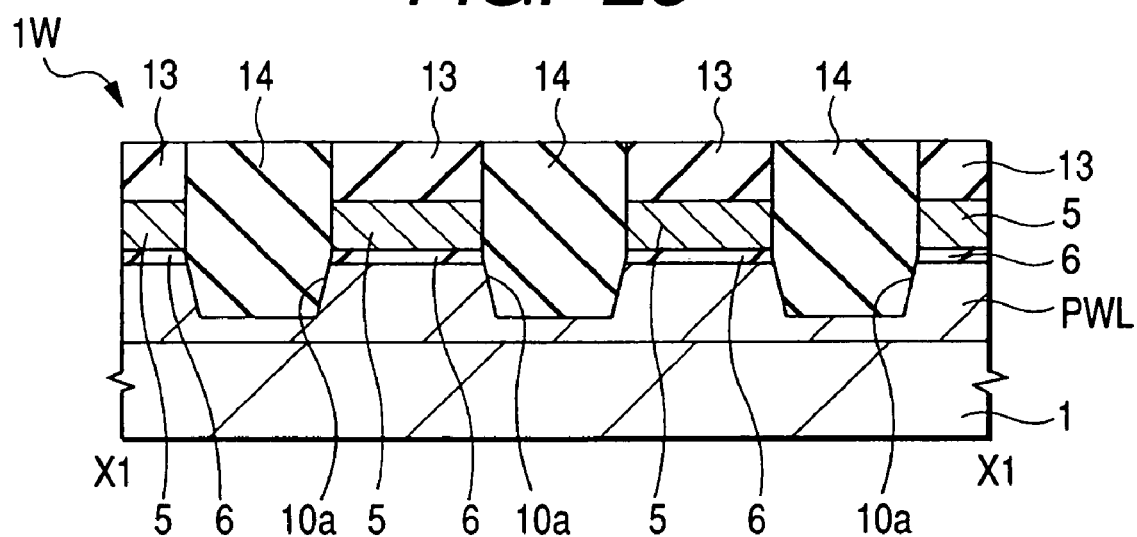
FIG. 26 is a sectional view taken on line X1—X1 in FIG. 25.
Figure 27:
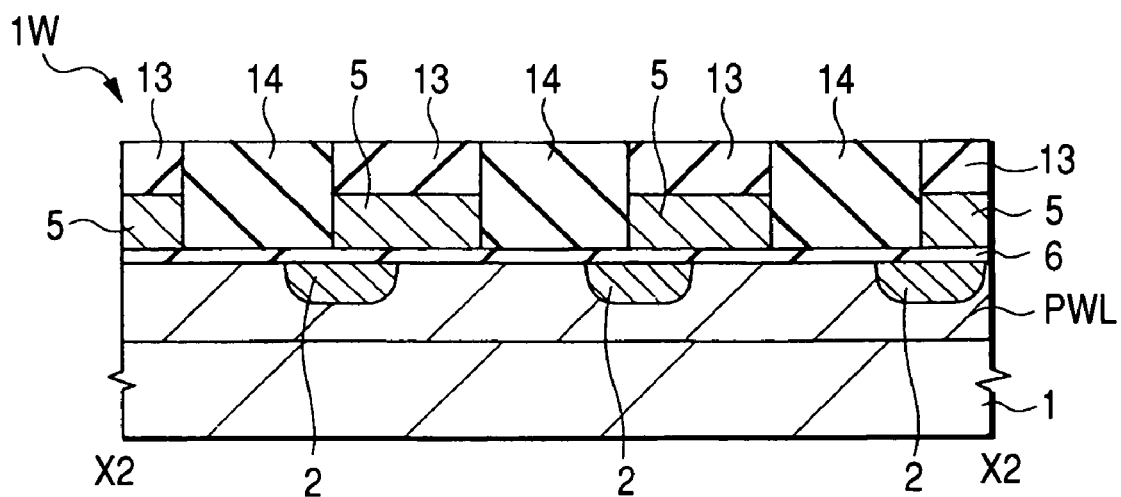
FIG. 27 is a sectional view taken on line X2—X2 in FIG. 25.
Figure 28:
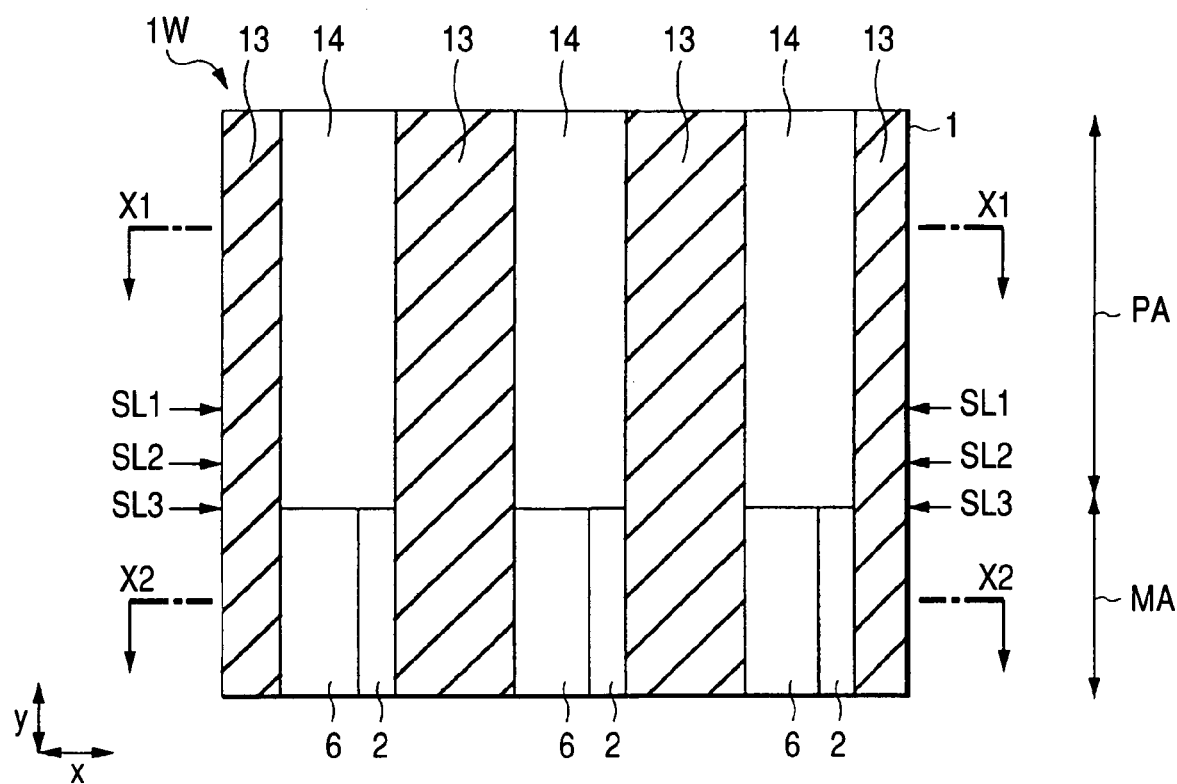
FIG. 28 is a plan view of the wafer 1W, in a step of the method of manufacturing the semiconductor device, subsequent to the step shown in FIG. 25.
Figure 29:
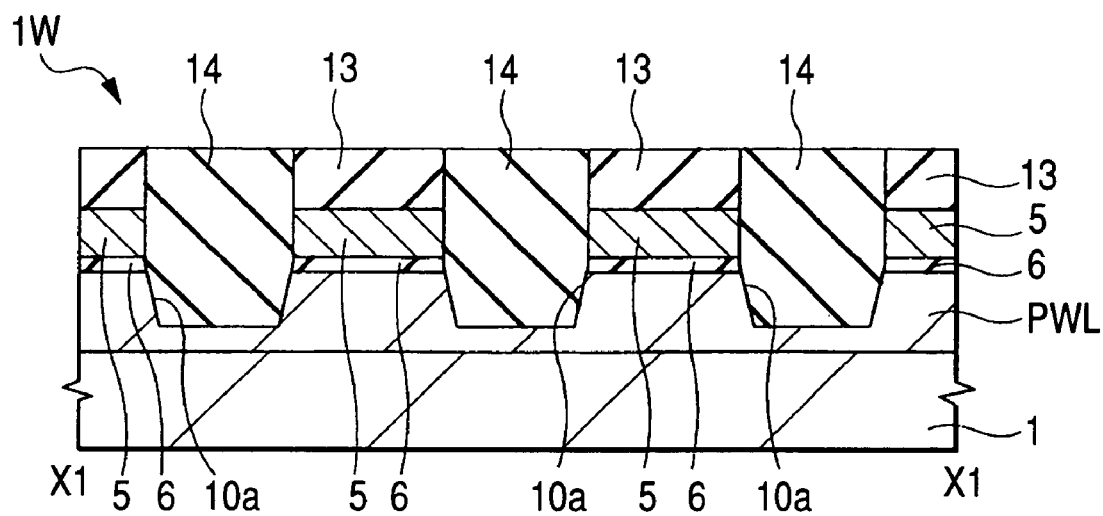
FIG. 29 is a sectional view taken on line X1—X1 in FIG. 28.
Figure 30:
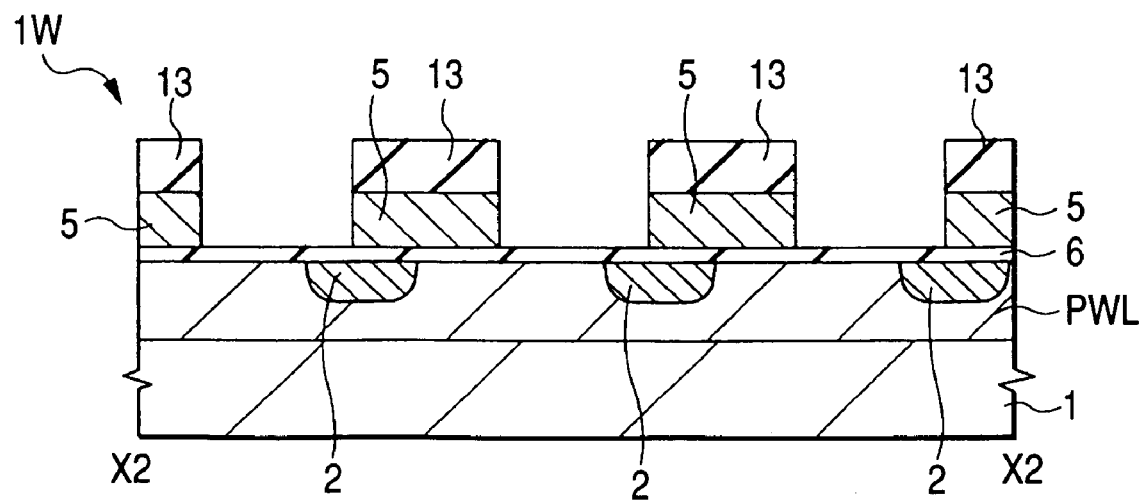
FIG. 30 is a sectional view taken on line X2—X2 in FIG. 28.

Further, FIG. 25 is a plan view of the wafer 1W in a step of the method of manufacturing the semiconductor device, subsequent to the step shown in FIG. 22, showing the boundary between the memory region MA and the peripheral circuit region PA of the wafer 1W, and the surroundings thereof, and FIGS. 26, and 27 are sectional views taken on lines X1—X1 and X2—X2 of FIG. 25, respectively. FIG. 28 is a plan view of the wafer 1W in a step of the method of manufacturing the semiconductor device, subsequent to the step shown in FIG. 25, showing the boundary between the memory region MA and the peripheral circuit region PA of the wafer 1W, and the surroundings thereof, and FIGS. 29, and 30 are sectional views taken on lines X1—X1 and X2—X2 of FIG. 28, respectively.

As shown in FIGS. 25 through 27, the insulator film 14 is first removed by the etch back method or the chemical mechanical polishing method until the surface of the insulator film 13 is exposed. In this stage of processing, the insulator film (third insulator film) 14 is rendered into stripe-like patterns of the isolation parts 10, extending in the same direction as the patterns of the insulator film 13 and the conductor film 5. Subsequently, as shown in FIGS. 28 through 30, the insulator films 14 in the memory region MA are selectively removed by the dry etching method or the wet etching method. At this point in time, a region where the insulator film 14 is not removed is formed in the peripheral circuit region PA by use of, for example, a resist. The boundary of the region is denoted by the boundary line SL3, and portions of the insulator film 14, below the boundary line SL3 in FIG. 28, are removed. In this case, the position of the boundary line SL3, in relation to that of the boundary line SL2, is rendered as shown in FIG. 28. More specifically, in the peripheral circuit region PA, the insulator film 14 is left out inside the respective isolation grooves 10a. The insulator film 14 that is left out performs the function of a shallow groove isolation. In the memory region MA, a gap is formed between the patterns of the insulator film 13 and the conductor film 5, adjacent to each other, due to removal of the insulator film 14.

Figure 31:
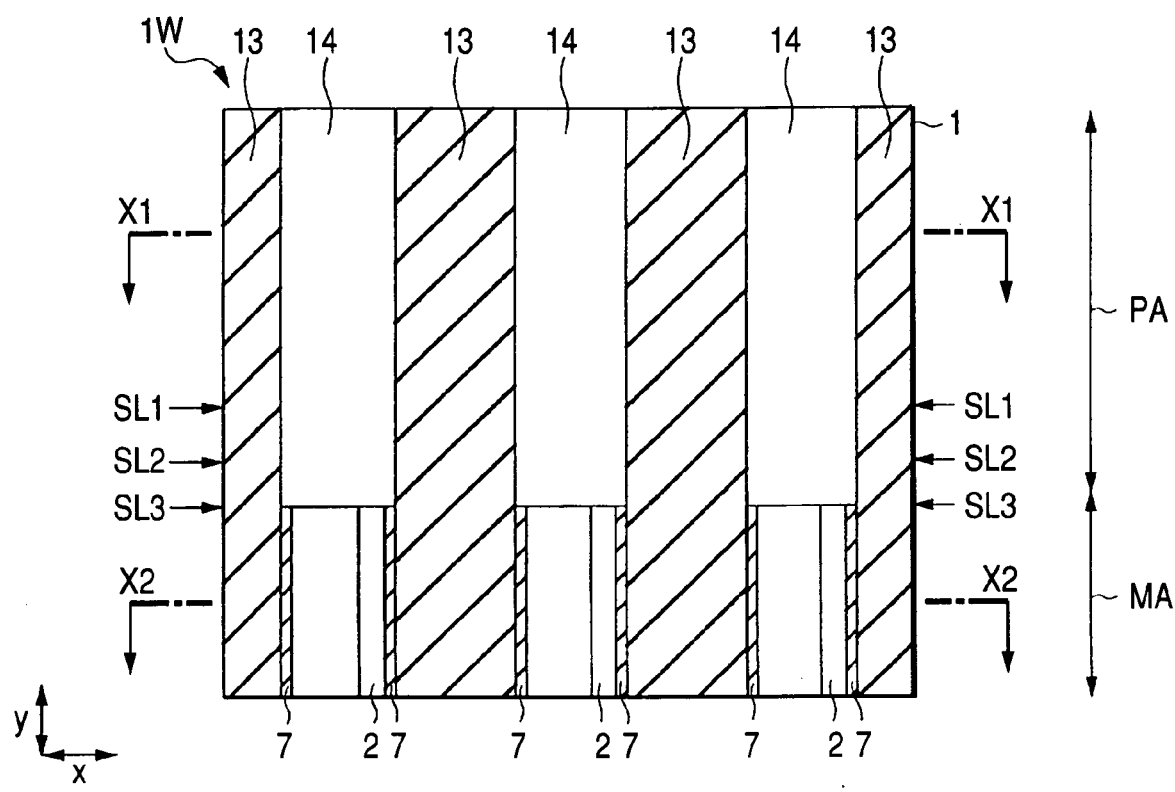
FIG. 31 is a plan view of the wafer 1W, in a step of the method of manufacturing the semiconductor device, subsequent to the step shown in FIG. 28.
Figure 32:
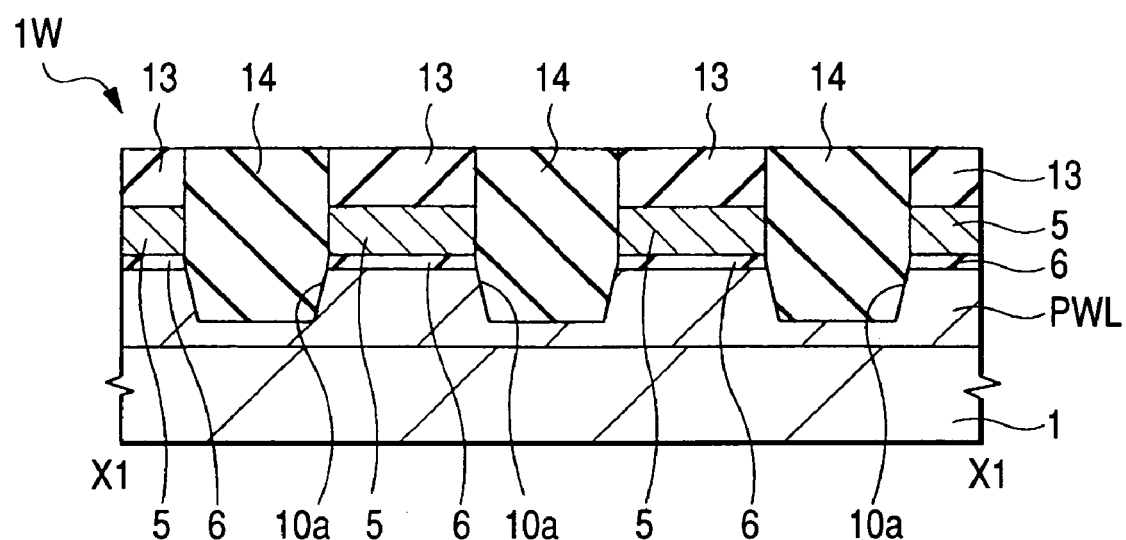
FIG. 32 is a sectional view taken on line X1—X1 in FIG. 31.
Figure 33:
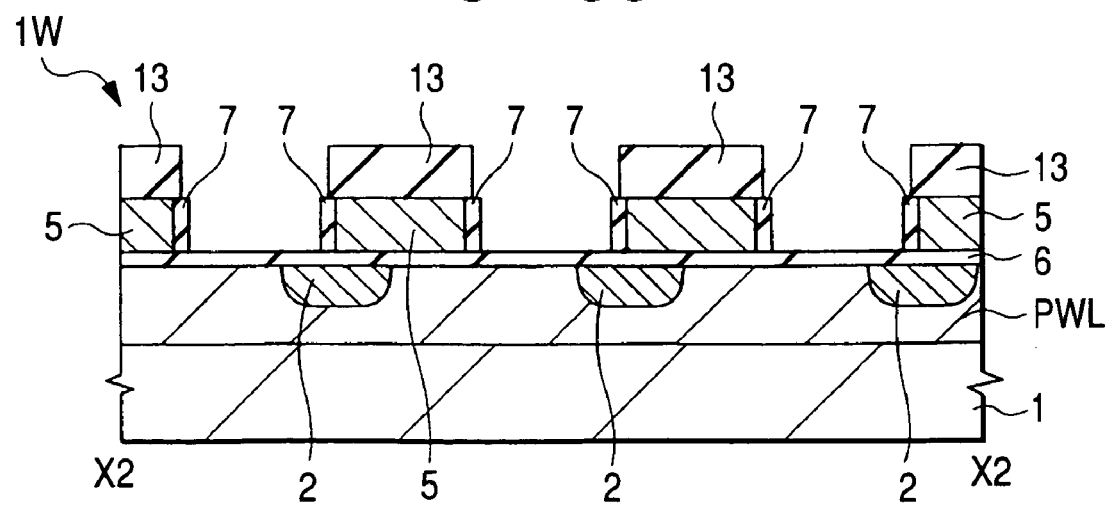
FIG. 33 is a sectional view taken on line X2—X2 in FIG. 31.
Figure 35:
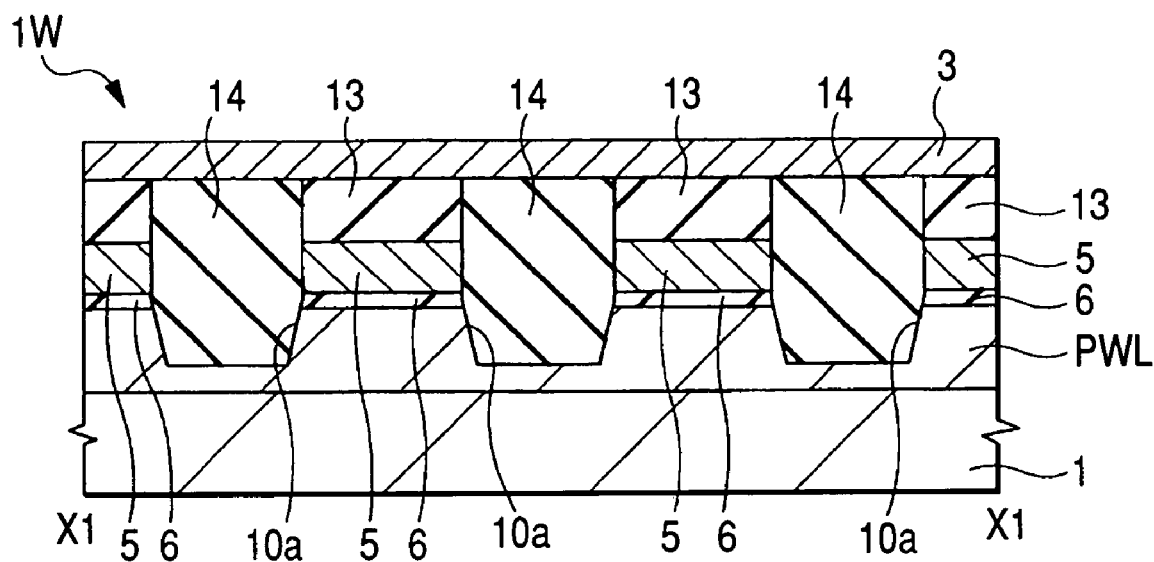
FIG. 35 is a sectional view taken on line X1—X1 in FIG. 34.
Figure 36:
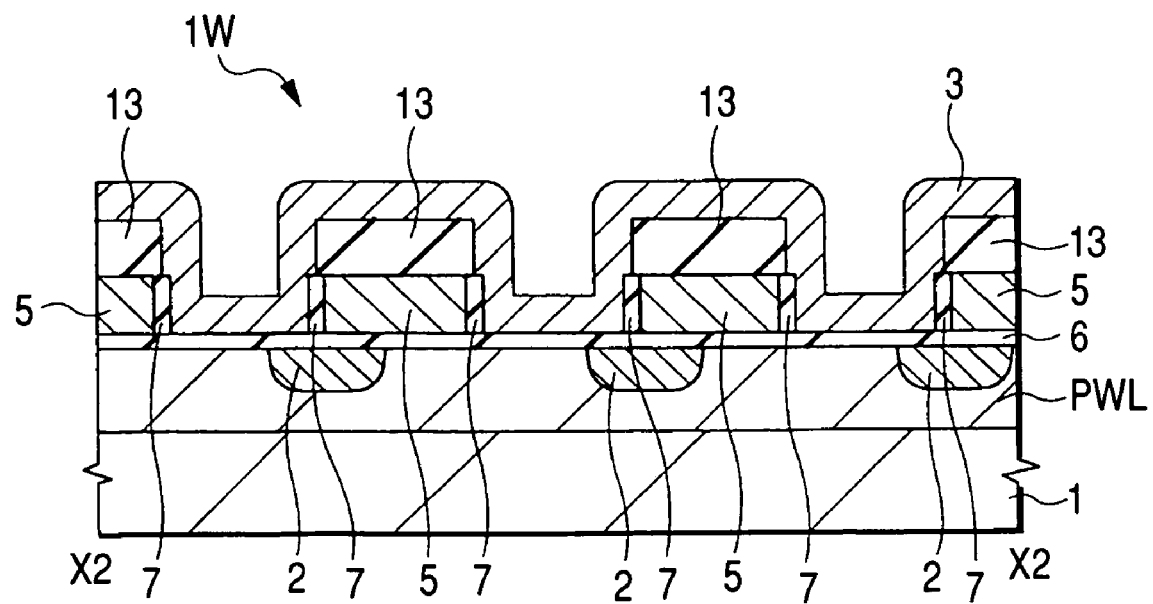
FIG. 36 is a sectional view taken on line X2—X2 in FIG. 34.

FIG. 31 is a plan view of the wafer 1W in a step of the method of manufacturing the semiconductor device, subsequent to the step shown in FIG. 28, showing the boundary between the memory region MA and the peripheral circuit region PA of the wafer 1W, and the surroundings thereof, and FIGS. 32, and 33 are sectional views taken on lines X1—X1 and X2—X2 of FIG. 31, respectively. Further, FIG. 34 is a plan view of the wafer 1W in a step of the method of manufacturing the semiconductor device, subsequent to the step shown in FIG. 31, showing the boundary between the memory region MA and the peripheral circuit region PA of the wafer 1W, and the surroundings thereof, and FIGS. 35, and 36 are sectional views taken on lines X1—X1 and X2—X2 of FIG. 34, respectively.

First, as shown in FIGS. 31 through 33, in the memory region MA, the insulator film 7 such as a silicon oxide film, and so forth, for isolating the respective patterns of the conductor film 5 for forming the third gate electrodes from the respective first gate electrodes 3a (refer to FIG. 1), is formed at side faces of the respective patterns of the conductor film 5 by, for example, thermal oxidation of the conductor films 5, deposition of an oxide film by use of the CVD method, or by combination of both. Subsequently, as shown in FIGS. 34 through 36, a conductor film (second conductor film) 3 for forming the first gate electrodes is deposited on the top surface of the substrate 1 by the CVD method and so forth. The conductor film 3 is made up of a polysilicon film doped with, for example, phosphorus (P), and is deposited in the memory region MA so as not to completely fill up a gap between the patterns of the insulator film 13 and the conductor film 5, adjacent to each other.

Figure 34:
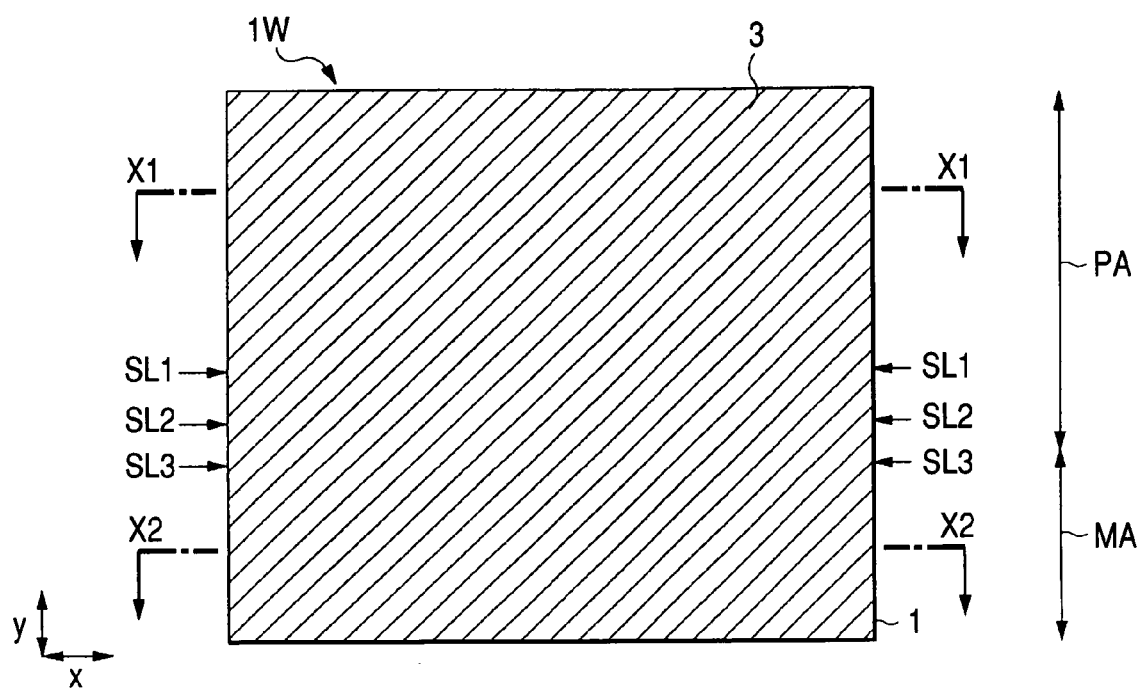
FIG. 34 is a plan view of the wafer 1W, in a step of the method of manufacturing the semiconductor device, subsequent to the step shown in FIG. 31.
Figure 37:
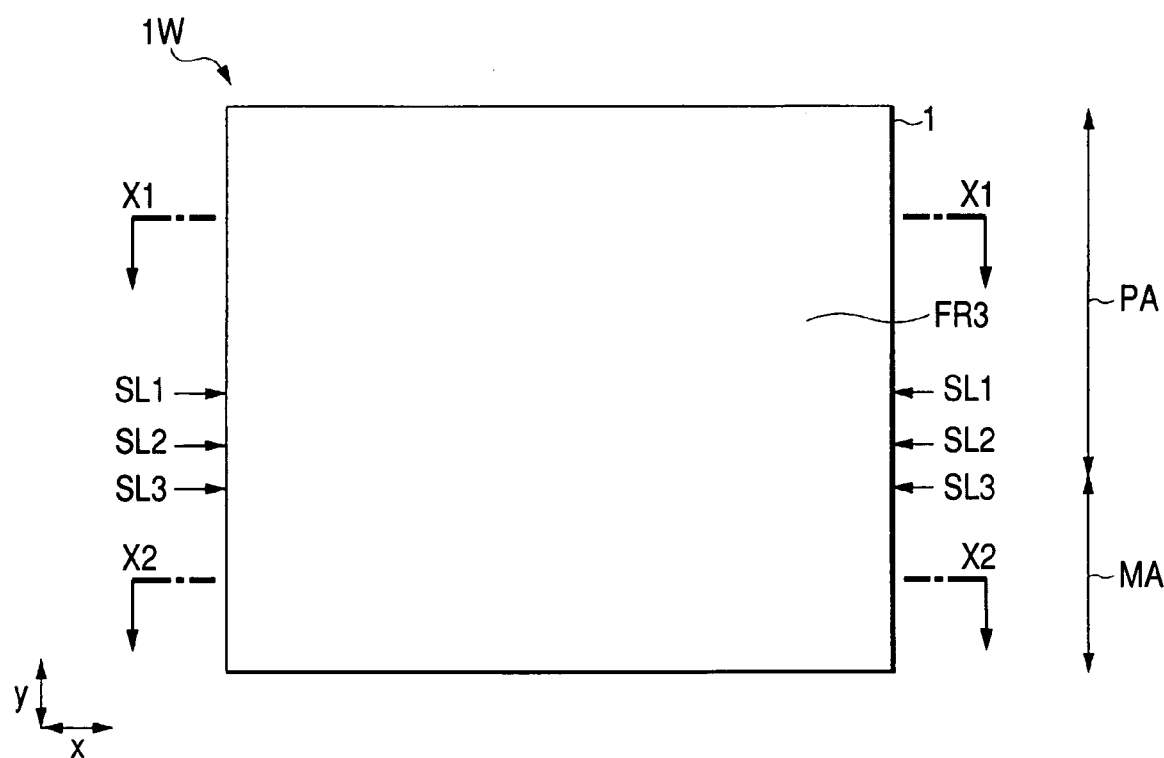
FIG. 37 is a plan view of the wafer 1W, in a step of the method of manufacturing the semiconductor device, subsequent to the step shown in FIG. 34.
Figure 38:
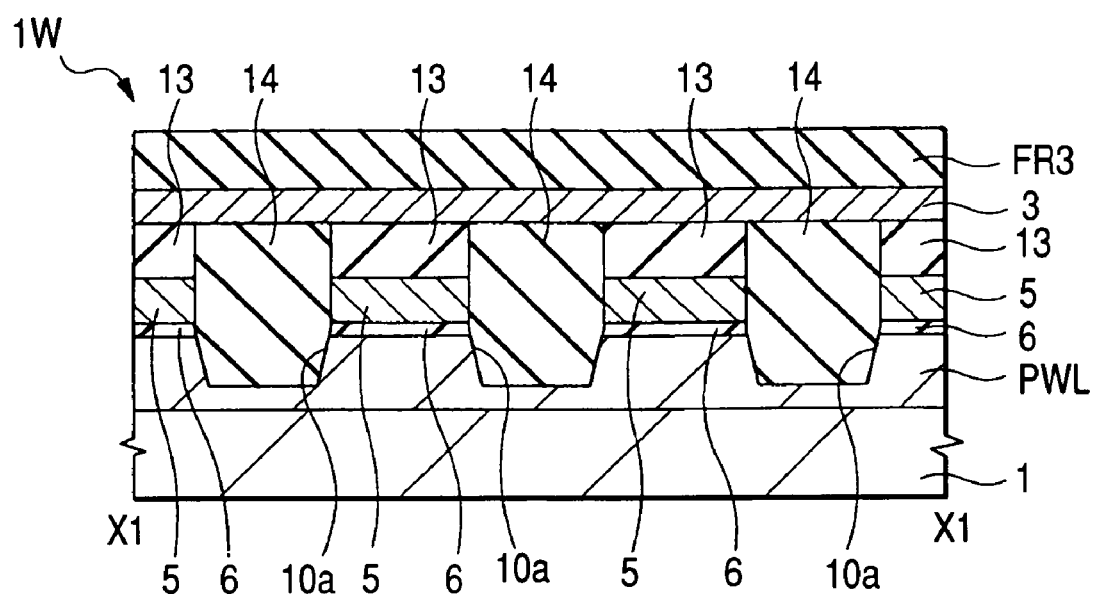
FIG. 38 is a sectional view taken on line X1—X1 in FIG. 37.
Figure 39:
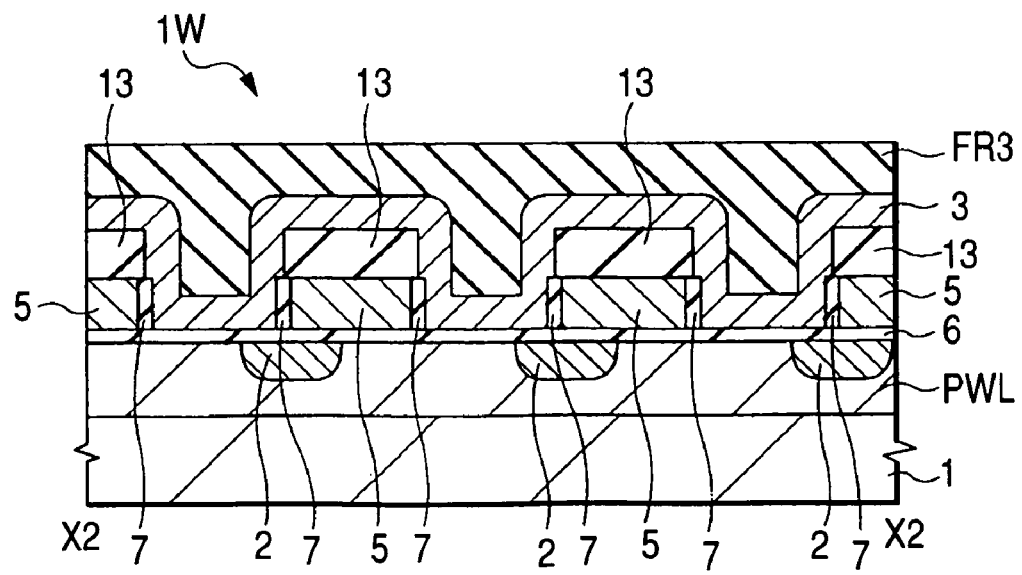
FIG. 39 is a sectional view taken on line X2—X2 in FIG. 37.
Figure 41:
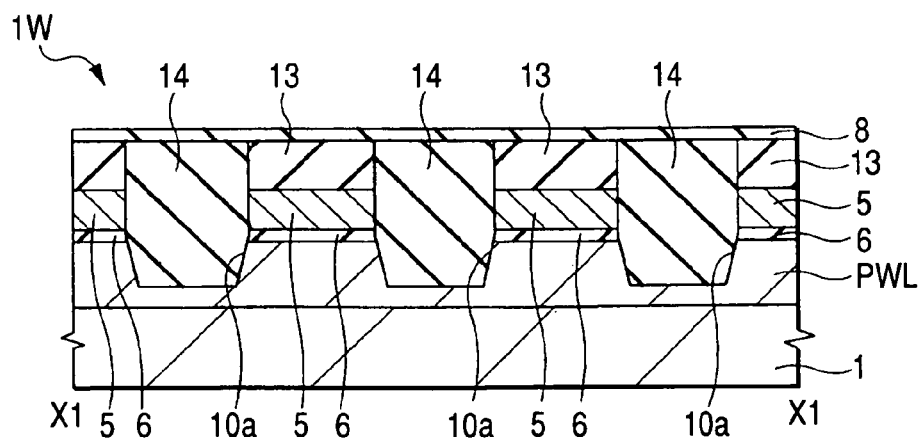
FIG. 41 is a sectional view taken on line X1—X1 in FIG. 40.
Figure 42:
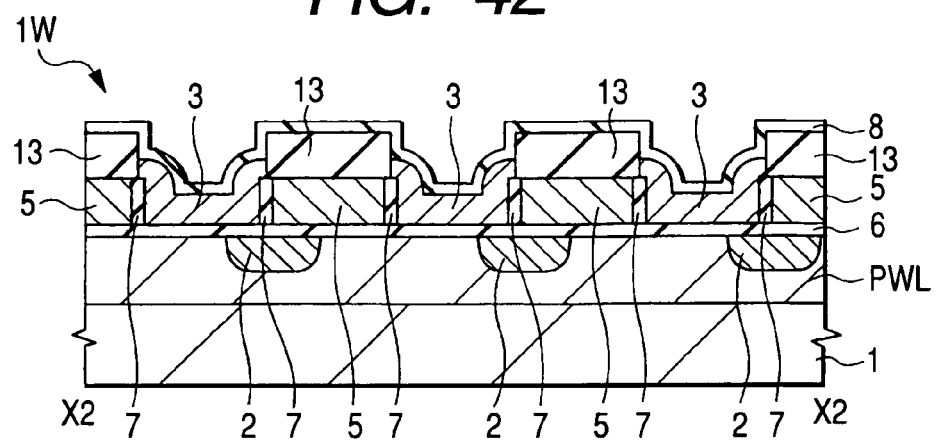
FIG. 42 is a sectional view taken on line X2—X2 in FIG. 40.

FIG. 37 is a plan view of the wafer 1W in a step of the method of manufacturing the semiconductor device, subsequent to the step shown in FIG. 34, showing the boundary between the memory region MA and the peripheral circuit region PA of the wafer 1W, and the surroundings thereof, and FIGS. 38, and 39 are sectional views taken on lines X1—X1 and X2—X2 of FIG. 37, respectively. Further, FIG. 40 is a plan view of the wafer 1W in a step of the method of manufacturing the semiconductor device, subsequent to the step shown in FIG. 37, showing the boundary between the memory region MA and the peripheral circuit region PA of the wafer 1W, and the surroundings thereof, and FIGS. 41, and 42 are sectional views taken on lines X1—X1 and X2—X2 of FIG. 40, respectively.

First, as shown in FIGS. 37 through 39, the gaps are filled up by applying a resist film FR3 to the conductor film 3, and the conductor film 3 for forming the first gate electrodes is patterned by etching back the resist FR3 and the conductor film 3. As a result, as shown in FIGS. 40 through 42, portions of the conductor film 3, for use in forming the first gate electrodes, are left out between the patterns of the conductor film 5, adjacent to each other, in the memory region MA. Subsequently, the insulator film (fifth insulator film) 8 for insulating the conductor film 3 from control gates, which will be described later, is formed. The insulator film 8 is made up of a single layer structure of, for example, a silicon oxide film or made up of a stacked structure of silicon oxide film/silicon nitride film/silicon oxide film.

Figure 40:
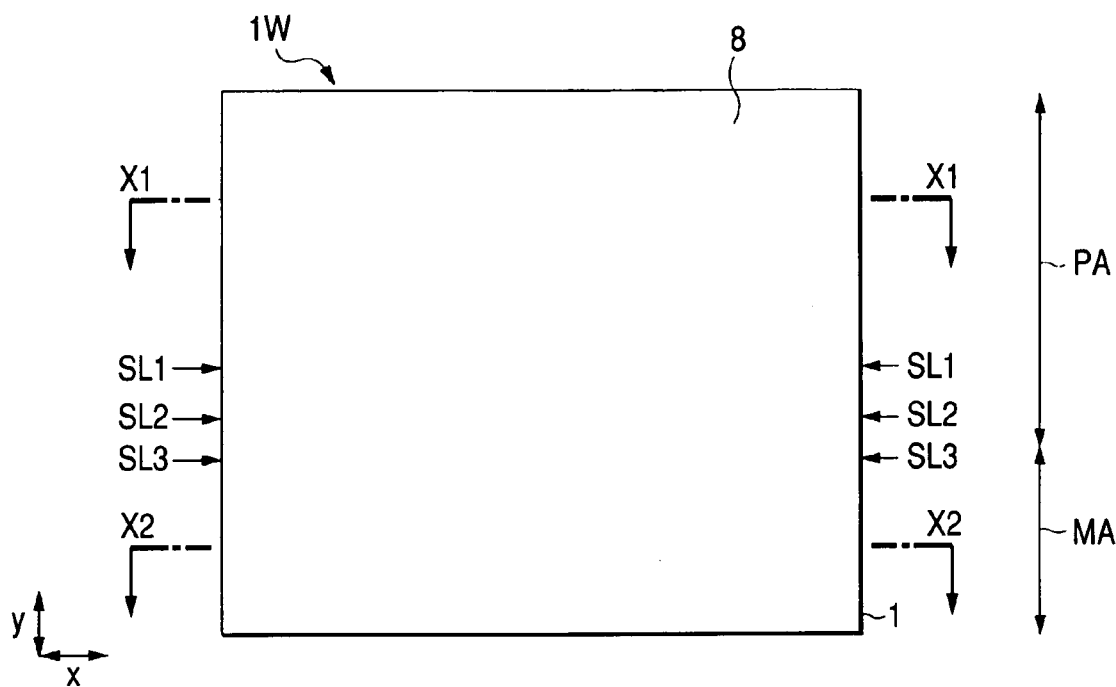
FIG. 40 is a plan view of the wafer 1W, in a step of the method of manufacturing the semiconductor device, subsequent to the step shown in FIG. 37.
Figure 43:
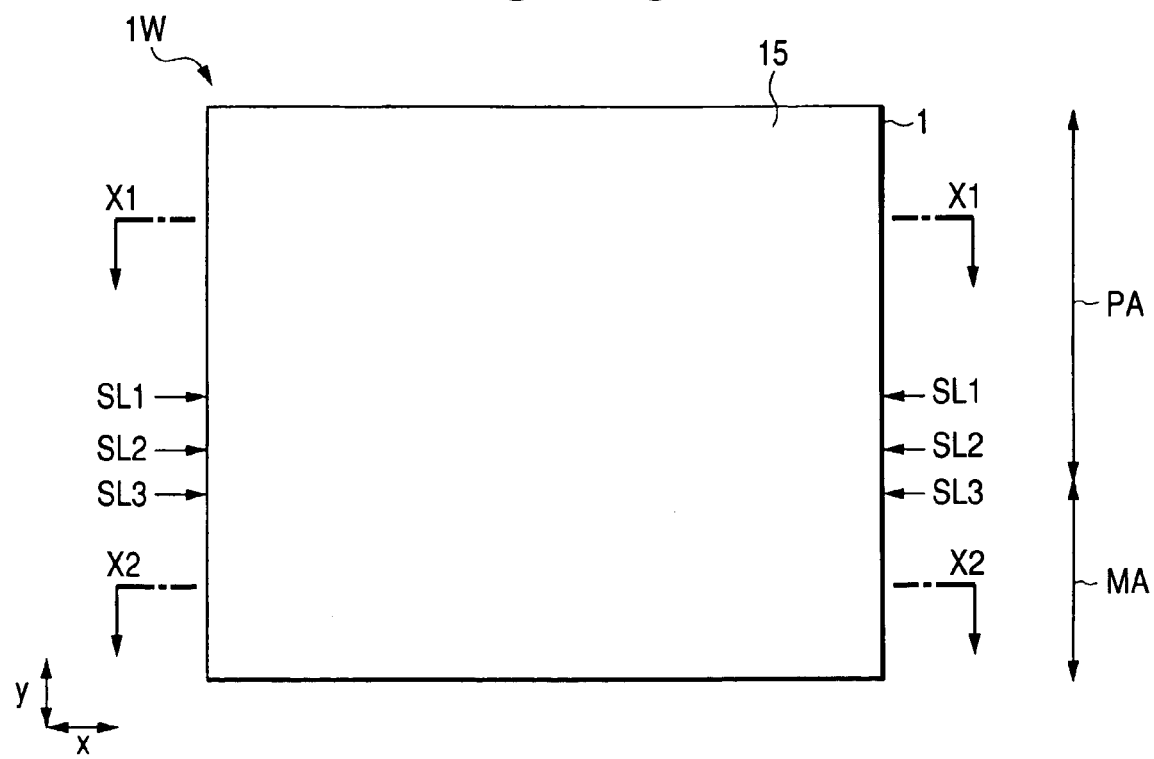
FIG. 43 is a plan view of the wafer 1W, in a step of the method of manufacturing the semiconductor device, subsequent to the step shown in FIG. 40.
Figure 44:
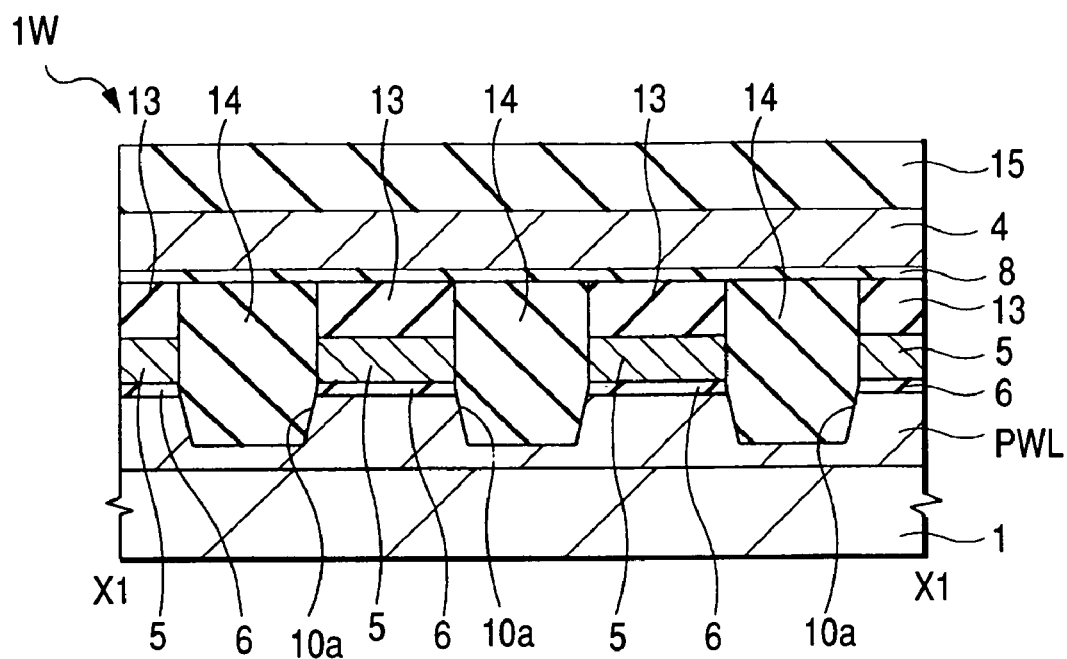
FIG. 44 is a sectional view taken on line X1—X1 in FIG. 43.
Figure 45:
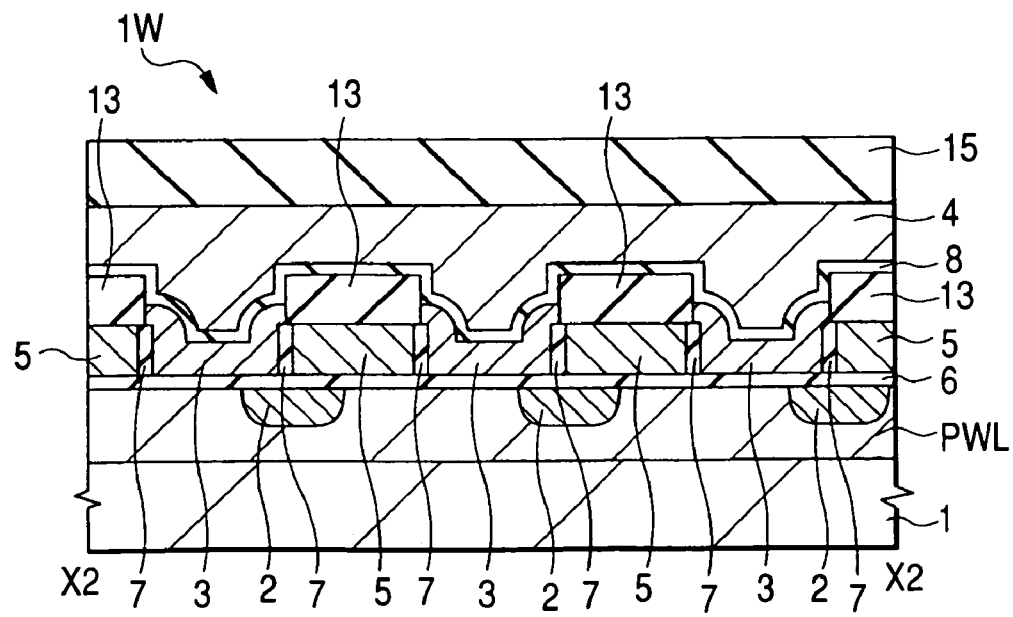
FIG. 45 is a sectional view taken on line X2—X2 in FIG. 43.
Figure 47:
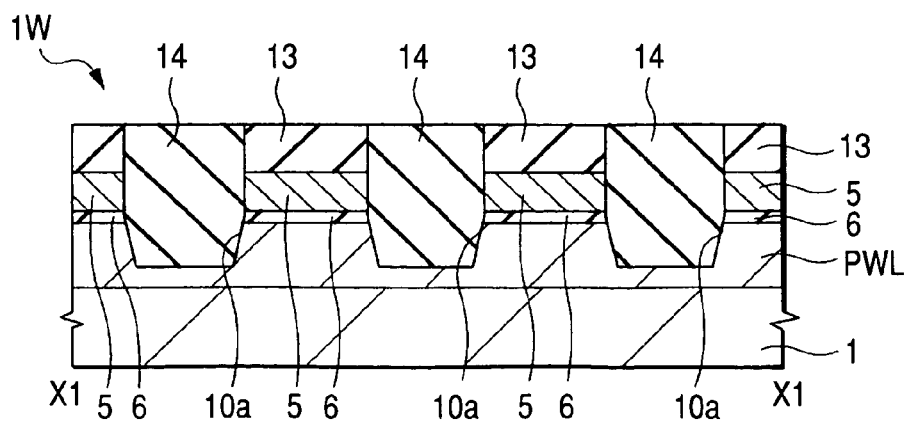
FIG. 47 is a sectional view taken on line X1—X1 in FIG. 46.
Figure 48:
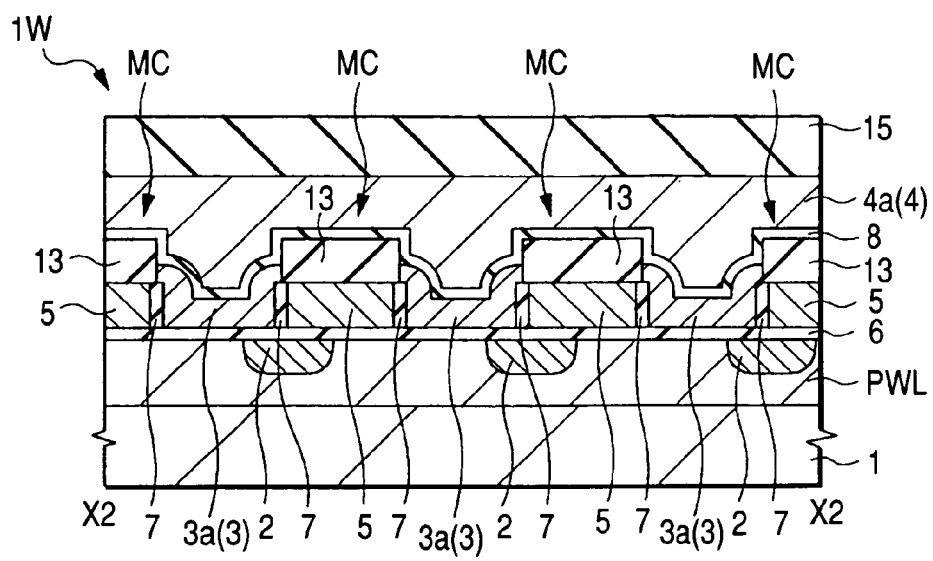
FIG. 48 is a sectional view taken on line X2—X2 in FIG. 46.

FIG. 43 is a plan view of the wafer 1W in a step of the method of manufacturing the semiconductor device, subsequent to the step shown in FIG. 40, showing the boundary between the memory region MA and the peripheral circuit region PA of the wafer 1W, and the surroundings thereof, and FIGS. 44, and 45 are sectional views taken on lines X1—X1 and X2—X2 of FIG. 43, respectively. Further, FIG. 46 is a plan view of the wafer 1W in a step of the method of manufacturing the semiconductor device, subsequent to the step shown in FIG. 43, showing the boundary between the memory region MA and the peripheral circuit region PA of the wafer 1W, and the surroundings thereof, and FIGS. 47, and 48 are sectional views taken on lines X1—X1 and X2—X2 of FIG. 46, respectively.

First, as shown in FIGS. 43 through 45, a conductor film (third conductor film) 4 and an insulator film 15 are sequentially deposited in that order. The conductor film 4 is a stacked film (the so-called polymetal film) formed by sequentially depositing a low resistance polysilicon film, a tungsten nitride film, and a tungsten film in that order. The insulator film 15 is made up of, for example, a silicon oxide film. Subsequently, as shown in FIGS. 46 through 48, by patterning the insulator film 15, the conductor film 4, the insulator film 8, and the conductor film 3 by use of the well-known lithographic and dry etching techniques, the second gate electrodes 4a (that is, the word lines WL), in a band-like shape, extended in the x-direction in FIG. 46, are formed in the memory region MA, and concurrently, the first gate electrodes 3a are formed in a layer under the second gate electrodes 4a in a self-aligned manner against the second gate electrodes 4a. Thus, the memory cells MC are formed in the memory region MA.

Figure 46:
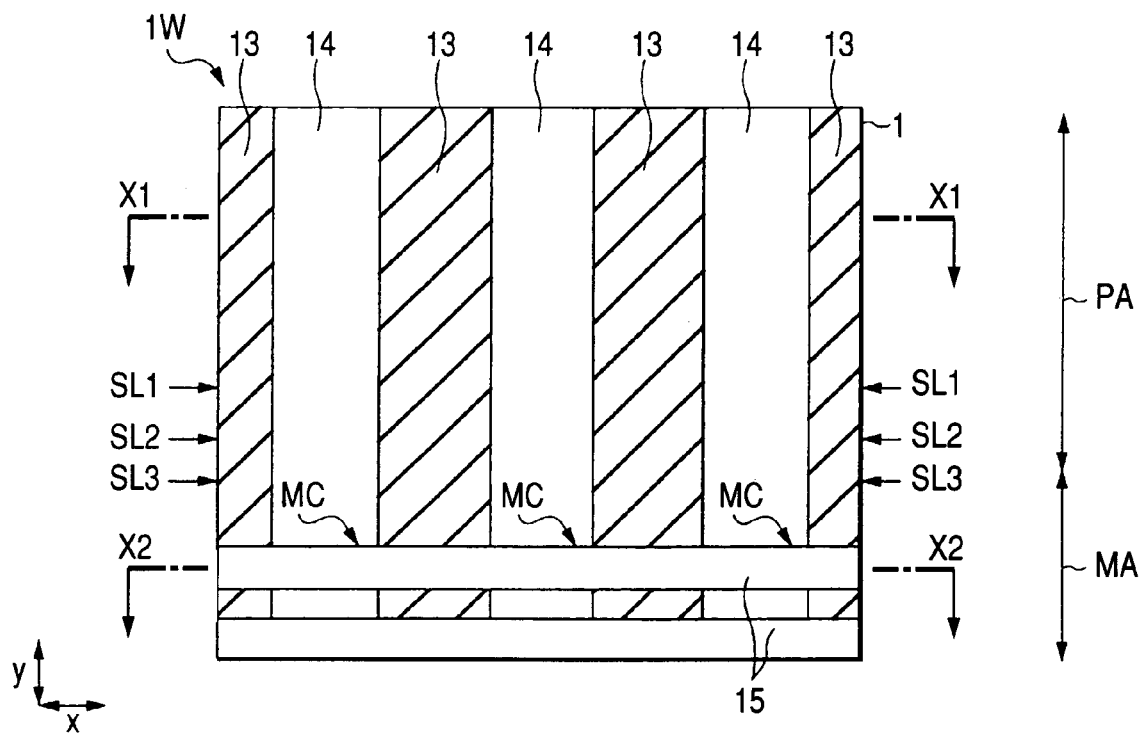
FIG. 46 is a plan view of the wafer 1W, in a step of the method of manufacturing the semiconductor device, subsequent to the step shown in FIG. 43.
Figure 49:
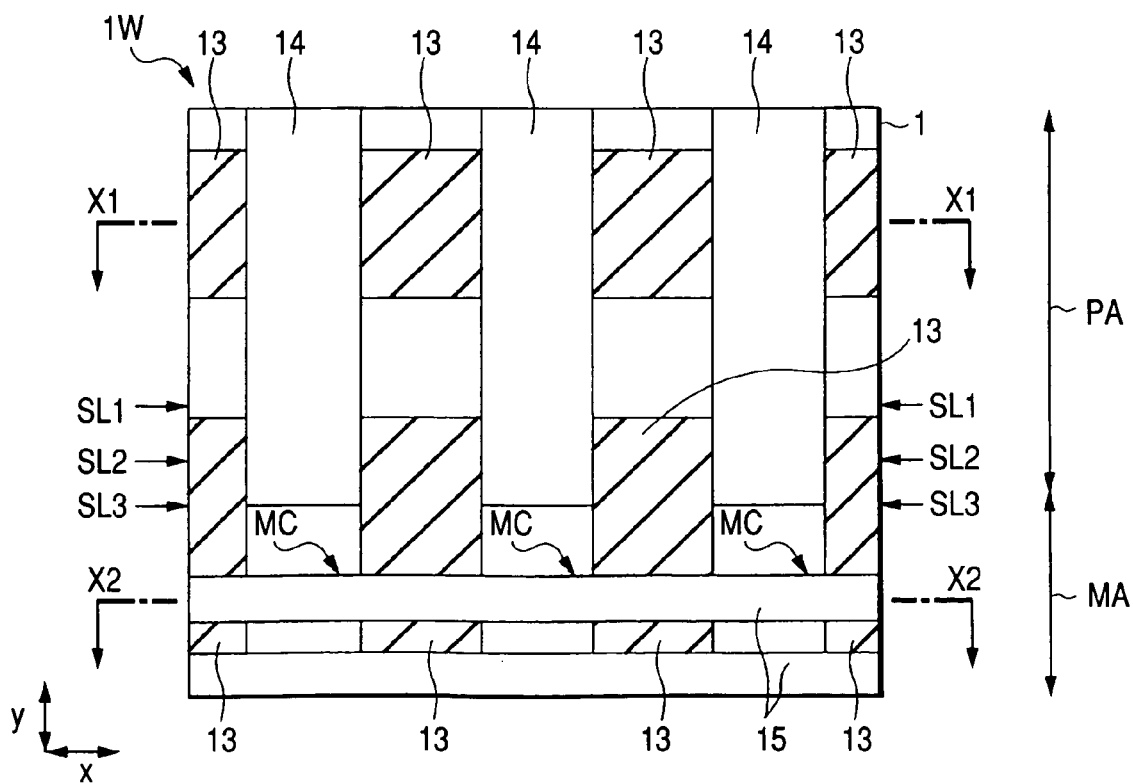
FIG. 49 is a plan view of the wafer 1W, in a step of the method of manufacturing the semiconductor device, subsequent to the step shown in FIG. 46.
Figure 50:
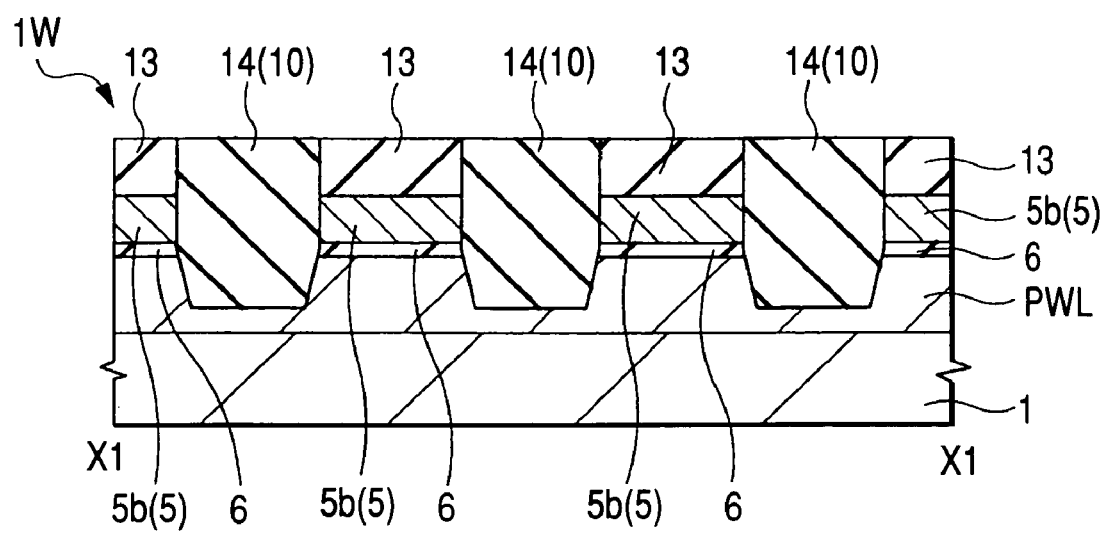
FIG. 50 is a sectional view taken on line X1—X1 in FIG. 49.
Figure 51:
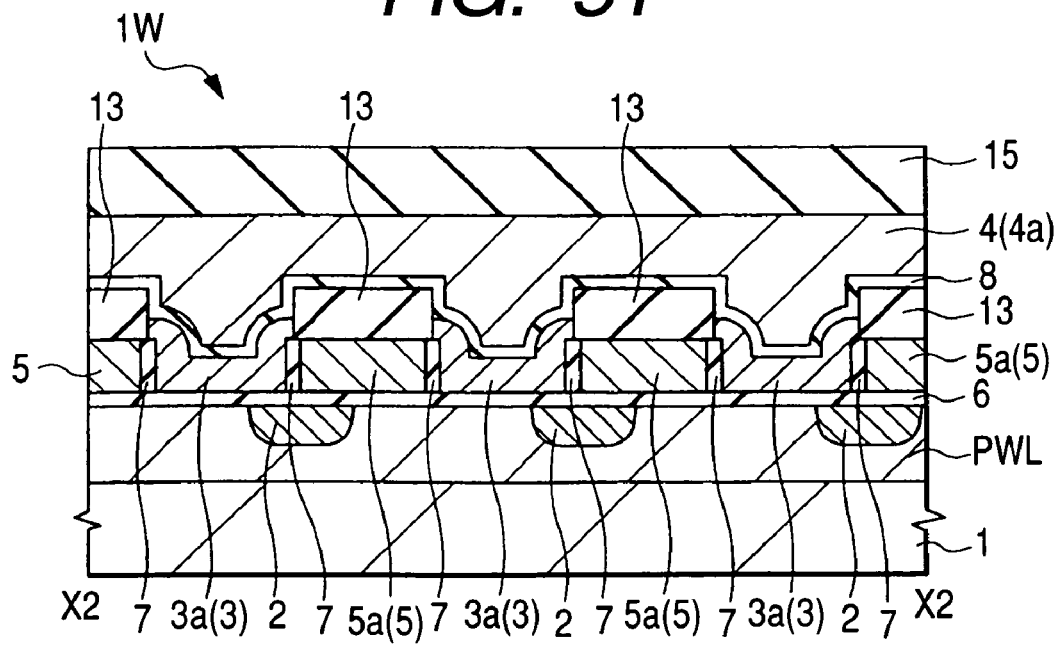
FIG. 51 is a sectional view taken on line X2—X2 in FIG. 49.
Figure 52:
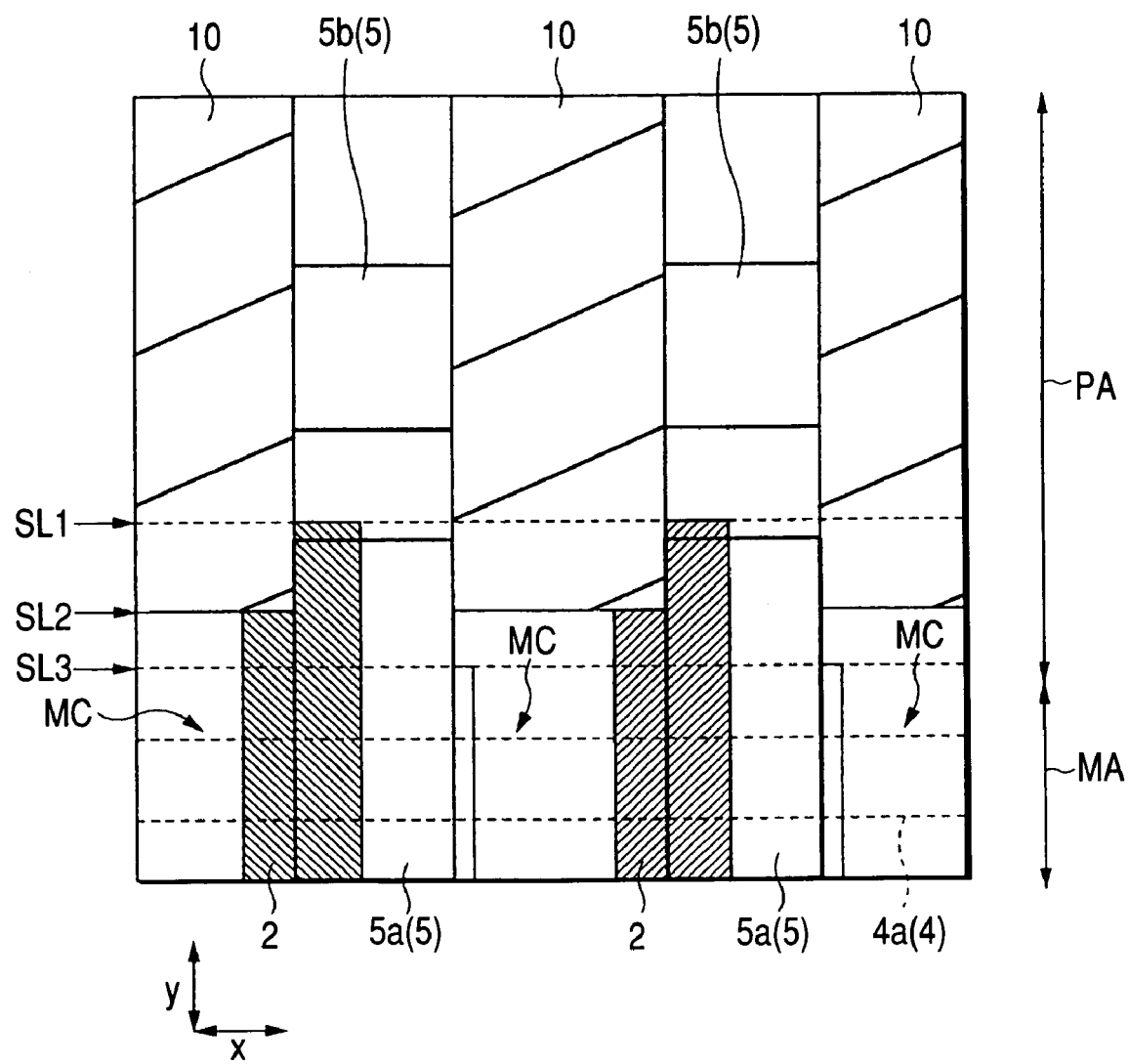
FIG. 52 is an enlarged plan view of the principal part of the wafer, in a step of the method of manufacturing the semiconductor device, shown in FIG. 49.
Figure 53:
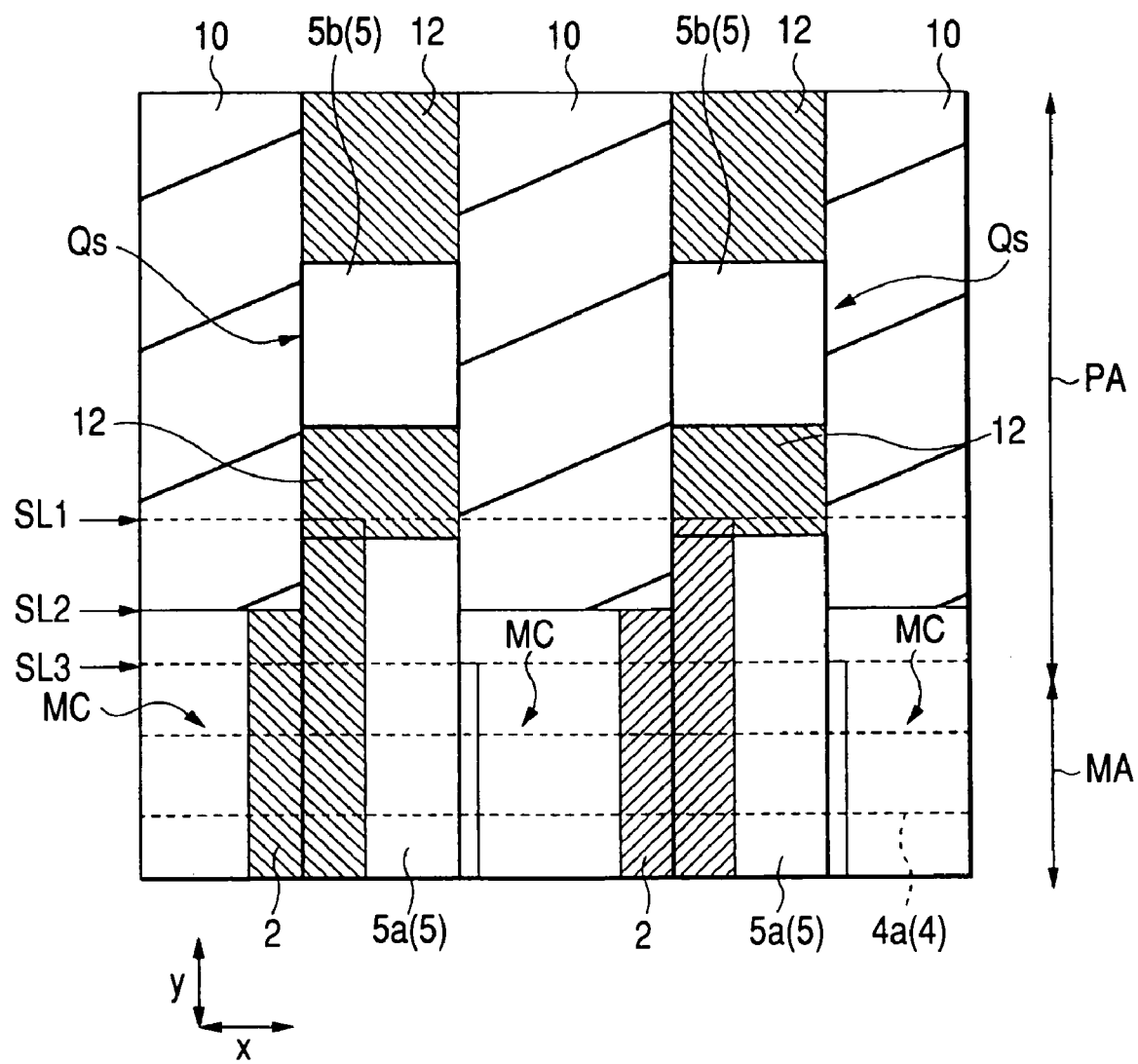
FIG. 53 is an enlarged plan view of the principal part of the wafer 1W, in a step of the method of manufacturing the semiconductor device, subsequent to the step shown in FIG. 52.

FIG. 49 is a plan view of the wafer 1W in a step of the method of manufacturing the semiconductor device, subsequent to the step shown in FIG. 46, showing the boundary between the memory region MA and the peripheral circuit region PA of the wafer 1W, and the surroundings thereof, and FIGS. 50, and 51 are sectional views taken on lines X1—X1 and X2—X2 of FIG. 49, respectively. FIG. 52 is an enlarged plan view of the principal part of the wafer 1W, showing the condition of the diffusion layers 2 in the boundary region between the memory region MA and the peripheral circuit region PA. Further, FIG. 53 is an enlarged plan view of the principal part of the wafer 1W, in a step of the method of manufacturing the semiconductor device, subsequent to the step shown in FIG. 49, showing the condition after the formation of the diffusion layers 12 for use as the source and drain, respectively, of each of the select nMISes Qs in the peripheral circuit region PA.

First, as shown in FIGS. 49 through 51, the patterns of the insulator film 13 and the conductor film 5 are patterned by the dry etching method to thereby form patterns of the respective third gate electrodes 5a of the memory cells MC in the memory region MA, and patterns of the respective gate electrodes 5b of the select nMISes Qs in the peripheral circuit region PA. At this point in time, the third gate electrodes 5a are formed such that the respective upper ends of the third gate electrodes 5a are positioned below the boundary line SL1 while the respective gate electrodes 5b of the select nMISes Qs are formed such that the respective lower ends thereof are positioned above the boundary line SL1. Accordingly, as shown in FIG. 52, a portion of the respective upper ends of the diffusion layers 2 lies off the respective upper ends of the third gate electrodes 5a as seen in plane view. That is, the portion of the diffusion layers 2 is extended into a portion of the active region Lp, between the respective third gate electrodes 5a and the respective gate electrodes 5b. Accordingly, as shown in FIG. 53, upon the formation of the diffusion layers 12 for use as the source and drain, respectively, of each of the select nMISes Qs by ion implantation using the third gate electrodes 5a and the gate electrodes 5b as masks, the portion of the respective diffusion layers 2 for the memory cells, extended into a portion of each of the active regions Lp, sandwiched between the third gate electrode 5a and the gate electrode 5b, is overlapped in the same plane with the diffusion layers 12 for use as the source and drain, respectively, of each of the select nMISes Qs, so that it is possible to implement excellent electrical connection between the diffusion layers 2 for each of the memory cells, and the diffusion layers for each of the select nMISes Qs. In other word, peripheral circuits can be connected with memory circuits faultlessly. Hence, the reliability and yield of the semiconductor device can be enhanced. Respective gate electrodes of the peripheral transistors other than the select nMISes Qs are also formed when patterning the third gate electrodes 5a and the respective gate electrodes 5b of the select nMISes Qs. Power is supplied to the respective gate electrodes of the peripheral transistors by connecting the gate electrodes with the wiring layers L2, L3, respectively, through the respective contact holes CNT2 (refer to FIG. 1). Thereafter, after forming an interpoly dielectric film, there are formed contact holes reaching the word lines WL, the well PWL, the third gate electrodes 5a, the select nMISes Qs, and the diffusion layer of each of the select nMISes Qs, on the side thereof, opposite from the memory cells MC, respectively, and subsequently, a metal film is deposited to be thereby patterned into wiring layers, thus completing manufacture of the semiconductor device having nonvolatile memory cells.

Figure 54:
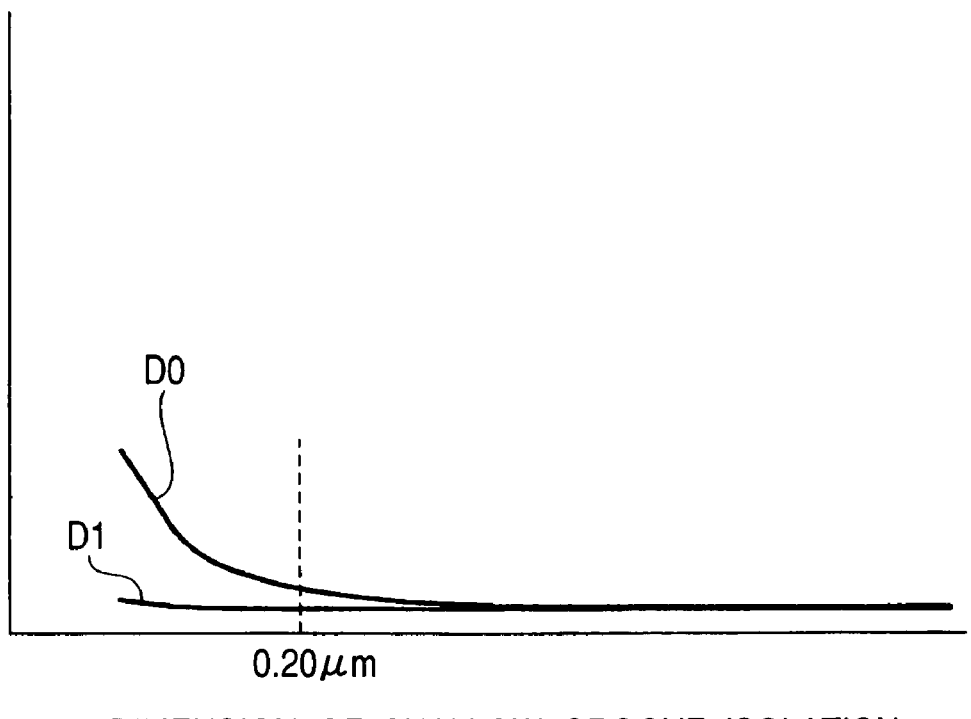
FIG. 54 is a graph showing a ratio of quality deficiency that is considered to have been caused by crystal defect due to stress, plotted against the dimension of shallow groove isolation.

FIG. 54 is a graph showing a ratio of quality deficiency that is considered to have been caused by crystal defect due to stress, plotted against the dimension of shallow groove isolation. Reference numeral D0 indicates test results of a memory cell fabricated by techniques examined by the inventor, that is, a process whereby shallow groove isolation are formed prior to the formation of a gate insulator film of a memory cell, and D1 indicates test results of the memory cell of the semiconductor device as described with reference to the embodiment 1. In the graph, evident advantageous effects of the invention is observed particularly when the dimension of the shallow groove isolation becomes smaller (for example, 0.20 μm or less).

Embodiment 2

With the embodiment 1, the contact hole is formed so as to reach the respective gate electrodes of the select nMISes Qs isolated from each other to be connected with the respective wiring layers formed of the metal film, however, the respective gate electrodes of the select nMISes Qs can be of a stacked structure made up of the conductor film for forming the third gate electrodes and the conductor film for forming the second gate electrodes. More specifically, this can be implemented, for example, as follows.

Figure 55:
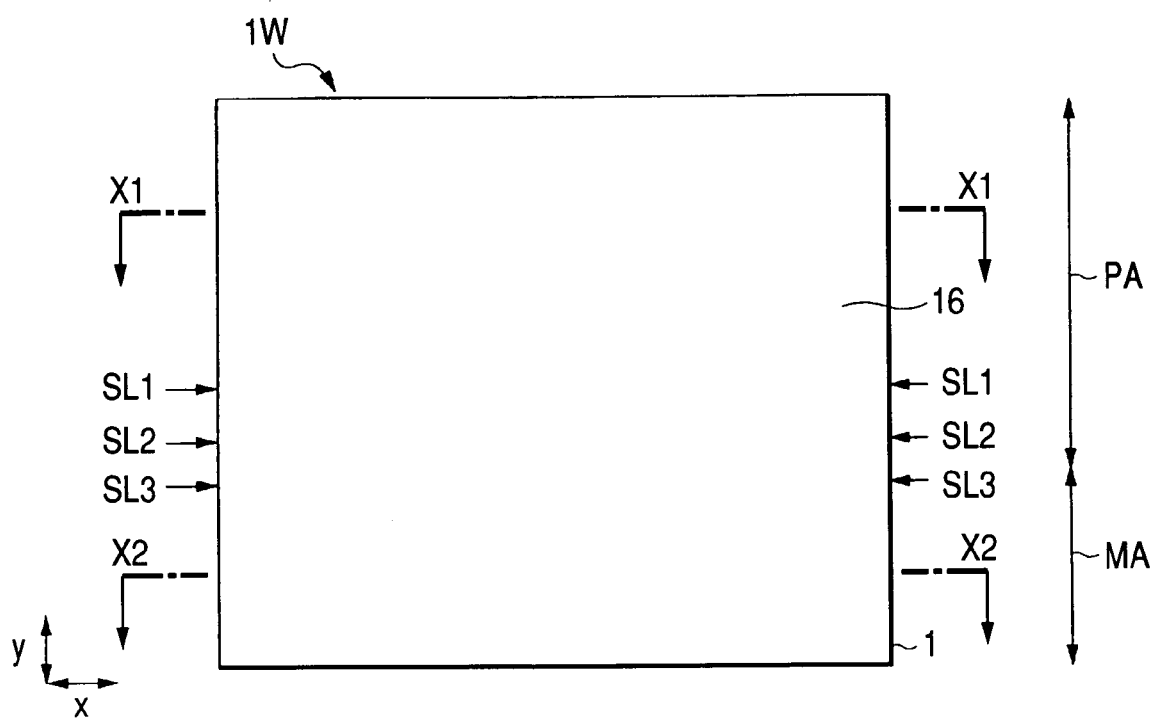
FIG. 55 is a plan view of the principal part of a wafer, in a step of a method of manufacturing a semiconductor device according to another embodiment of the invention.
Figure 56:
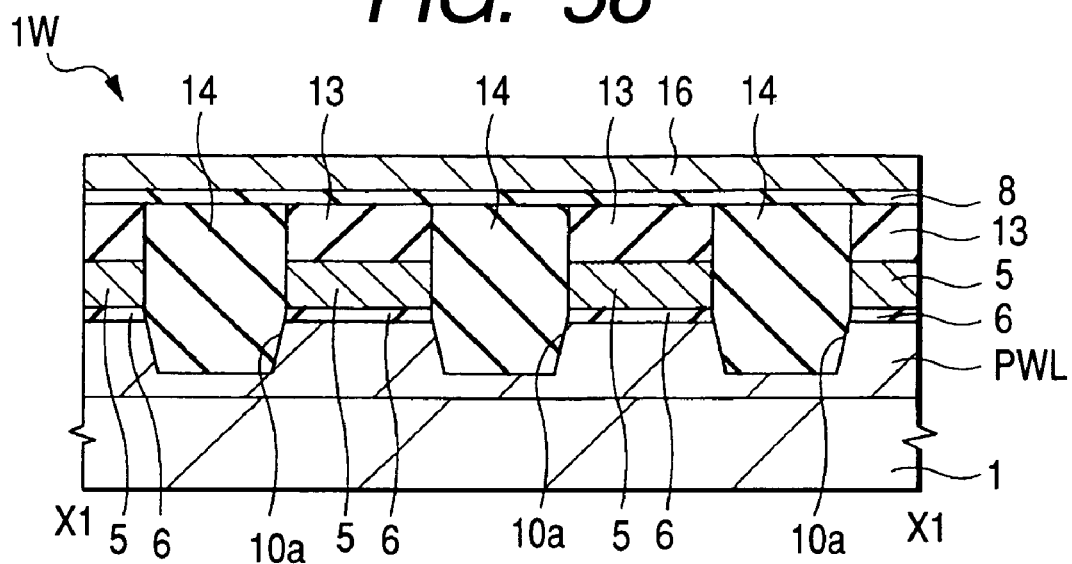
FIG. 56 is a sectional view taken on line X1—X1 in FIG. 55.
Figure 57:
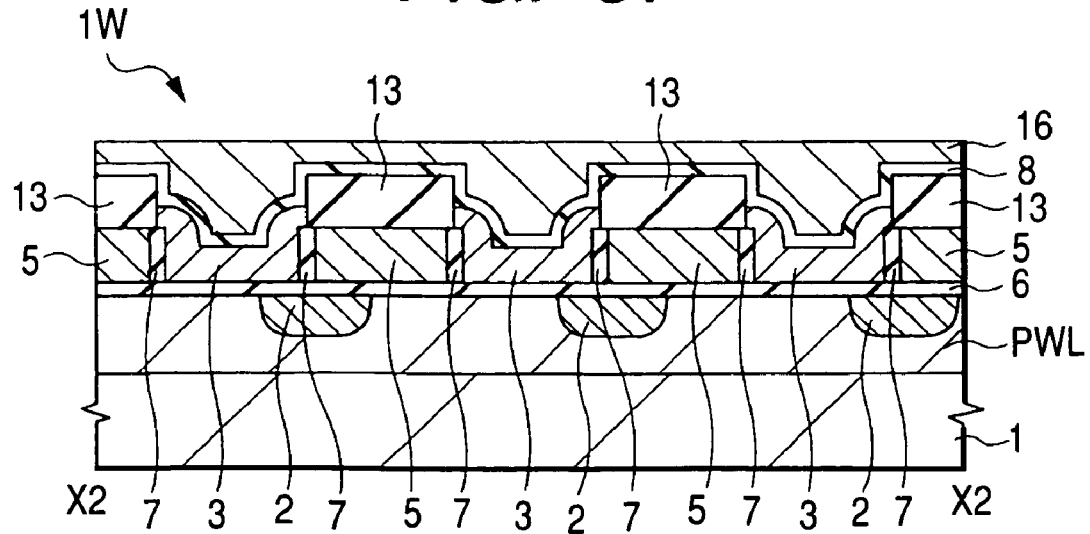
FIG. 57 is a sectional view taken on line X2—X2 in FIG. 55.
Figure 59:
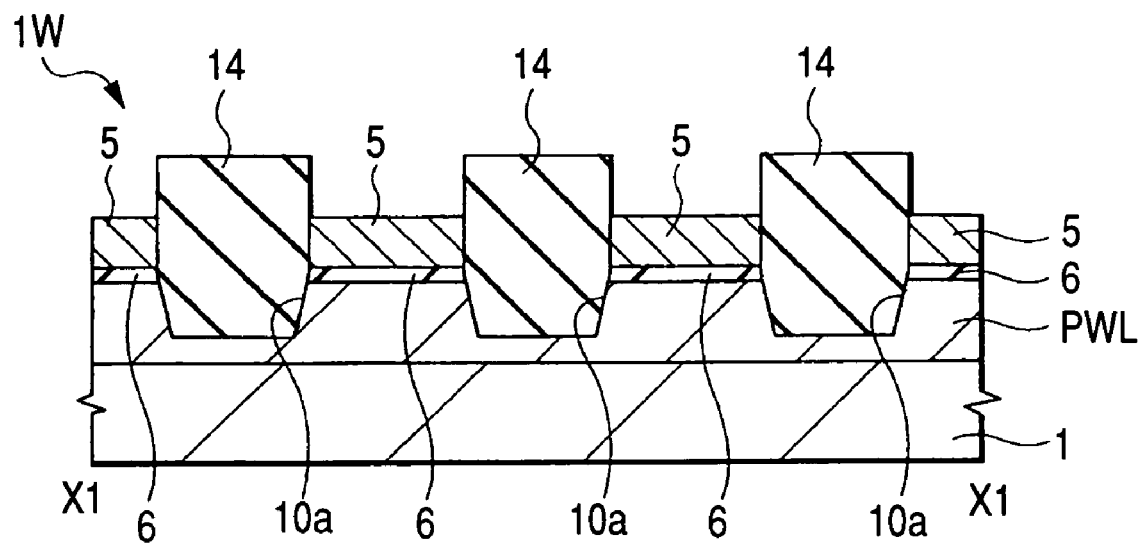
FIG. 59 is a sectional view taken on line X1—X1 in FIG. 58.
Figure 60:
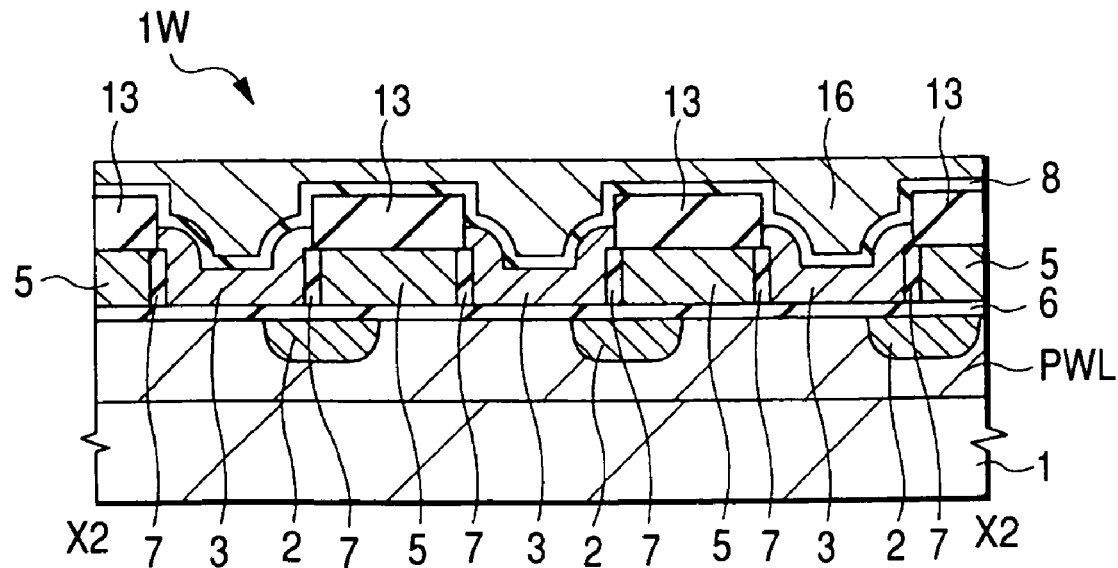
FIG. 60 is a sectional view taken on line X2—X2 in FIG. 58.

FIG. 55 is a plan view of a wafer 1W in a step of a method of manufacturing a semiconductor device according to an embodiment 2, showing the boundary between a memory region MA and a peripheral circuit region PA of the wafer 1W, and the surroundings thereof, and FIGS. 56, and 57 are sectional views taken on lines X1—X1 and X2—X2 of FIG. 55, respectively. Further, FIG. 58 is a plan view of the wafer 1W in a step of the method of manufacturing the semiconductor device, subsequent to the step shown in FIG. 55, showing the boundary between the memory region MA and the peripheral circuit region PA of the wafer 1W, and the surroundings thereof, and FIGS. 59, and 60 are sectional views taken on lines X1—X1 and X2—X2 of FIG. 58, respectively.

After the step shown in FIGS. 40 through 42, a conductor film (fourth conductor film) 16 made up of, for example, a low resistance polysilicon film is first deposited on the top surface of a substrate 1 as shown in FIGS. 55 through 57. In the memory region MA, the conductor film 16 is deposited so as to be in close contact with the top of the insulator film 8. The reason for forming the conductor film 16 of the low resistance polysilicon film is that protection of the insulator film 8 is also taken into consideration. Subsequently, as shown in FIGS. 58 through 60, with the memory region MA being covered by a resist film, portions of the conductor film 16, exposed out of the resist film, are removed by dry etching. In this case, the boundary of the resist film is positioned below a boundary line SL1 as with the case of the respective upper ends of the third gate electrodes 5a shown in FIG. 49, and is positioned above a boundary line SL2. Subsequently, the insulator film 8 is removed by dry etching using the same resist film as an etching mask, and further, an insulator film 13 on top of a conductor film 3 is selectively removed by dry etching on condition that an insulator film 14 is not removed, thereby exposing the conductor film 3.

Figure 58:
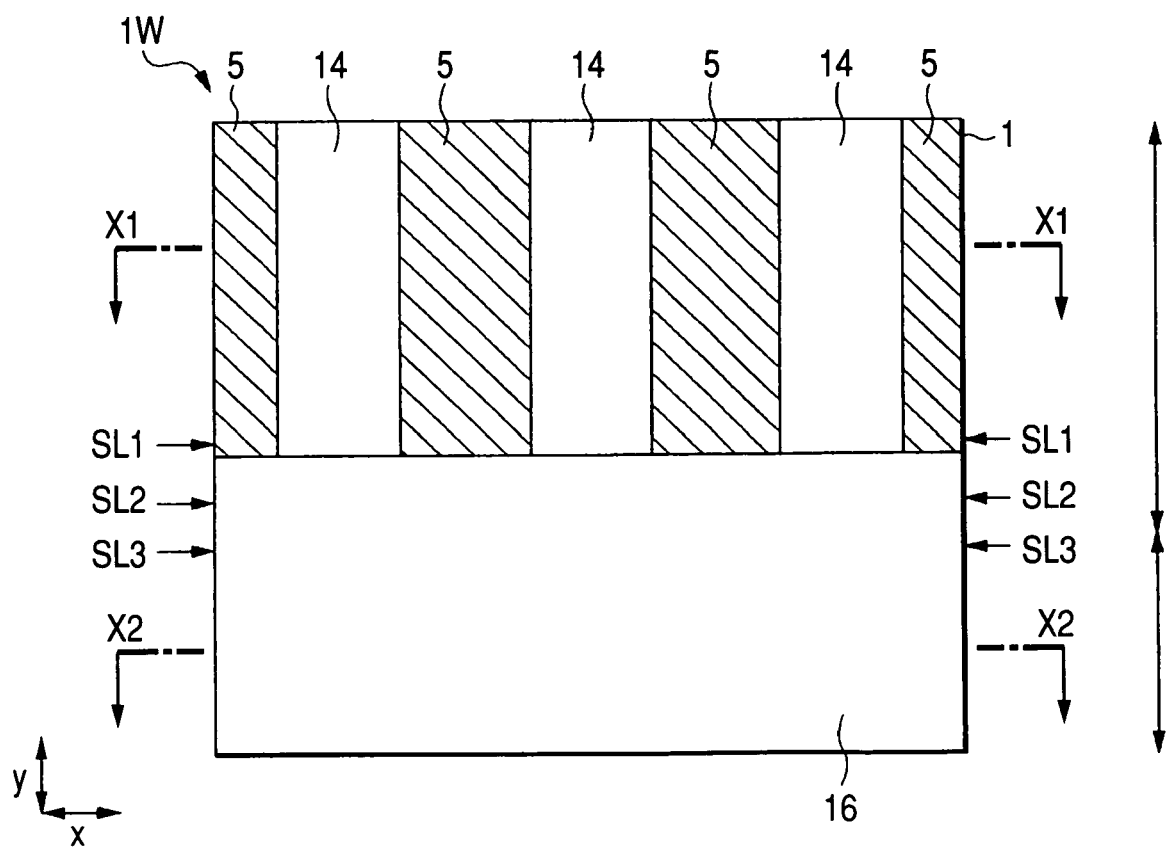
FIG. 58 is a plan view of the wafer 1W, in a step of the method of manufacturing the semiconductor device, subsequent to the step shown in FIG. 55.
Figure 61:
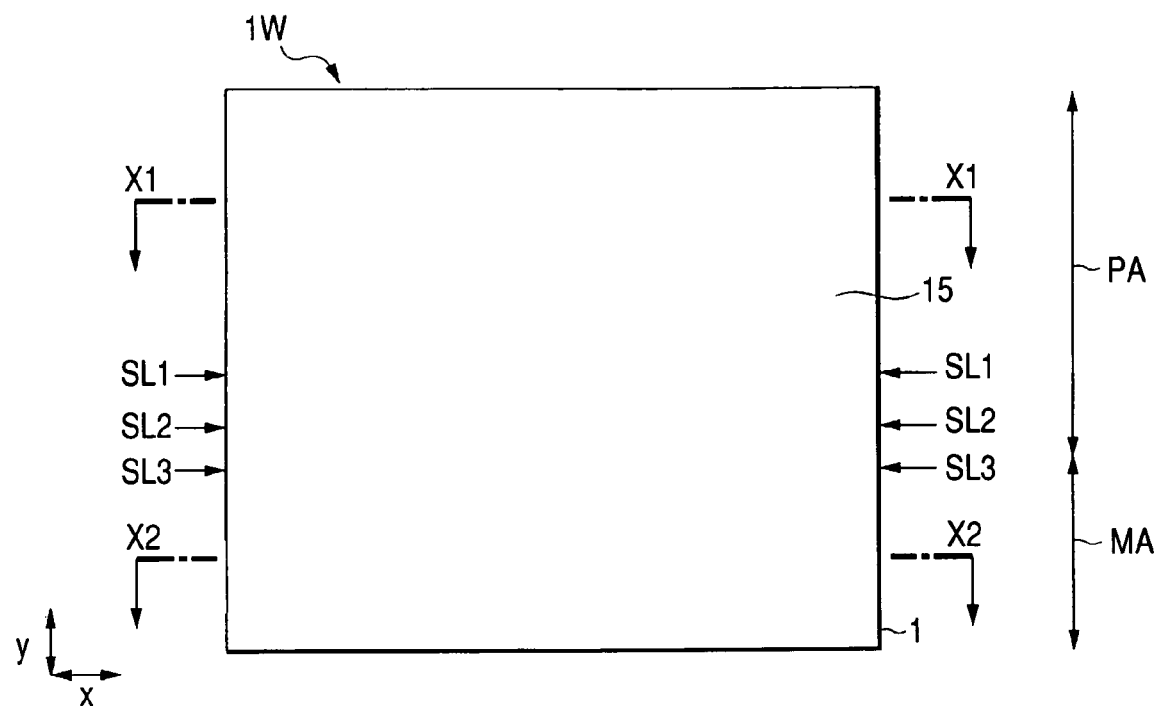
FIG. 61 is a plan view of the wafer 1W, in a step of the method of manufacturing the semiconductor device, subsequent to the step shown in FIG. 58.
Figure 62:
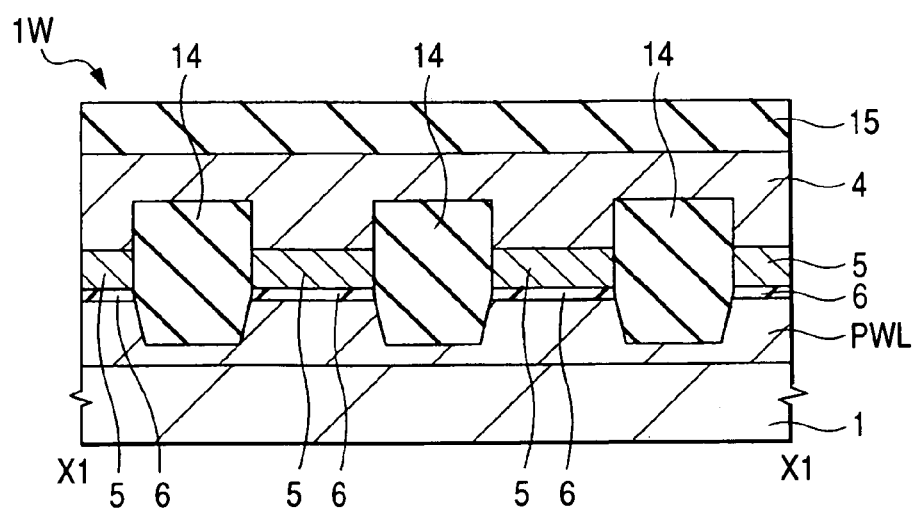
FIG. 62 is a sectional view taken on line X1—X1 in FIG. 61.
Figure 63:
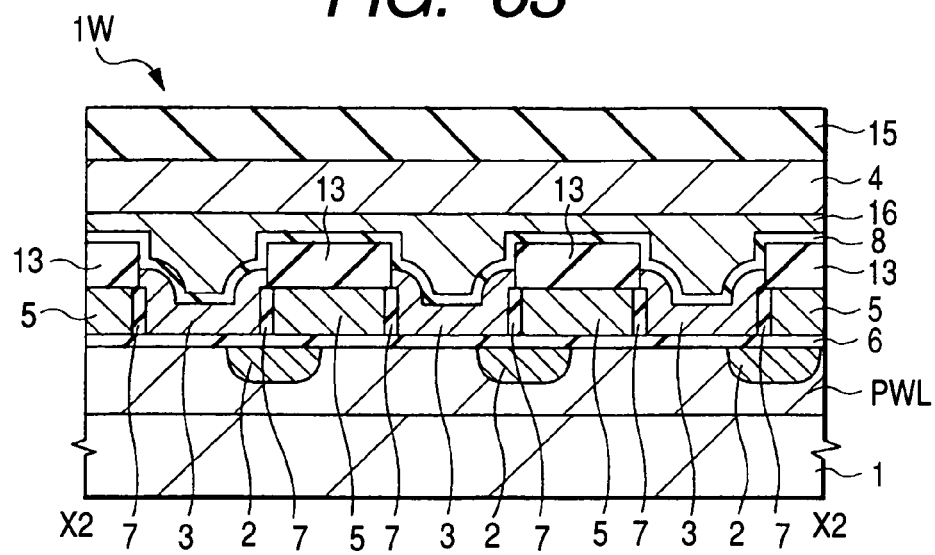
FIG. 63 is a sectional view taken on line X2—X2 in FIG. 61.
Figure 64:
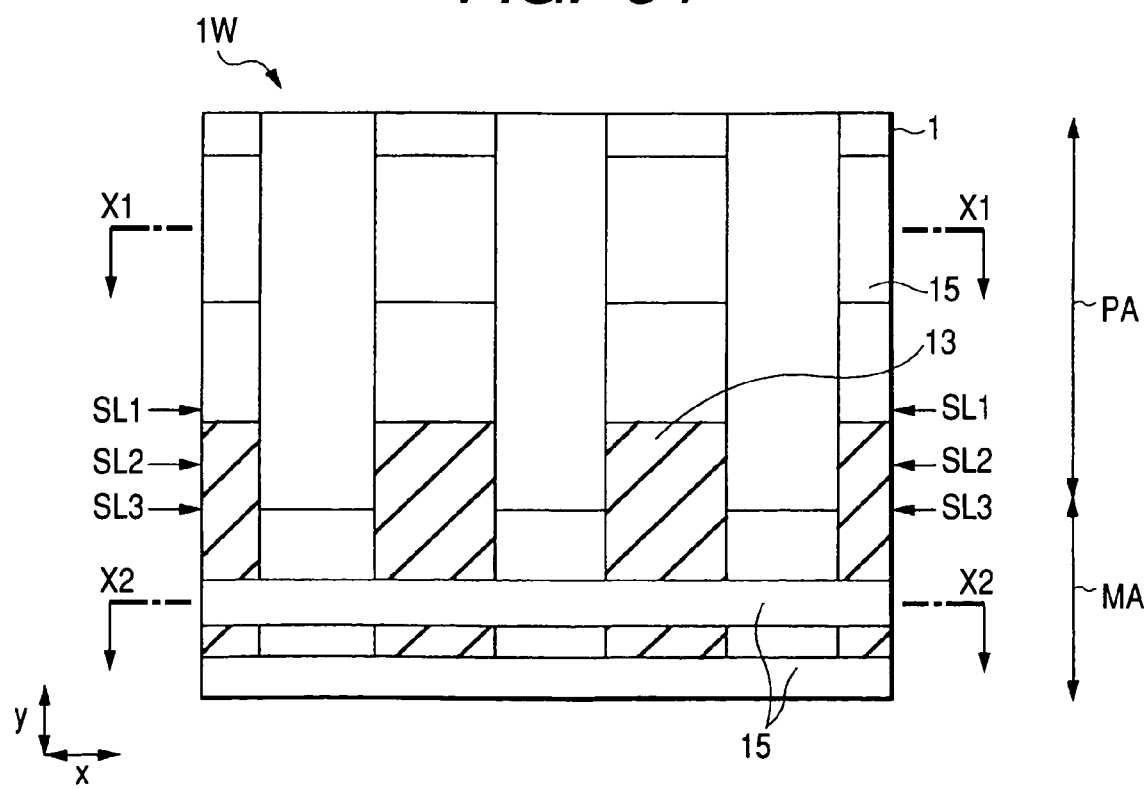
FIG. 64 is a plan view of the wafer 1W, in a step of the method of manufacturing the semiconductor device, subsequent to the step shown in FIG. 61.
Figure 65:
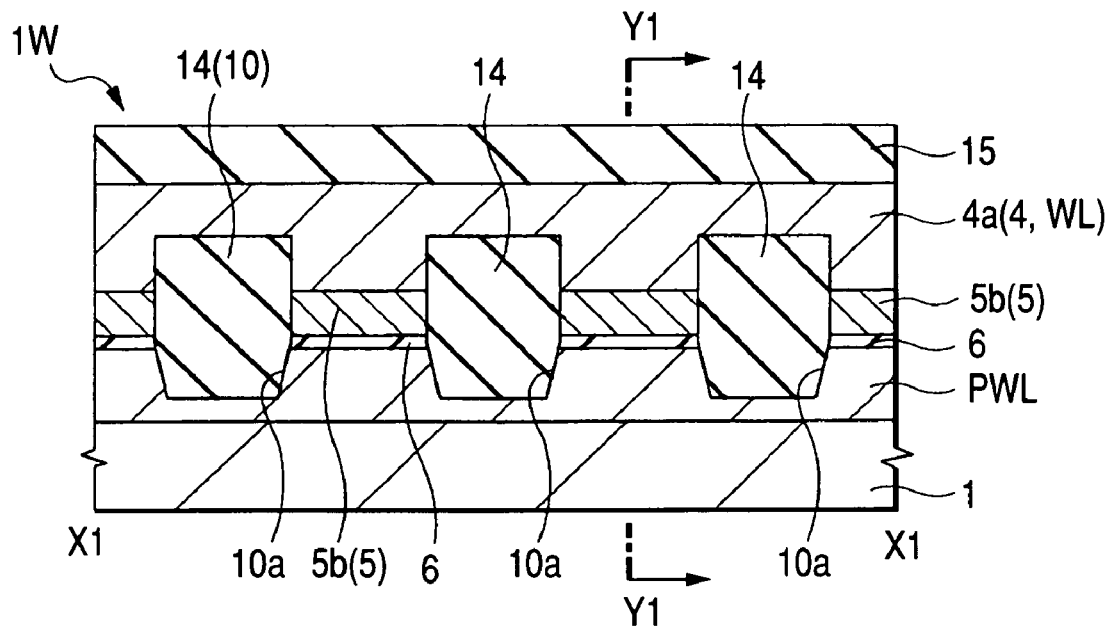
FIG. 65 is a sectional view taken on line X1—X1 in FIG. 64.
Figure 66:
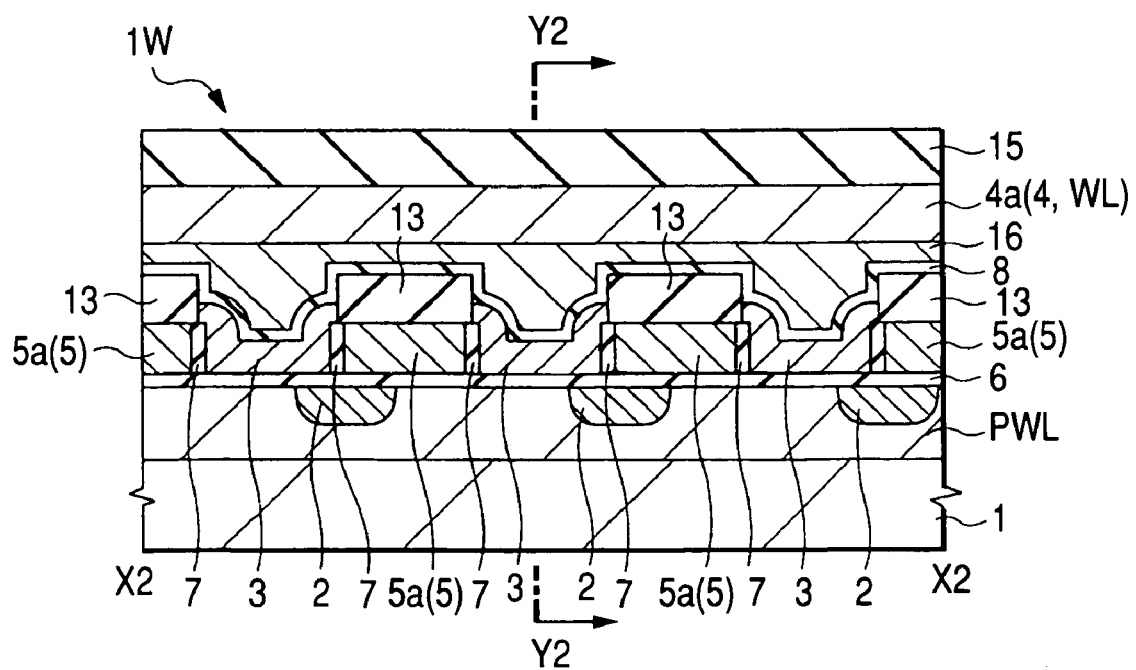
FIG. 66 is a sectional view taken on line X2—X2 in FIG. 64.
Figure 67:
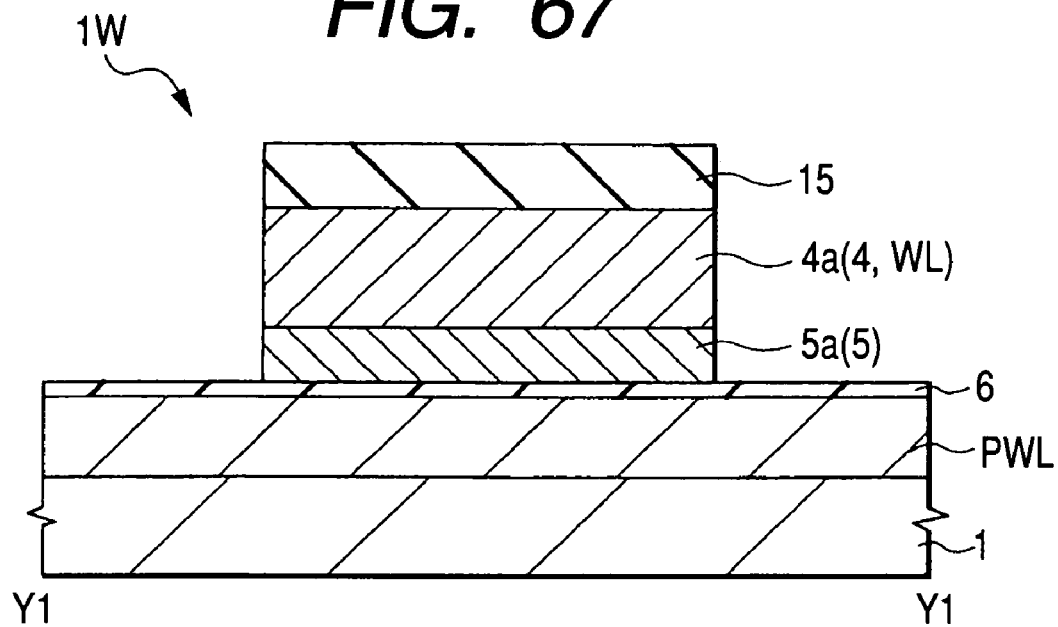
FIG. 67 is a sectional view taken on line Y1—Y1 in FIG. 65.
Figure 68:
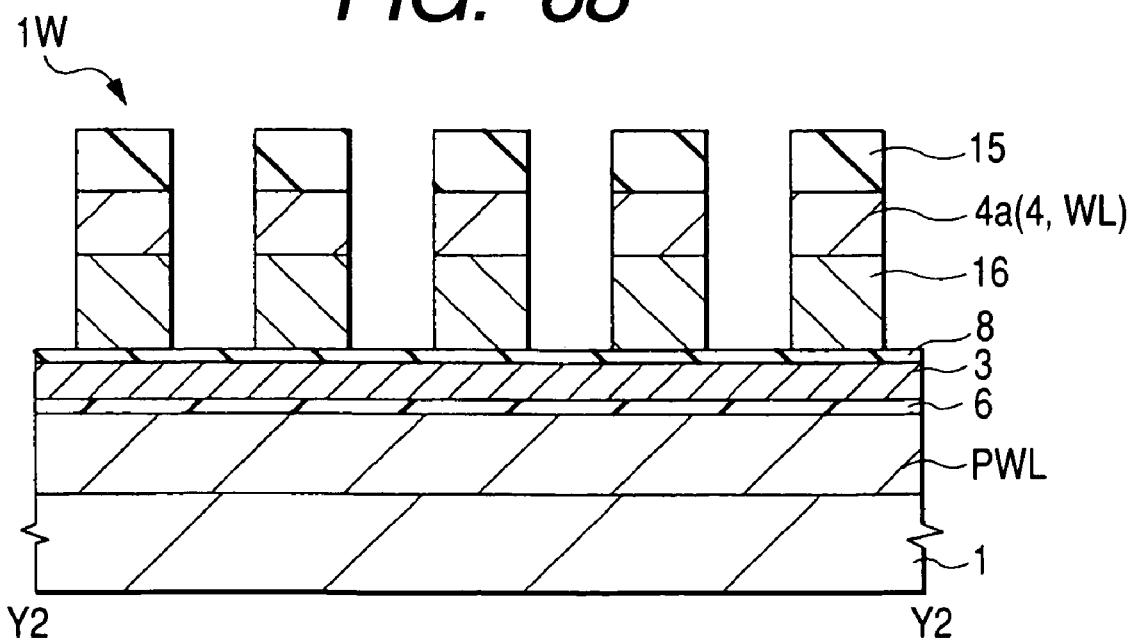
FIG. 68 is a sectional view taken on line Y2—Y2 in FIG. 66.

FIG. 61 is a plan view of the wafer 1W in a step of the method of manufacturing the semiconductor device, subsequent to the step shown in FIG. 58, showing the boundary between the memory region MA and the peripheral circuit region PA of the wafer 1W, and the surroundings thereof, and FIGS. 62, and 63 are sectional views taken on lines X1—X1 and X2—X2 of FIG. 61, respectively. Further, FIG. 64 is a plan view of the wafer 1W in a step of the method of manufacturing the semiconductor device, subsequent to the step shown in FIG. 61, showing the boundary between the memory region MA and the peripheral circuit region PA of the wafer 1W, and the surroundings thereof, and FIGS. 65, and 66 are sectional views taken on lines X1—X1 and X2—X2 of FIG. 64, respectively. FIGS. 67, and 68 are sectional views taken on lines Y1—Y1 of FIG. 65, and Y2—Y2 of FIG. 66, respectively.

First, as shown in FIGS. 61 through 63, a conductor film (the third conductor film) 4 and an insulator film 15 are sequentially deposited in that order on the top surface of a substrate 1, and subsequently, as shown in FIGS. 64 through 68, the insulator film 15, the conductor film 4, the conductor film 16, and the conductor film 5 are sequentially etched in that order by the well-known etching techniques with the patterns of word lines WL (second gate electrodes 4a) in the memory region MA, and patterns of respective gate-electrode-forming portions of the select nMISes Qs, being covered by a resist. The last etching of the conductor film 16, and the conductor film 5 is carried out on condition that the insulator film 8 and the insulator film 13 are not etched. In this stage of processing, patterning of the respective electrodes 5b of the nMISes Qs is completed.

Next, with the peripheral circuit region PA being covered by a resist film, the insulator film 8 and the conductor film 3 are etched in that order in the memory region MA using the patterns of the insulator film 15 as an etching mask, thereby forming memory cells. Thereafter, although not shown in the figures, after forming an interpoly dielectric film, there are formed contact holes reaching the word lines WL, a well PWL, third gate electrodes 5a, the select nMISes Qs (refer to FIG. 1), and the diffusion layer 12 of each of the select nMISes Qs, on the side thereof, opposite from the memory cells MC, respectively, and subsequently, a metal film is deposited to be thereby patterned into wiring layers, thus completing manufacture of the semiconductor device according to the embodiment 2, having nonvolatile memory cells.

With the semiconductor device according to the embodiment 2, advantageous effects of the invention have been observed in that quality deficiencies due to crystal defect do not occur even when the dimension of shallow groove isolation becomes smaller as with the case of the embodiment 1. In addition, the respective gate electrodes 5b of the select nMISes Qs can be formed to have a stacked structure made up of the conductor film 5 for forming the third gate electrodes and the conductor film 4 for forming the second gate electrodes. Accordingly, since the respective gate electrodes 5b of the select nMISes Qs can be rendered low in resistance, it is possible to promote improvement in operation speed of the select nMISes Qs, thereby enabling improvement in operation speed of the semiconductor device to be promoted.

Embodiment 3

With the embodiment 2 described above, the respective gate electrodes 5b of the select nMISes Qs are of the stacked structure made up of the conductor film 5 for forming the third gate electrodes and the conductor film 4 for forming the second gate electrodes. Similarly, the respective gate electrodes of the peripheral transistors other than the select nMISes Qs can also be formed of a stacked structure made up of the conductor film 5 and the conductor film 4.

With a semiconductor device according to an embodiment 3, advantageous effects of the invention have been observed in that quality deficiencies due to crystal defect do not occur even when the dimension of shallow groove isolation becomes smaller as with the cases of the embodiments 1, and 2. In addition, with the embodiment 3, gate wiring layers formed of the polymetal film can be used for supplying power to the respective gate electrodes of the peripheral transistors. Accordingly, it is possible to promote improvement in operation speed of the peripheral transistors, thereby enabling improvement in operation speed of the semiconductor device to be promoted.

Embodiment 4

With the embodiments 1 through 3, the pitches of the stripe-like patterns for the third gate electrodes 5a are identical to the pitches of those for the select nMISes Qs, extending in the same direction. With an embodiments 4, there is cited a case by way of example where select nMISes Qs are formed such that pitches of the patterns for the select nMISes Qs are twice as large as those for third gate electrodes 5a.

Figure 69:
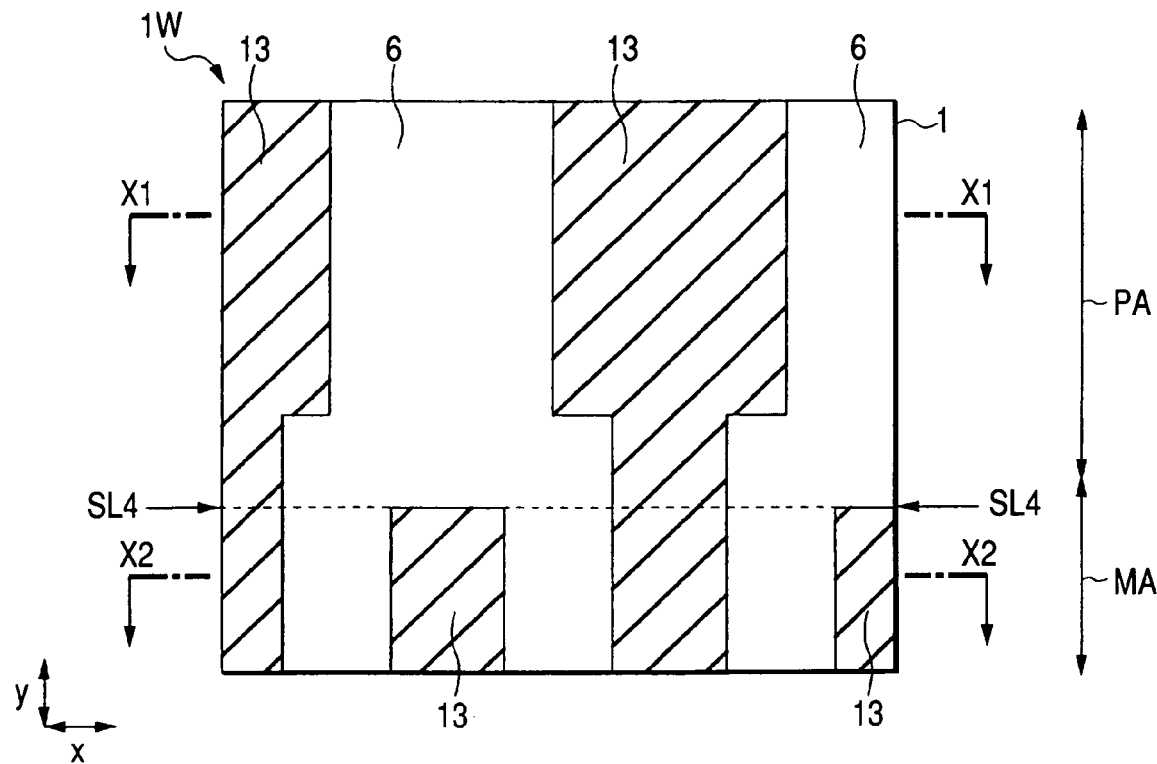
FIG. 69 is a plan view of the principal part of a wafer, in a step of a method of manufacturing a semiconductor device according to still another embodiment of the invention.
Figure 70:
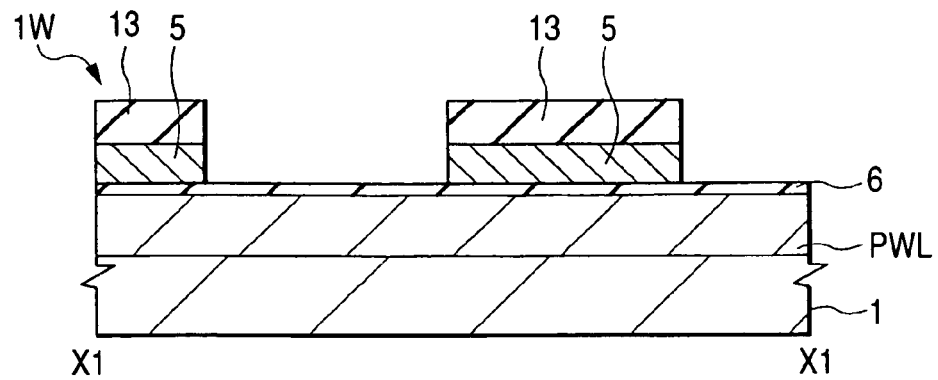
FIG. 70 is a sectional view taken on line X1—X1 in FIG. 69.
Figure 71:
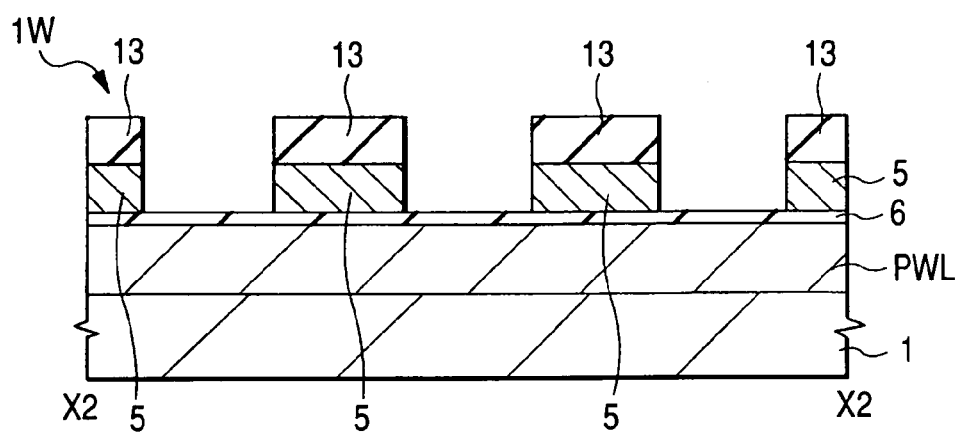
FIG. 71 is a sectional view taken on line X2—X2 in FIG. 69.

FIG. 69 is a plan view of a wafer 1W in a step of a method of manufacturing a semiconductor device according to the embodiment 4, showing the boundary between a memory region MA and a peripheral circuit region PA of the wafer 1W, and the surroundings thereof, and FIGS. 70, and 71 are sectional views taken on lines X1—X1 and X2—X2 of FIG. 69, respectively. Further, FIG. 72 is a plan view of the wafer 1W in a step of the method of manufacturing the semiconductor, subsequent to the step shown in FIG. 69, showing the boundary between the memory region MA and the peripheral circuit region PA of the wafer 1W, and the surroundings thereof, and FIGS. 73, and 74 are sectional views taken on lines X1—X1 and X2—X2 of FIG. 72, respectively.

After the step previously shown in FIG. 10, an insulator film 13 and a conductor film 5 are patterned by use of the lithographic and dry etching techniques, as shown in FIGS. 69 through 71. As a result, patterns of the insulator film 13 and the conductor film 5 are formed. In this case, a layout is adopted such that not all the patterns of the conductor film 5 are disposed so as to extend across both the memory region MA and the peripheral circuit region PA along one side of the wafer 1W, but every other pattern of a plurality of the patterns of the conductor film 5 is disposed so as to extend across both the memory region MA and the peripheral circuit region PA. Further, a portion of the pattern of the conductor film 5, disposed so as to extend across both the memory region MA and the peripheral circuit region PA, positioned in the peripheral circuit region PA, is larger in width than another portion thereof, positioned in the memory region MA. In FIG. 69, a broken line indicates a boundary line SL4 corresponding to the extremity of the patterns of the conductor film 5 for forming the third gate electrodes, not reaching the peripheral circuit region PA.

Figure 72:
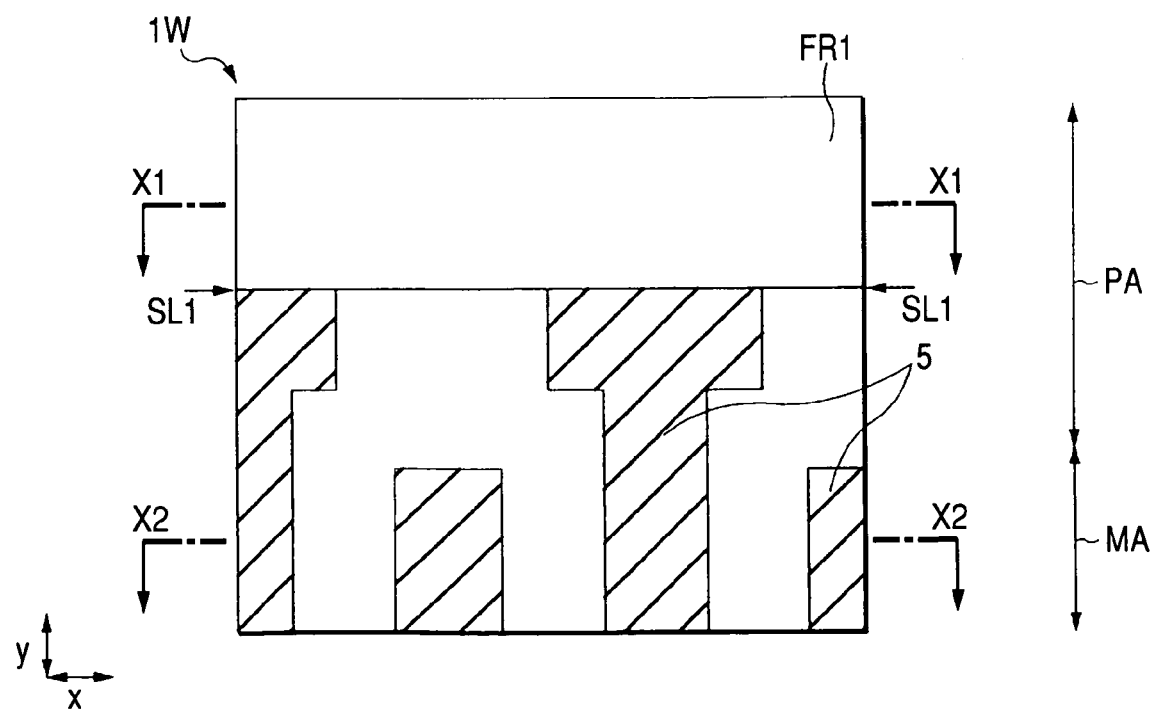
FIG. 72 is a plan view of the wafer 1W, in a step of the method of manufacturing the semiconductor device, subsequent to the step shown in FIG. 69.
Figure 73:
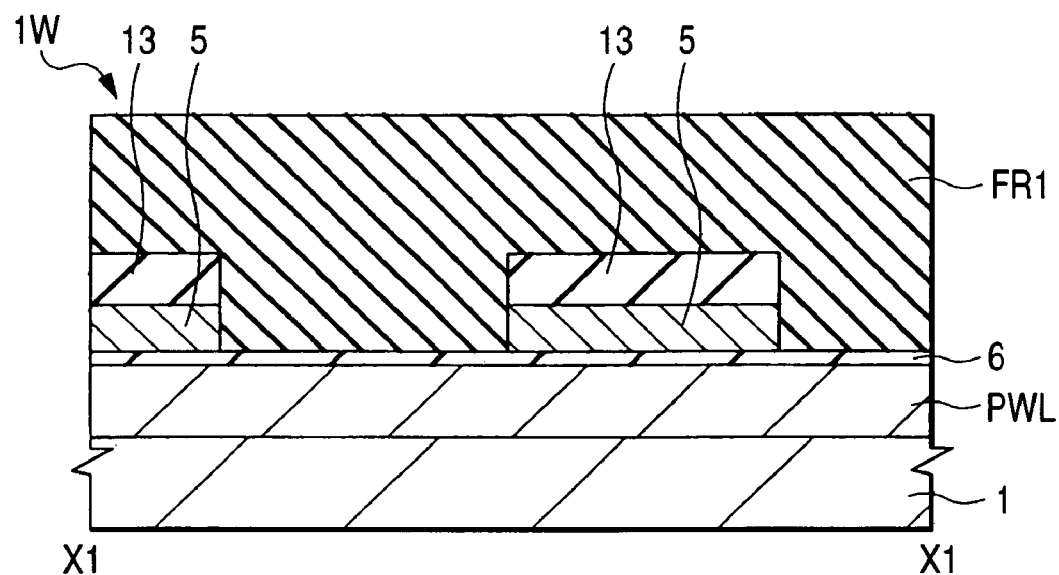
FIG. 73 is a sectional view taken on line X1—X1 in FIG. 72.
Figure 74:
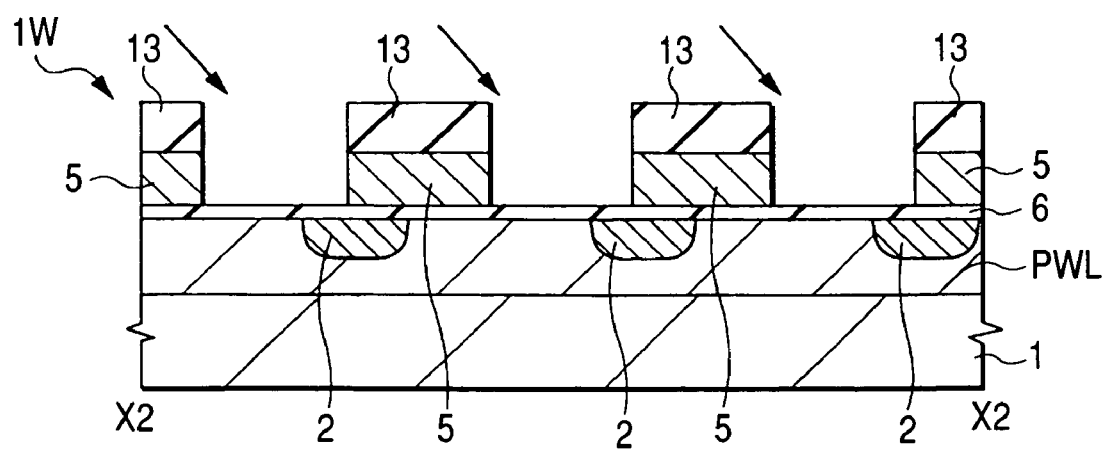
FIG. 74 is a sectional view taken on line X2—X2 in FIG. 72.

Subsequently, as shown in FIGS. 72 through 74, diffusion layers 2 for use as a source and drain, respectively, of each of memory cells are formed by implanting arsenic (As) ions and so forth into a well PWL by use of the tilted ion implantation method as with the case of the embodiment 1. In this case, with the use of, for example, a resist pattern FR1 serving as a mask, there is formed a region where arsenic ions are not implanted. The boundary of the region is indicated by a boundary line SL1. The boundary line SL1 is overlapped with the respective portions of the patterns of the conductor film 5, larger in width.

Figure 75:
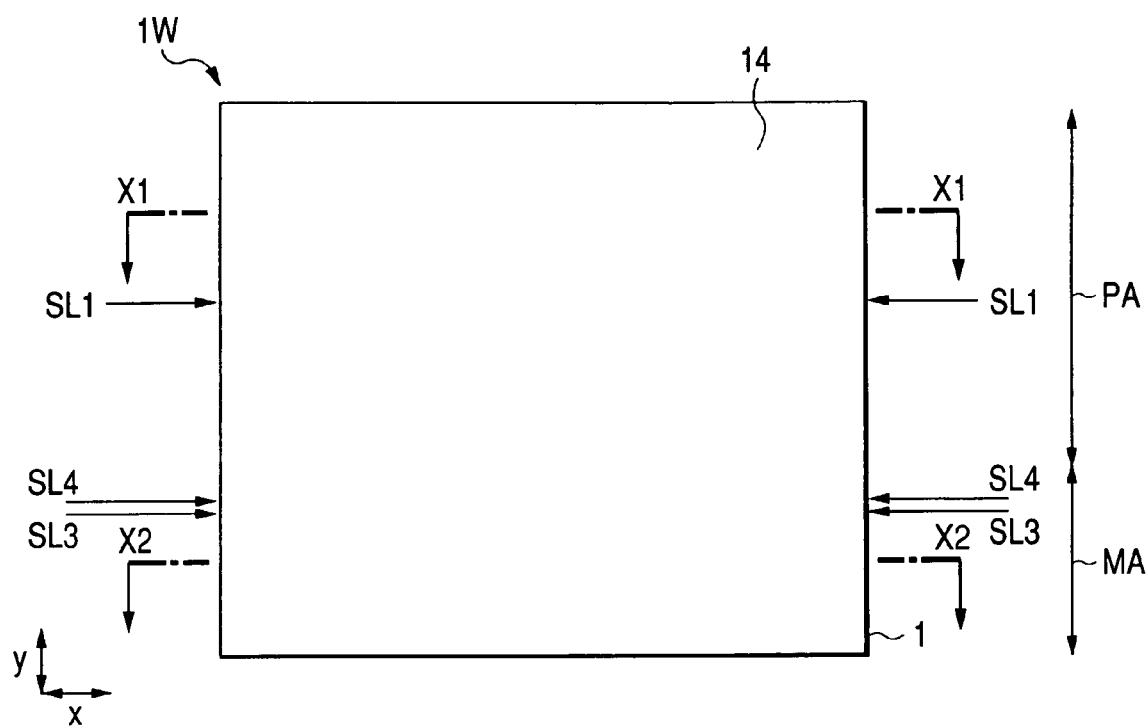
FIG. 75 is a plan view of the wafer 1W, in a step of the method of manufacturing the semiconductor device, subsequent to the step shown in FIG. 72.
Figure 76:
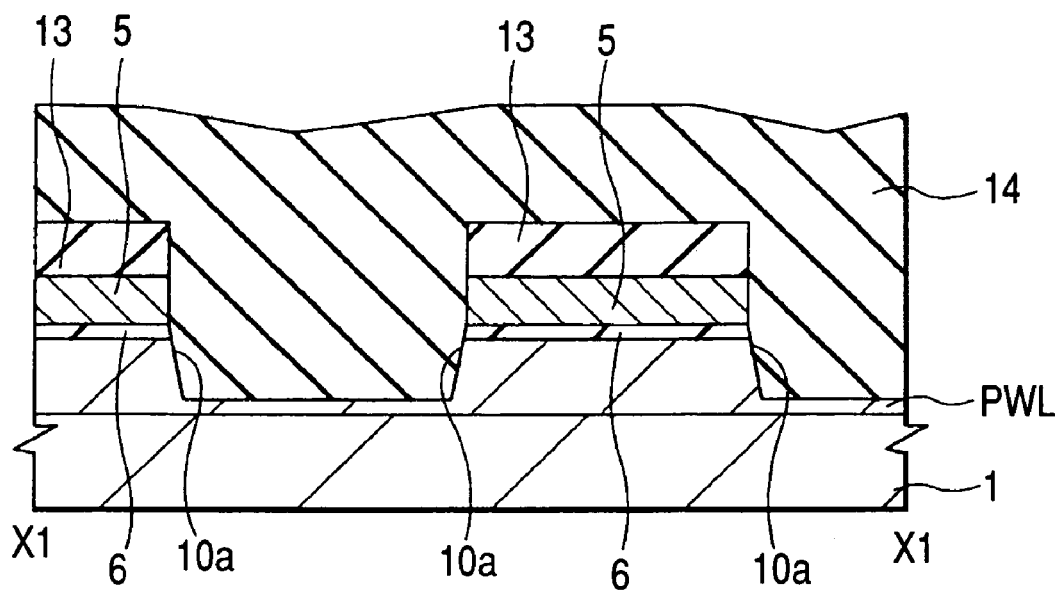
FIG. 76 is a sectional view taken on line X1—X1 in FIG. 75.
Figure 77:
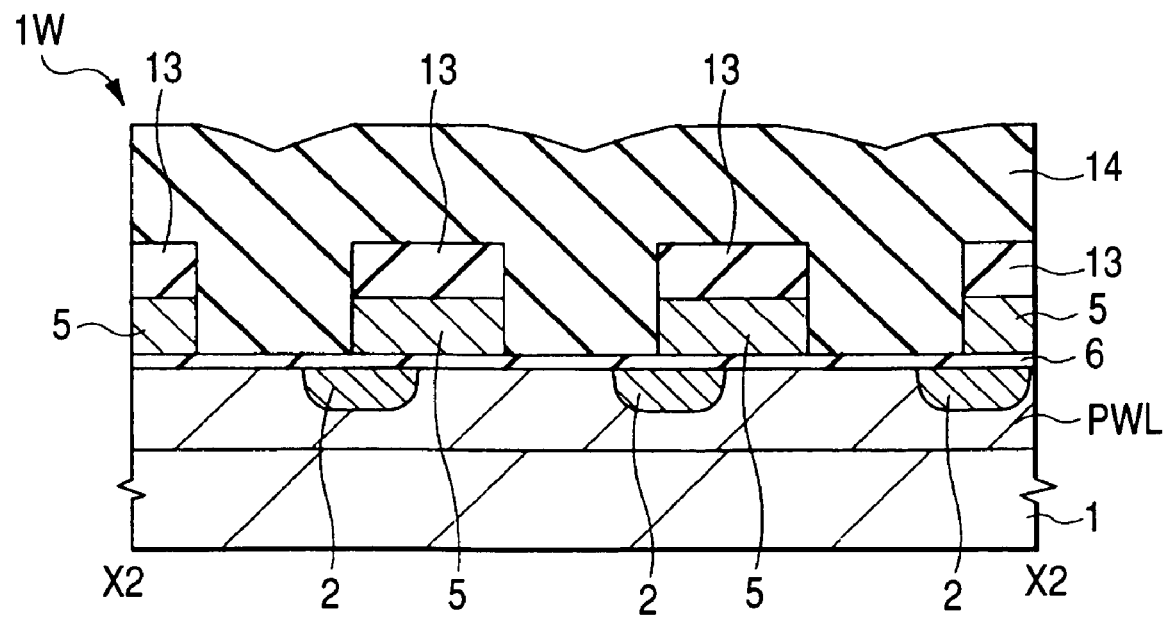
FIG. 77 is a sectional view taken on line X2—X2 in FIG. 75.
Figure 78:
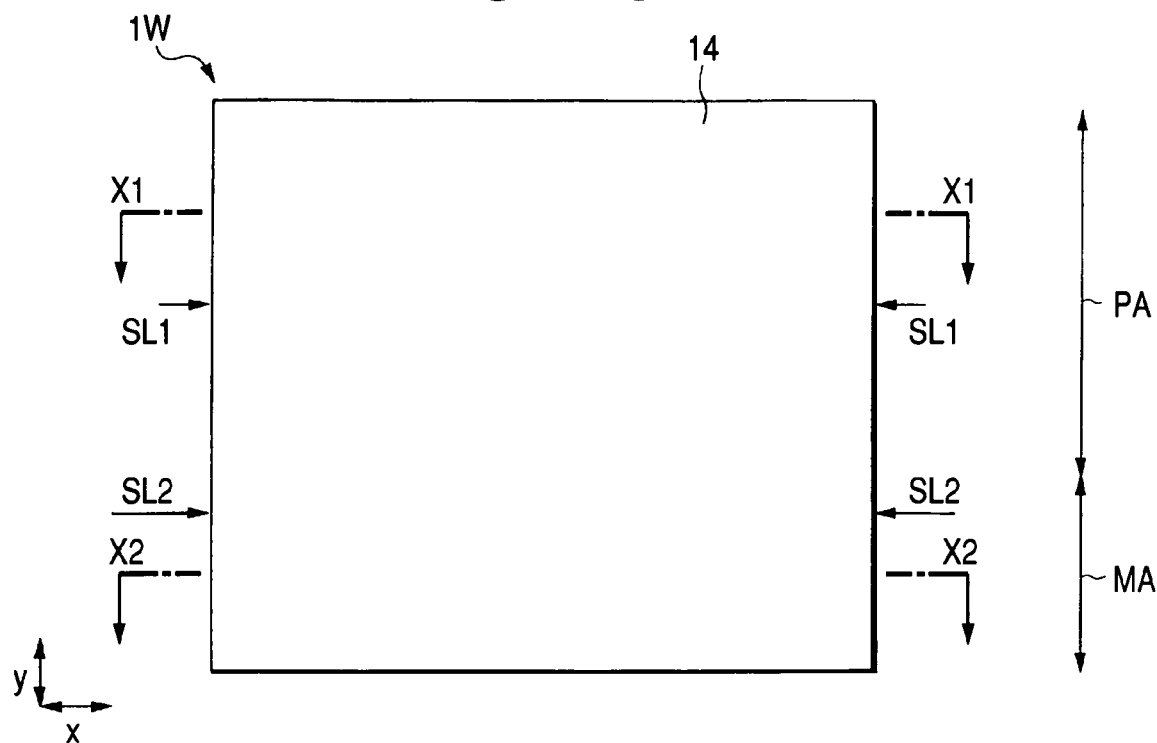
FIG. 78 is a plan view of the wafer 1W, in a step of the method of manufacturing the semiconductor device, subsequent to the step shown in FIG. 72.
Figure 79:
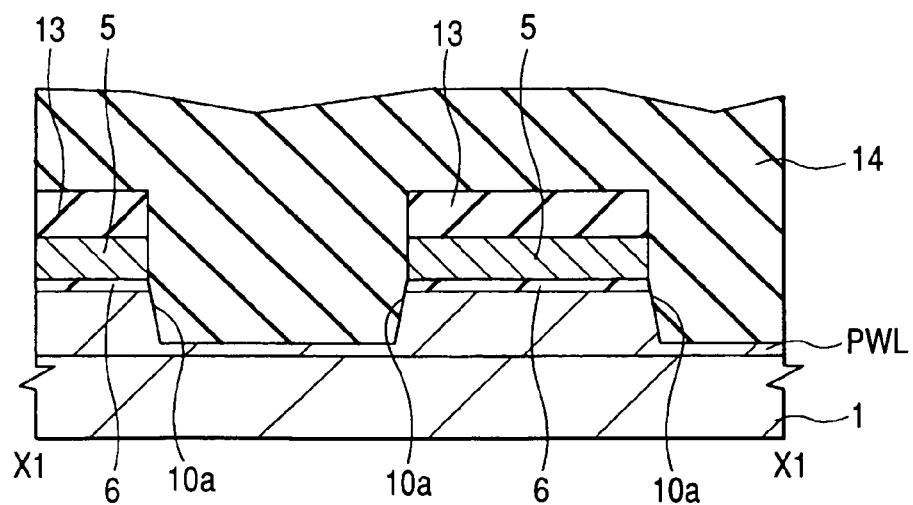
FIG. 79 is a sectional view taken on line X1—X1 in FIG. 78.
Figure 80:
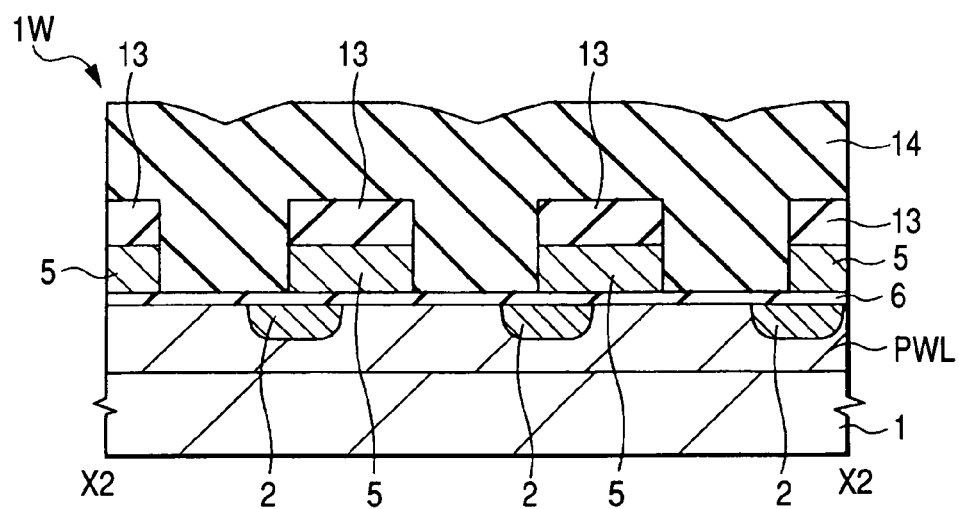
FIG. 80 is a sectional view taken on line X2—X2 in FIG. 78.
Figure 81:
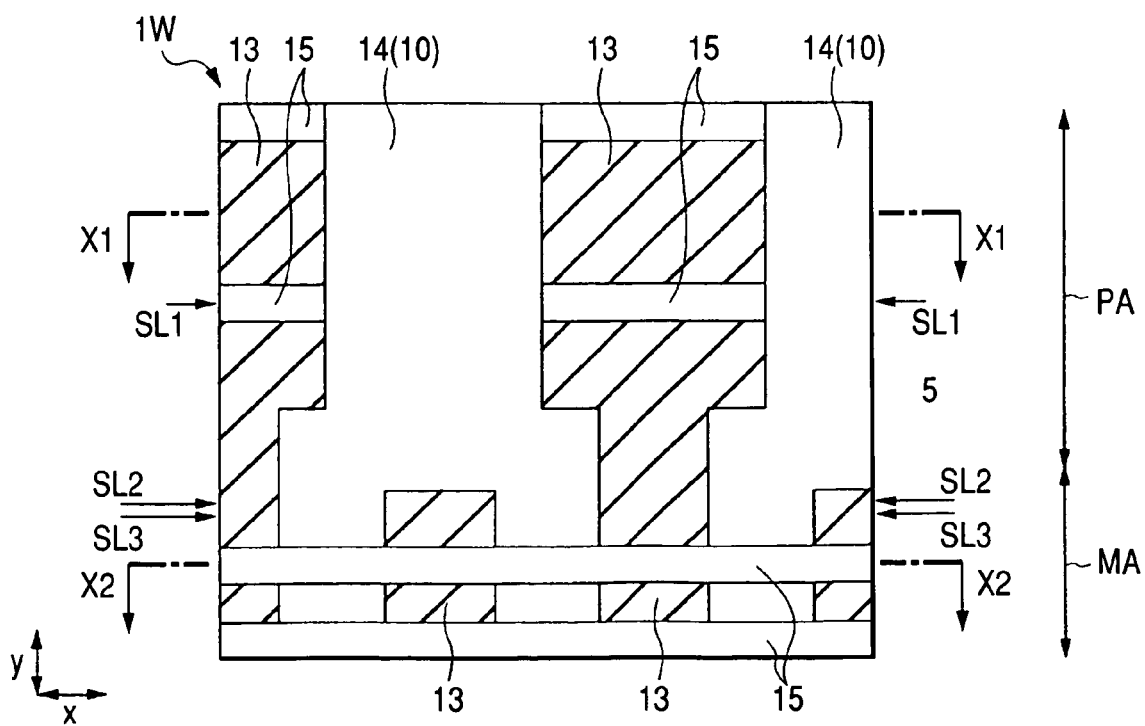
FIG. 81 is a plan view of the wafer 1W, in a step of the method of manufacturing the semiconductor device, subsequent to the step shown in FIG. 78.
Figure 82:
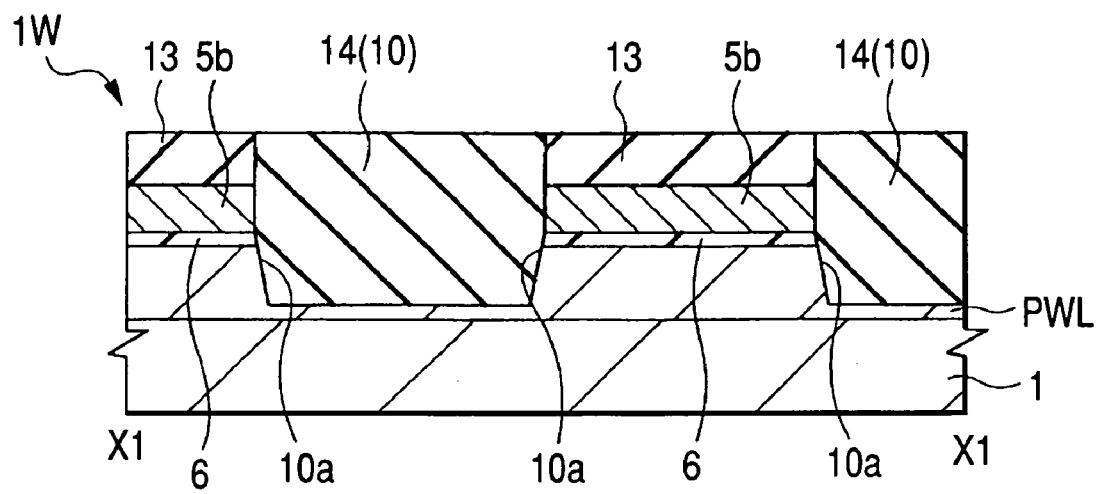
FIG. 82 is a sectional view taken on line X1—X1 in FIG. 81.
Figure 83:
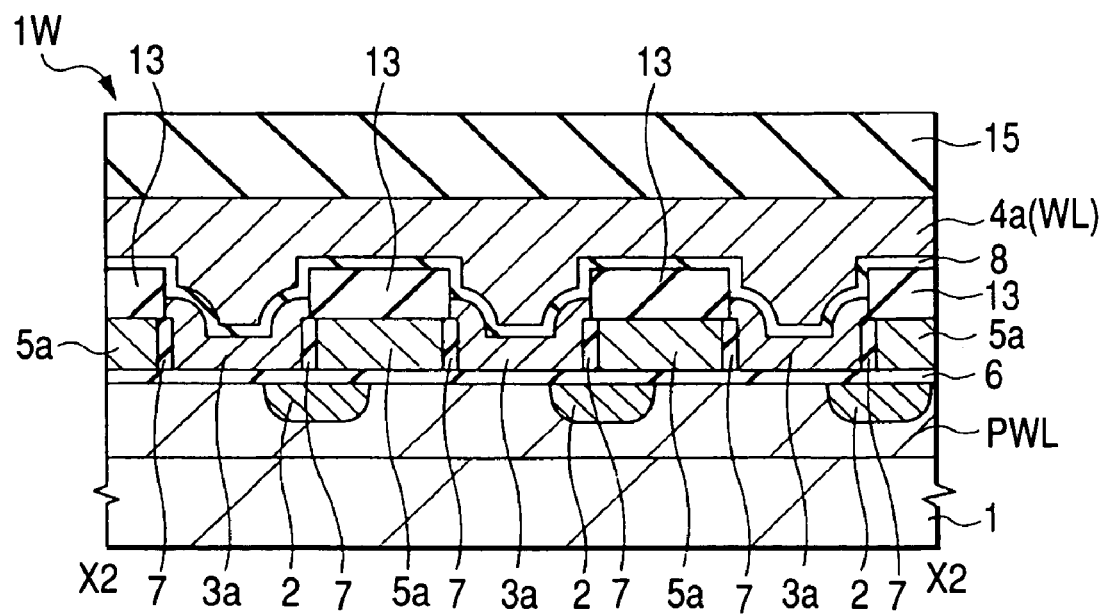
FIG. 83 is a sectional view taken on line X2—X2 in FIG. 81.

FIG. 75 is a plan view of the wafer 1W in a step of the method of manufacturing the semiconductor, subsequent to the step shown in FIG. 72, showing the boundary between the memory region MA and the peripheral circuit region PA of the wafer 1W, and the surroundings thereof, and FIGS. 76, and 77 are sectional views taken on lines X1—X1 and X2—X2 of FIG. 75, respectively. Further, FIG. 78 is a plan view of the wafer 1W in a step of the method of manufacturing the semiconductor, subsequent to the step shown in FIG. 75, showing the boundary between the memory region MA and the peripheral circuit region PA of the wafer 1W, and the surroundings thereof, and FIGS. 79, and 80 are sectional views taken on lines X1—X1 and X2—X2 of FIG. 78, respectively. Furthermore, FIG. 81 is a plan view of the wafer 1W in a step of the method of manufacturing the semiconductor, subsequent to the step shown in FIG. 78, showing the boundary between the memory region MA and the peripheral circuit region PA of the wafer 1W, and the surroundings thereof, and FIGS. 82, and 83 are sectional views taken on lines X1—X1 and X2—X2 of FIG. 81, respectively.

Herein, portions of a gate insulator film 6 and the well PWL are etched away in succession by dry etching with the use of the insulator film 13 after patterned as a mask, and isolation grooves 10a are thereby formed. In this case, by use of, for example, a resist, there is formed a region that is not etched. The boundary of the region is indicated by a boundary line SL2 as with the case of the embodiment 1. At this point in time, the position of the boundary line SL2, in relation to that of the boundary line SL1, is rendered as shown in FIG. 78. More specifically, in a region between the boundary line SL1 and the boundary line SL2, there are formed regions where diffusion layers 2 are formed in portions of the substrate 1, under the conductor film 5, and portions of the well PWL are removed by the dry etching. Further, the position of the boundary line SL2 must be below that of the boundary line SL4 shown by the broken line in FIG. 69. This is because isolation between the source and the drain of each of memory cells cannot otherwise be implemented. Subsequently, as shown FIGS. 78 through 80, an insulator film 14 made up of a silicon oxide film etc. is deposited on the top surface of a substrate 1 by use of, for example, the CVD method so as to completely full up the respective isolation grooves 10a. Thereafter, through the same steps as those of the embodiment 1, shown in FIG. 25 and the figures subsequent thereto, memory cells MC and select nMISes Qs are formed as shown in FIGS. 81 through 83.

With a semiconductor device according to the embodiment 4, advantageous effects of the invention have been observed in that quality deficiencies due to crystal defect do not occur even when the dimension of shallow groove isolation becomes smaller as with the cases of the embodiments 1 through 3. In addition, with the embodiment 4, a channel width of each of the select nMISes Qs is increased twice as large, and channel current obtained is also increased twice as large. Accordingly, without causing a large increase in area of the memory region MA, it is possible to promote improvement in operation speed of the select nMISes Qs, thereby enabling improvement in operation speed of the semiconductor device to be promoted.

Embodiment 5

With the embodiment 4 described above, the respective gate electrodes 5b of the select nMISes Qs are formed of a polysilicon film, which is material for forming the third gate electrodes. Respective gate electrodes 5b of the select nMISes Qs according to embodiment 5 can also be formed of a stacked film made up of a conductor film 5 for forming the third gate electrodes and a conductor film 4 for forming the second gate electrodes by the same steps of processing as those described with reference to the embodiment 2.

With a semiconductor device according to an embodiment 5, advantageous effects of the invention have been observed in that quality deficiencies due to crystal defect do not occur even when the dimension of shallow groove isolation becomes smaller as with the cases of the embodiments 1 through 4.

Embodiment 6

With the embodiment 5, the respective gate electrodes 5b of the select nMISes Qs are formed of a stacked film made up of the conductor film 5 for forming the third gate electrodes and the conductor film 4 for forming the second gate electrodes. With an embodiment 6, the respective gate electrodes of the peripheral transistors other than the select nMISes Qs, as well, are similarly formed of a stacked film made up of the conductor film 5 and the conductor film 4.

With a semiconductor device according to the embodiment 6, advantageous effects of the invention have been observed in that quality deficiencies due to crystal defect do not occur even when the dimension of shallow groove isolation becomes smaller as with the cases of the embodiments 1 through 6. In addition, with the embodiment 6, gate wiring layers formed of a polymetal film can be used for supplying power to respective gate electrodes of peripheral transistors. Accordingly, it is possible to promote improvement in operation speed of the peripheral transistors, thereby enabling improvement in operation speed of the semiconductor device to be promoted.

Embodiment 7

If pitches of the global bit lines are relaxed in relation to those of the local bit lines by employing a method for forming select nMISes Qs or shallow groove isolation between the select nMISes and peripheral transistors other than the select nMISes Qs, in a self-aligned manner against third gate electrodes 5a, as carried out in the embodiments 1 through 6, it is possible to prevent an increase in area of select nMISes Qs portions.

Figure 84:
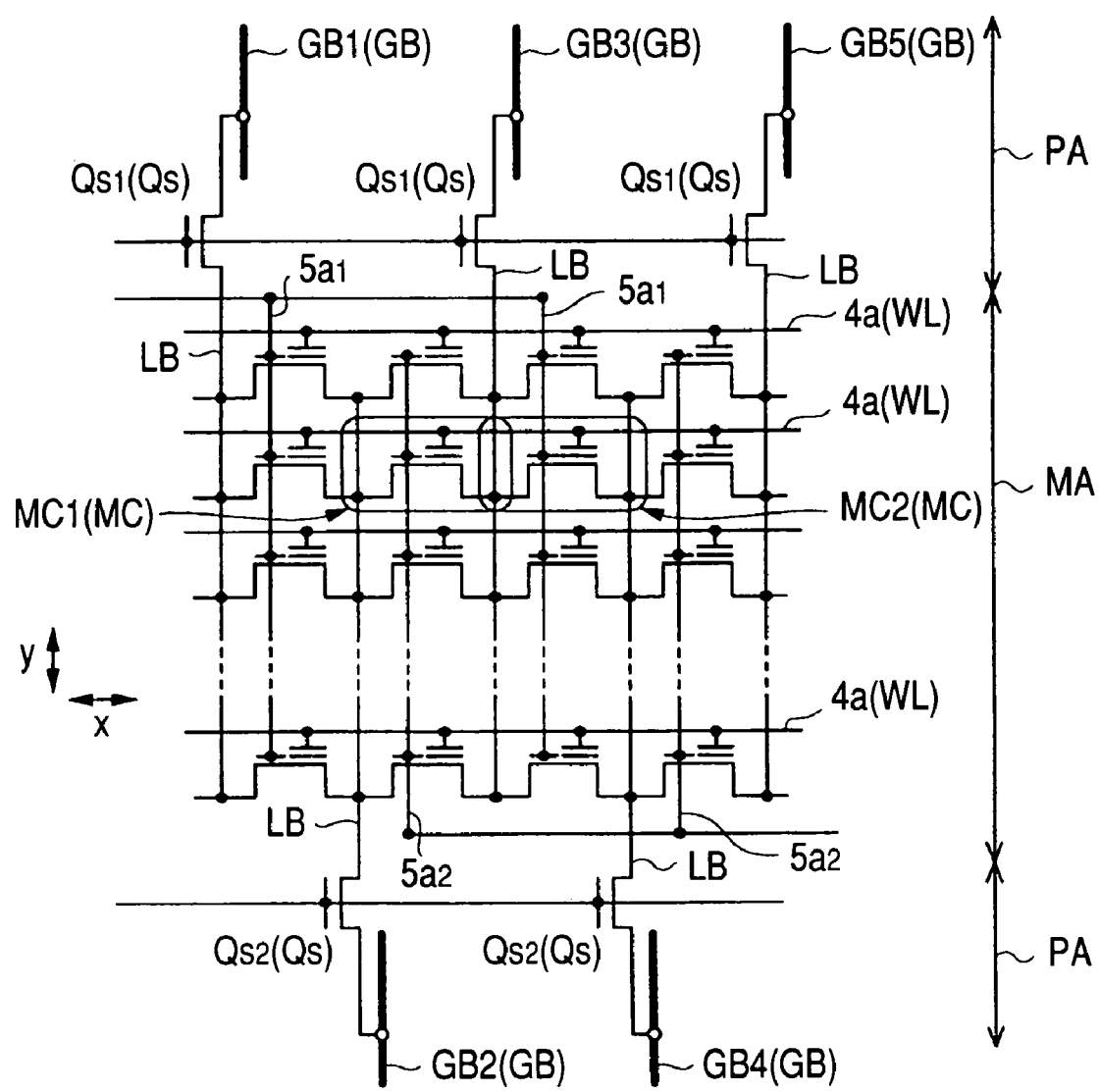
FIG. 84 is a schematic representation showing pitch relaxation of global bit lines.
Figure 85:
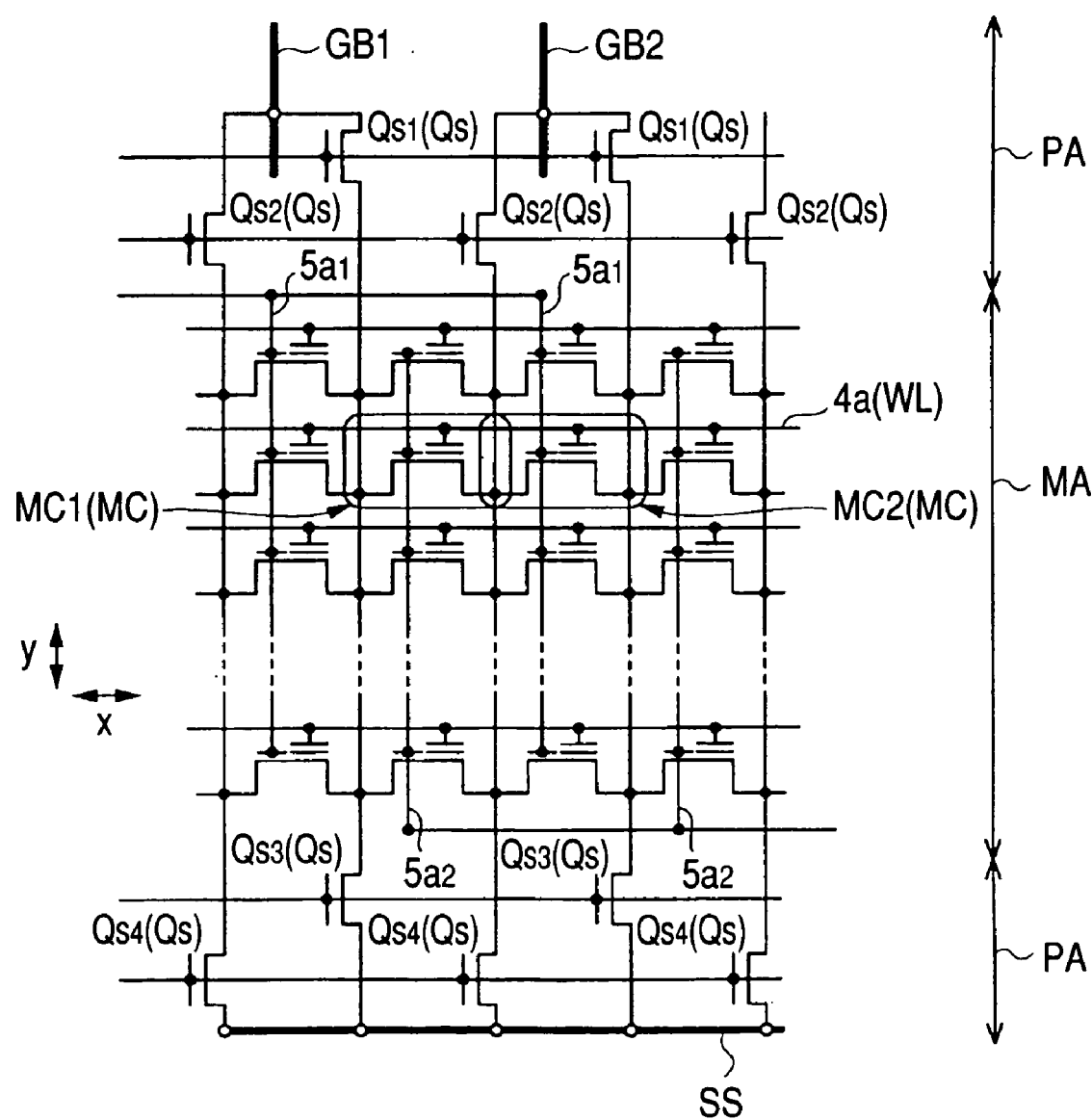
FIG. 85 is a schematic representations showing pitch relaxation of global bit lines.

FIGS. 84 and 85 are schematic representations showing pitch relaxation of global bit lines GB, respectively. First, FIG. 84 is the schematic representation showing a case where the pitches of the global bit lines GB are equal to those of local bit lines LB. For respective memory cells MC, one each of the select nMISes Qs1, Qs2 (Qs) is disposed at opposite ends of a memory region MA. For example, at the time of program operation for a memory cell MC1 (MC), both the select nMISes Qs1, and Qs2 are turned ON while a third gate electrode 5a1 (5a) is turned OFF, and a third gate electrode 5a2 (5a) is turned ON. Further, a global bit line GB2 is used as a source, and a global bit line GB3 as a drain. Meanwhile, at the time of program operation for a memory cell MC2 (MC) adjacent to the memory cell MC1, both the select nMISes Qs1, and Qs2 are turned ON while the third gate electrode 5a1 (5a) is turned ON, and a third gate electrode 5a2 (5a) is turned OFF. Further, the global bit line GB3 is used as a source, and a global bit line GB4 as a drain.

However, if the thickness of a metal layer which is the constituent material of the global bit lines GB is increased in order to lower resistance thereof, it becomes impossible to form the global bit lines GB at the same narrow pitches as those for the local bit lines LB. As a countermeasure to cope with such a case, a configuration as shown in FIG. 85 is adopted. More specifically, every two local bit lines LB adjacent to each other are connected to one global bit line GB, and pitches of the global bit lines GB are rendered twice as large as those of the local bit lines LB. In this case, for example, at the time of program operation for a memory cell MC1, both select nMISes Qs1, and Qs4 (Qs) are turned OFF and both select nMISes Qs2, and Qs3 (Qs) are turned ON while a third gate electrode 5a1 is turned OFF, and a third gate electrode 5a2 is turned ON. Further, the global bit line GB2 is used as a drain. Meanwhile, at the time of program operation for a memory cell MC2 adjacent to the memory cell MC1, both the select nMISes Qs1, and Qs4 are turned ON and both the select nMISes Qs2, and Qs3 are turned OFF while the third gate electrode 5a1 is turned ON, and the third gate electrode 5a2 (5a) is turned OFF. Reference numeral SS denotes a source line.

Figure 86:
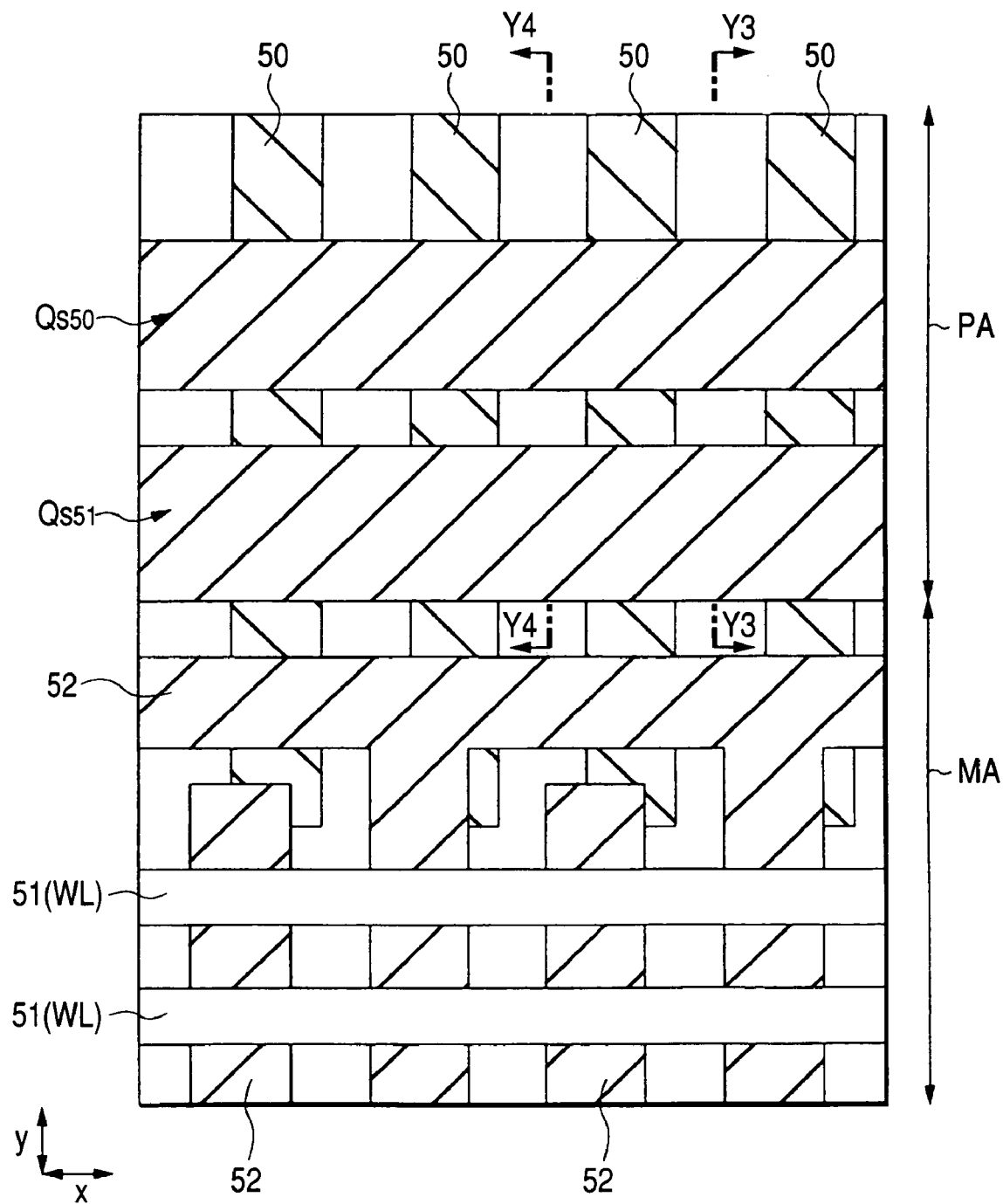
FIG. 86 is a partial plan view of memory cells according to techniques examined by the inventor.

As with the case of techniques examined by the inventor for forming memory cells and select transistors after the formation of shallow groove isolation, there arises a problem in that an area occupied by the select transistors increases when the number of the select transistors, necessary in association with pitch relaxation of the global bit lines GB, increases from two to four. FIG. 86 is a plan view of memory cells according to the techniques examined by the inventor. In a region where stripe-like patterns of shallow groove isolation are formed, select nMISes Qs50, Qs51 are formed with gate wiring layers. At a section taken on line Y3—Y3 in FIG. 86, the select nMIS Qs50 is always caused to undergo depletion by implantation of second conductivity type ions prior to gate formation. Meanwhile, similarly, at a section taken on line Y4—Y4 in the figure, the select nMIS Qs51 is always caused to undergo depletion by implantation of second conductivity type ions prior to gate formation. The same applies to select nMISes disposed on the side of the other end of a memory region MA. Accordingly, an area of four gate wiring layers for the select nMISes is occupied. Reference numeral 51 indicates second gate electrodes, that is, a word line WL, and reference numeral 52 indicates third gate electrodes.

Figure 87:
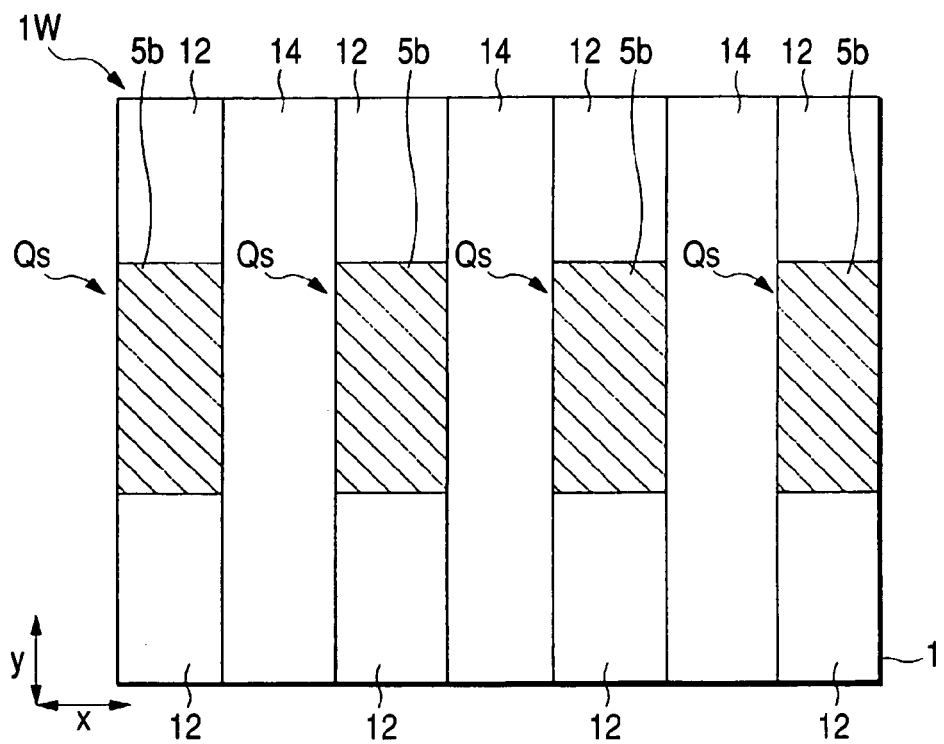
FIG. 87 is an enlarged plan view of the principal part of a select transistor portion in FIG. 49.
Figure 88:
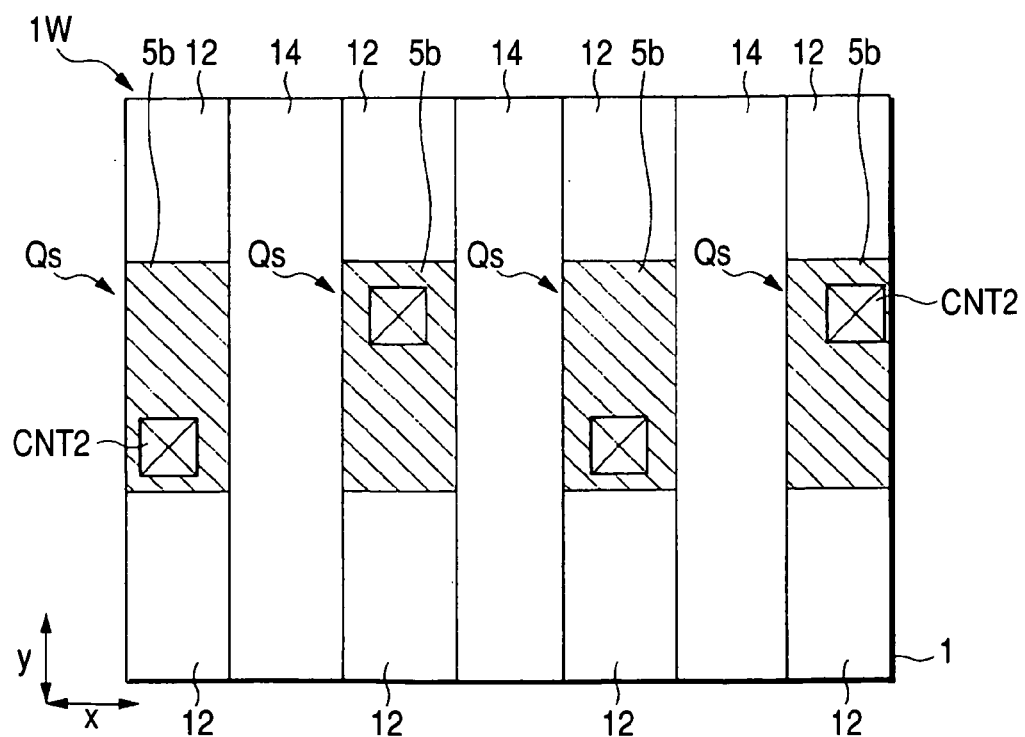
FIG. 88 is an enlarged plan view of the principal part of a select transistor portion, in a step of the method of manufacturing the semiconductor device, subsequent to the step shown in FIG. 87.
Figure 89:
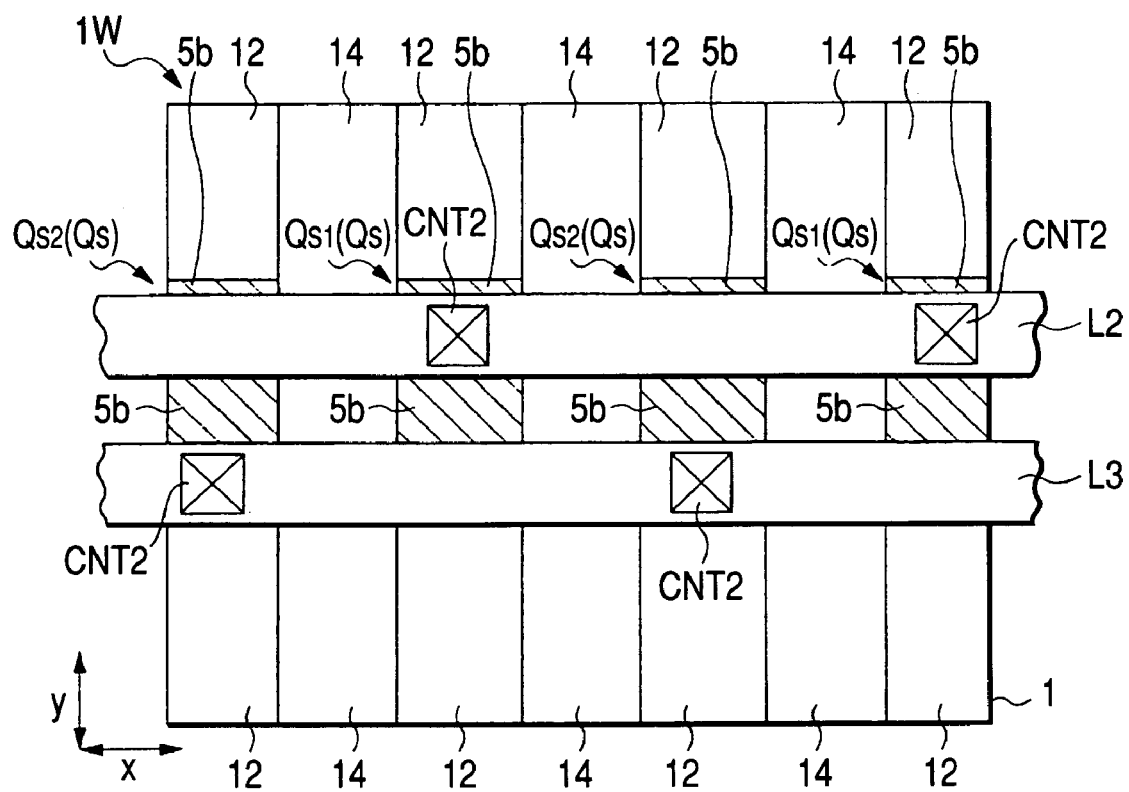
FIG. 89 is an enlarged plan view of the principal part of a select transistor portion, in a step of the method of manufacturing the semiconductor device, subsequent to the step shown in FIG. 88.

In contrast, with the present embodiment wherein the shallow groove isolation are formed in a self-aligned manner against the third gate electrodes, the select nMISes Qs1 through Qs4 can be accommodated within an area required for two of the select nMISes. FIG. 87 is an enlarged plan view of the principal part of a select nMIS Qs portion (layers of the gate electrodes 5*b*) in FIG. 49 for the embodiment 1. Further, FIG. 88 is an enlarged plan view of the principal part of the select nMIS Qs portion (layers of the contact holes CNT2) in a step of the method of manufacturing the semiconductor device, subsequent to the step shown in FIG. 87. Furthermore, FIG. 89 is an enlarged plan view of the principal part of the select nMIS Qs portion (layers of the wiring layers L2, L3,) in a step of the method of manufacturing the semiconductor device, subsequent to the step shown in FIG. 88. After forming diffusion layers 12 for use as a source and a drain, respectively, by implanting second conductivity type ions against gate electrodes 5*b* of the individual select nMISes Qs as separated, thereby forming an insulator film 8 for use as an interpoly dielectric film, contact holes CNT2 are defined at positions indicated in FIG. 88. The respective positions of the contact holes CNT2 for connection with the gate electrodes 5*b* adjacent to each other, respectively, are staggered in the y-direction in FIG. 88. Subsequently, wiring layers formed of a metal layer, L2, L3, are formed as shown in FIG. 89. By so doing, since the wiring layers L2, L3 are electrically insulated from each other, the respective gate electrodes 5*b* connected with the wiring layer L2 can be used for the select nMIS Qs1, and the respective gate electrodes 5*b* connected with the wiring layer L3 can be used for the select nMIS Qs2, so that both the select nMIS Qs1, and the select nMIS Qs2 can be formed within an area for just one of the select nMISes. The same applies to select nMISes disposed on the side of the other end of the memory region MA. That is, an area occupied by the select nMISes can be rendered the same as that in the case where the pitch relaxation of the bit lines is not carried out.

With a semiconductor device according to the embodiment 7, it is possible to eliminate an increase in the area occupied by the select nMISes even when pitch relaxation of global bit lines GB is carried out.

Embodiment 8

With an embodiment 8, there is cited a case where pitch relaxation of global bit lines is carried out in the so-called NAND flash memory, which is an example of stacked memory cells.

Figure 90:
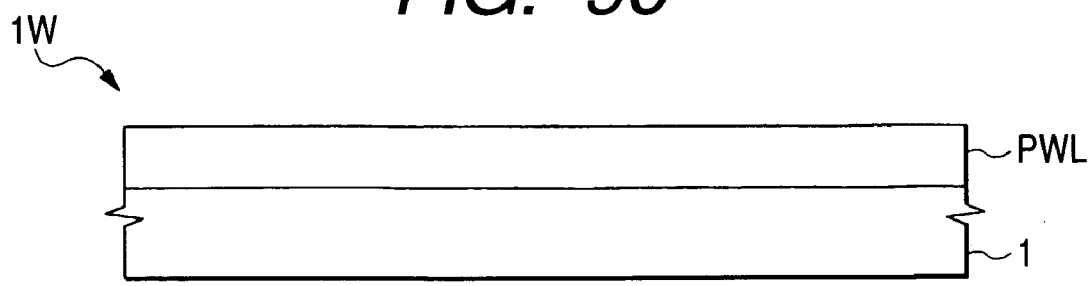
FIG. 90 is a sectional view of the principal part of a semiconductor device according to a further embodiment of the invention, in a step of a method of manufacturing the same.
Figure 91:
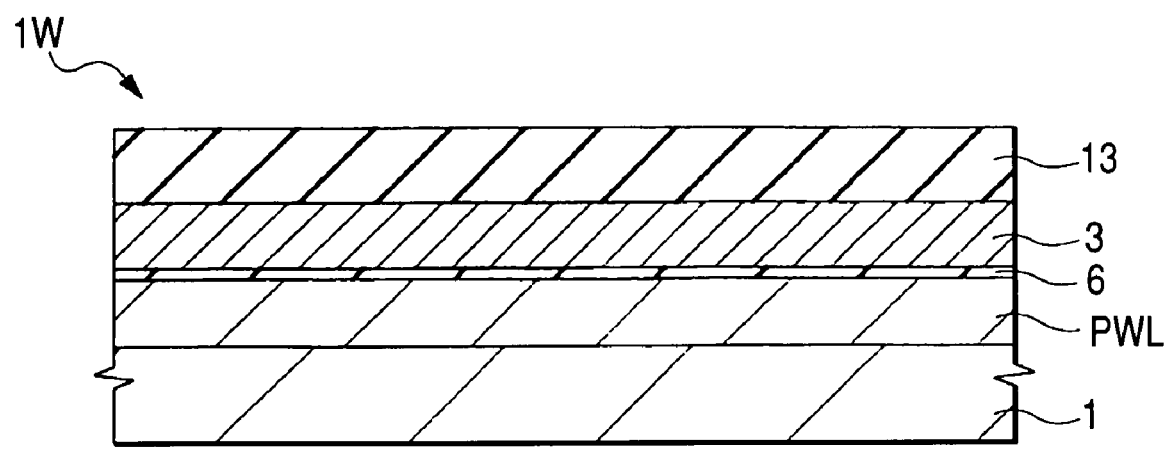
FIG. 91 is a sectional view of the principal part of the semiconductor, in a step of the method of manufacturing the same, subsequent to the step shown in FIG. 90.
Figure 92:
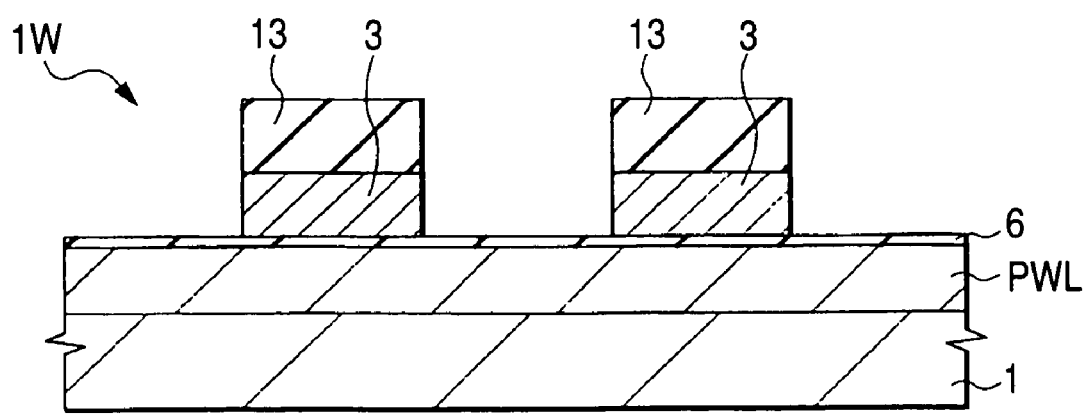
FIG. 92 is a sectional view of the principal part of the semiconductor, in a step of the method of manufacturing the same, subsequent to the step shown in FIG. 91.
Figure 93:
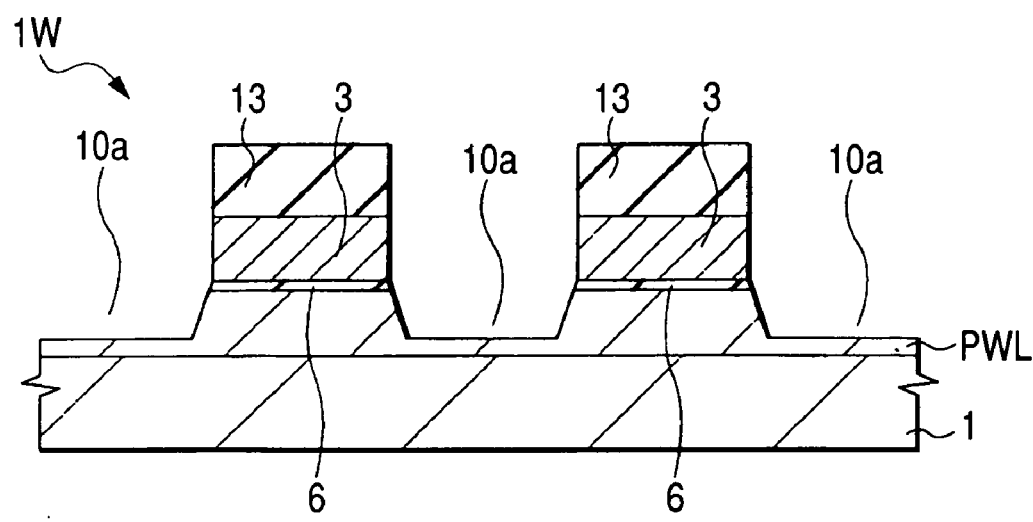
FIG. 93 is a sectional view of the principal part of the semiconductor, in a step of the method of manufacturing the same, subsequent to the step shown in FIG. 92.
Figure 94:
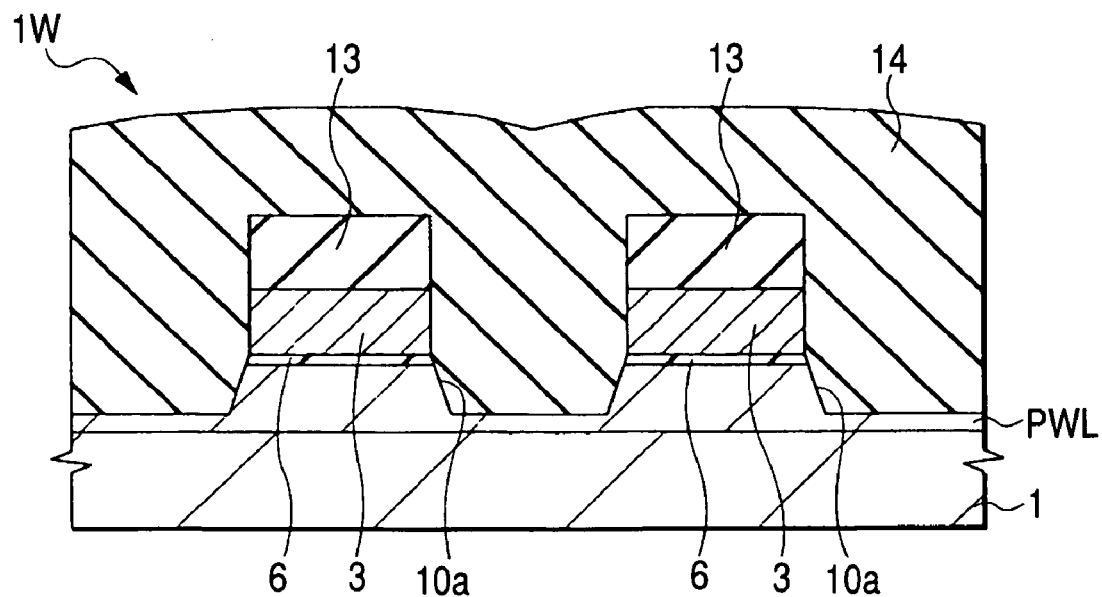
FIG. 94 is a sectional view of the principal part of the semiconductor, in a step of the method of manufacturing the same, subsequent to the step shown in FIG. 93.
Figure 95:
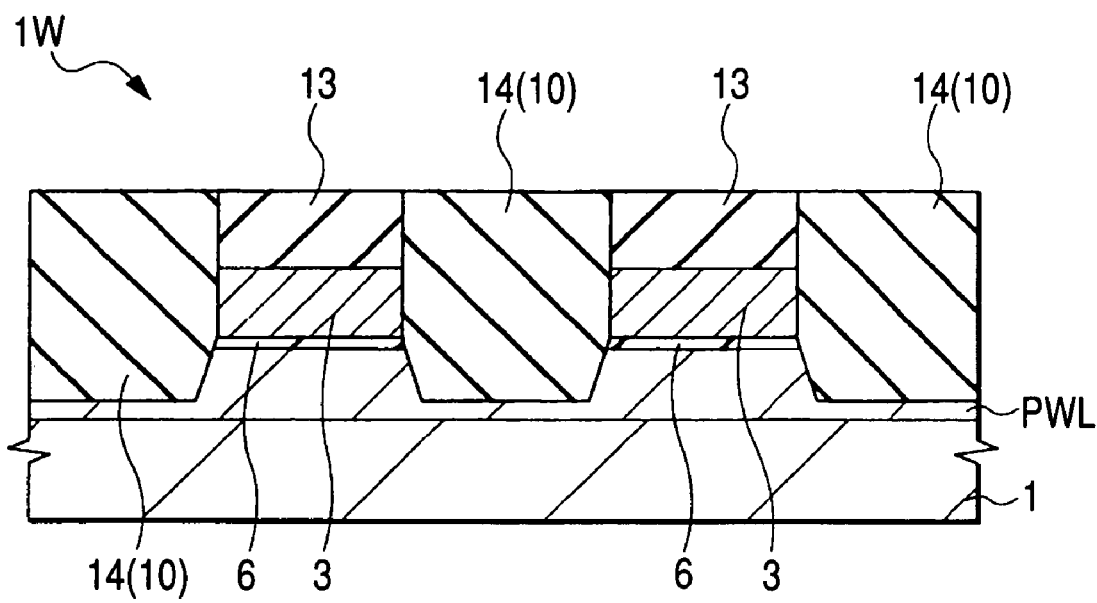
FIG. 95 is a sectional view of the principal part of the semiconductor, in a step of the method of manufacturing the same, subsequent to the step shown in FIG. 94.
Figure 96:
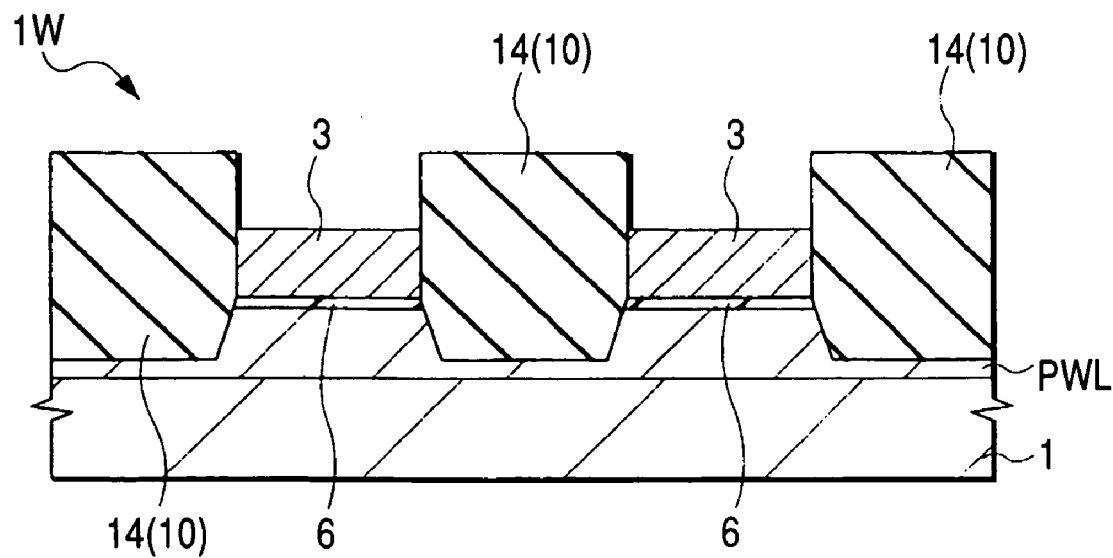
FIG. 96 is a sectional view of the principal part of the semiconductor, in a step of the method of manufacturing the same, subsequent to the step shown in FIG. 95.
Figure 97:
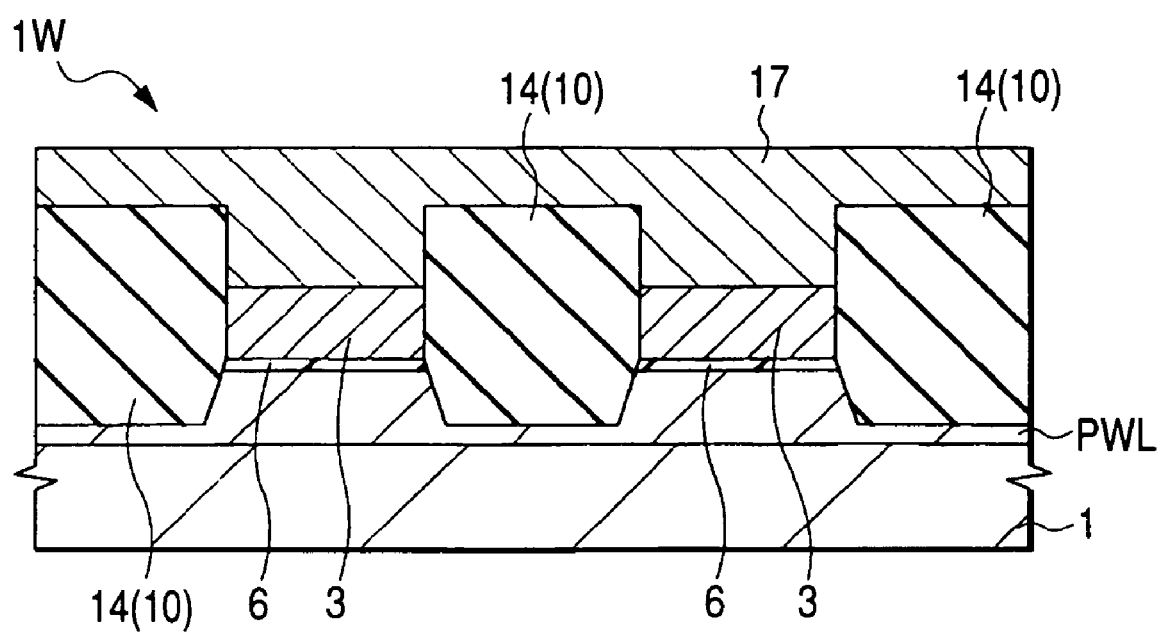
FIG. 97 is a sectional view of the principal part of the semiconductor, in a step of the method of manufacturing the same, subsequent to the step shown in FIG. 96.

FIGS. 90 through 97 are sectional views showing the principal part of a semiconductor device according to an embodiment 8 during respective steps of a method of manufacturing the semiconductor device. First, after forming a p-type well PWL in a substrate 1 as shown in FIG. 90, a gate insulator film 6 is formed on the top surface of the substrate 1 by, for example, the thermal oxidation method, and a conductor film 3 for forming floating gate electrodes and an insulator film 13 are sequentially deposited in that order on top of the gate insulator film 6 by the CVD method, and so forth as shown in FIG. 91. Subsequently, the insulator film 13 and the conductor film (sixth conductor film) 3 are patterned in the shape of stripes by lithographic and dry etching techniques as shown in FIG. 92. Patterns (third patterns) of the insulator film 13 and the conductor film 3, in the shape of the stripes, are extended into both a memory region and a peripheral circuit region. Thereafter, by etching the substrate 1 using the patterns of the insulator film 13 and the conductor film 3 as an etching mask, isolation grooves 10*a* are formed as shown in FIG. 93. Thereafter, an insulator film 14 made up of, for example, a silicon oxide film etc. is deposited on the top surface of the substrate 1 so as to completely full up respective spacing between the patterns in the shape of the stripes, adjacent to each other, as shown in FIG. 94. Subsequently, by removing an upper portion of the insulator film 14 by use of the etch back method or the chemical mechanical polishing method until the surface of the insulator film 13 is exposed, isolation parts 10 are formed of the insulator film 14 as shown in FIG. 95. Subsequently, after exposing the upper surface of the patterns of the conductor film 3 by removing the insulator film 13 by dry etching as shown in FIG. 96, an conductor film (seventh conductor film) 17 made up of, for example, a phosphorus (P) doped polysilicon film is deposited on the top surface of the substrate 1 by the CVD method as shown in FIG. 97.

Figure 98:
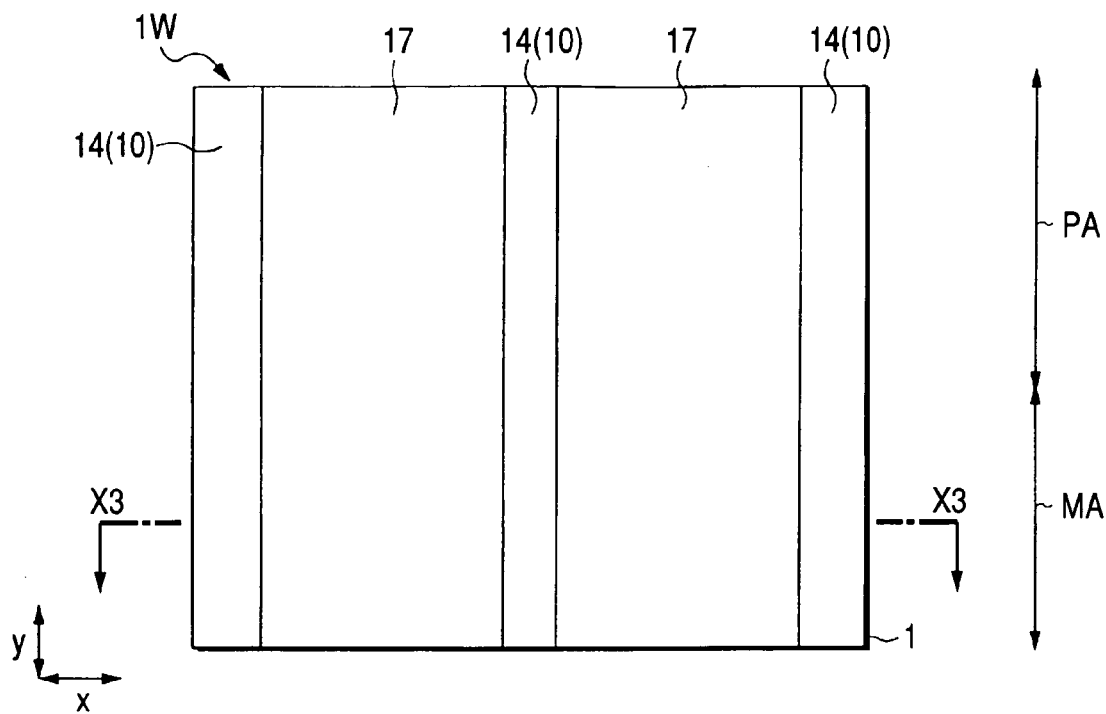
FIG. 98 is a plan view of a wafer in a step of the method of manufacturing the semiconductor device, subsequent to the step shown in FIG. 97.
Figure 99:
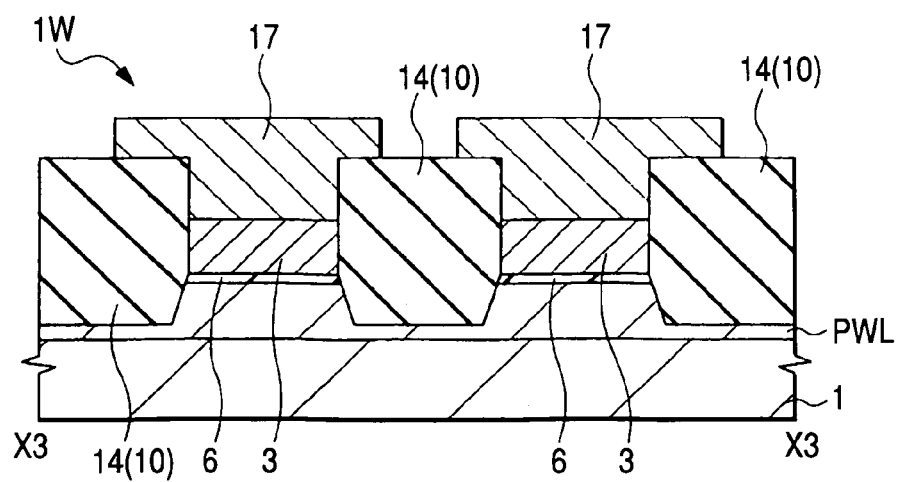
FIG. 99 is a sectional view taken on line X3—X3 in FIG. 98.

FIG. 98 is a plan view of a wafer 1W in a step of the method of manufacturing the semiconductor device, subsequent to the step shown in FIG. 97, showing the boundary between a memory region MA and a peripheral circuit region PA of the wafer 1W, and the surroundings thereof, and FIG. 99 is a sectional view taken on line X3—X3 of FIG. 98. Further, FIG. 100 is a plan view of the wafer 1W in a step of the method of manufacturing the semiconductor device, subsequent to the step shown in FIG. 98, showing the boundary between the memory region MA and the peripheral circuit region PA of the wafer 1W, and the surroundings thereof, and FIG. 101 is a sectional view taken on line X3—X3 of FIG. 100.

First, as shown in FIGS. 98 and 99, the conductor film 17 is patterned in the shape of stripes parallel with the patterns of the conductor film 3, in the shape of stripes, by use of lithographic and dry etching techniques. Respective patterns (fourth patterns) of the conductor film 17 are in contact, and electrically continuous with the respective conductor film 3 through a gap between the isolation parts 10, 10, adjacent to each other. The respective patterns of the conductor film 17 are larger in width than the respective patterns of the conductor film 3. A stacked film made up of the conductor films 3, 17 becomes a floating gate electrode of each of nonvolatile memory cells. Subsequently, as shown in FIGS. 100 and 101, after depositing an insulator film 8 for use as an interpoly dielectric film for providing insulation between the respective floating gate electrodes and respective control gate electrodes by the GVD method etc., a conductor film (eighth conductor film) 4 made up of the polymetal film for forming the control gate electrodes is further deposited by, for example, the CVD method or the sputtering method, or by proper use of either of these methods to suit the purpose.

Figure 100:
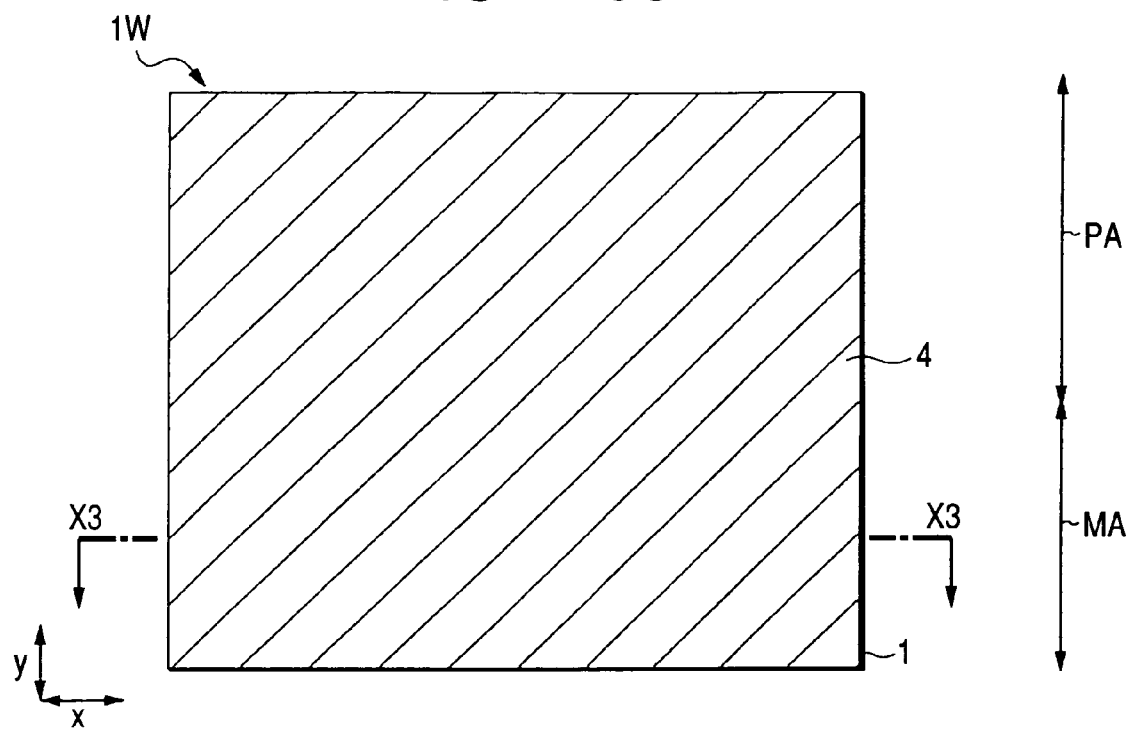
FIG. 100 is a plan view of the wafer in a step of the method of manufacturing the semiconductor device, subsequent to the step shown in FIG. 98.
Figure 101:
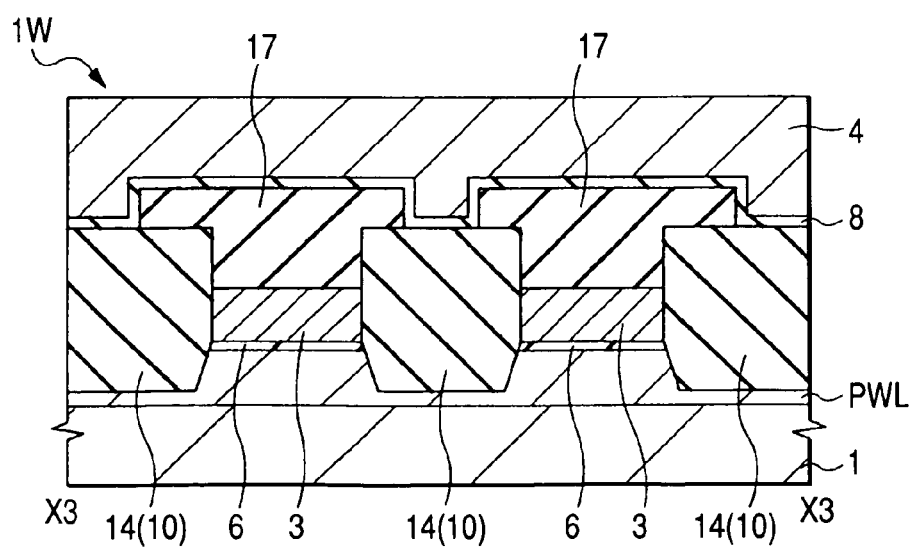
FIG. 101 is a sectional view taken on line X3—X3 in FIG. 100.
Figure 102:
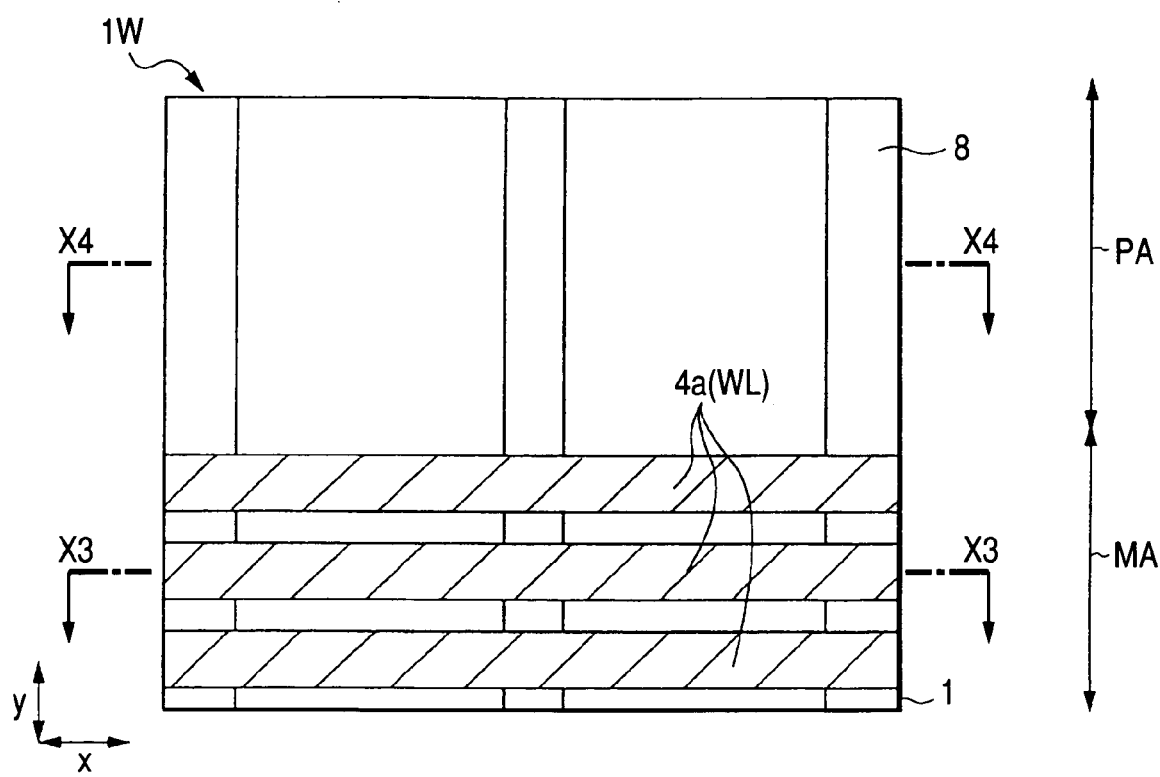
FIG. 102 is a plan view of the wafer in a step of the method of manufacturing the semiconductor device, subsequent to the step shown in FIG. 100.
Figure 103:
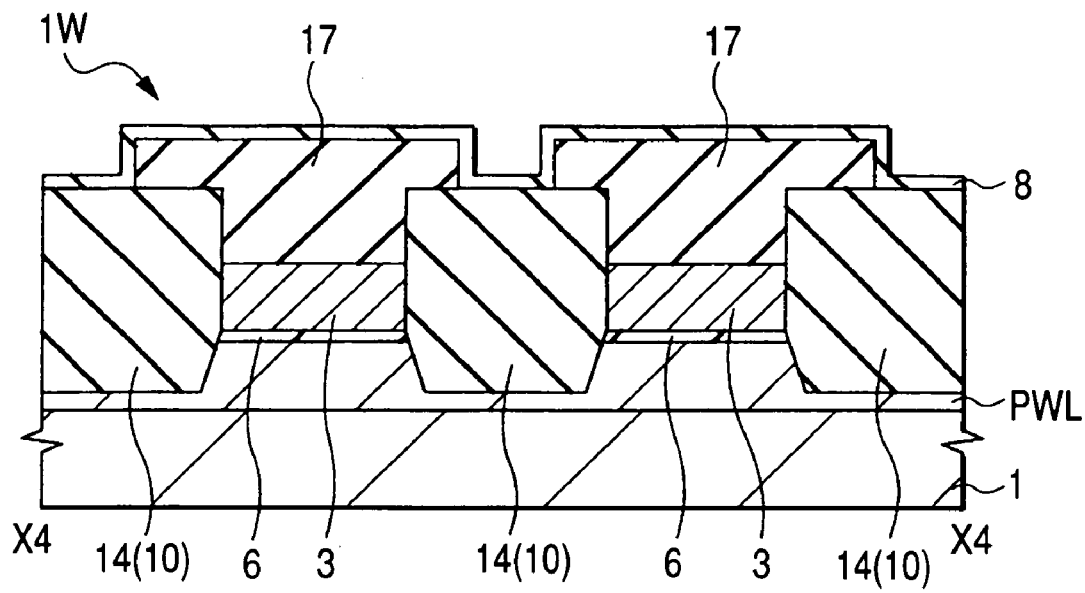
FIG. 103 is a sectional view taken on line X4—X4 in FIG. 102.
Figure 104:
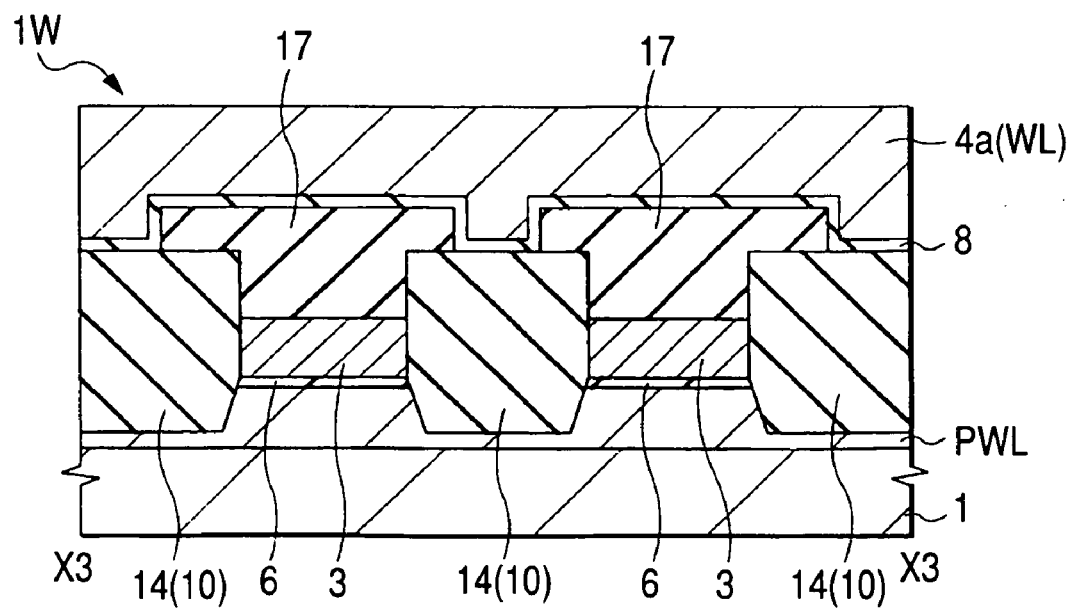
FIG. 104 is a sectional view taken on line X3—X3 in FIG. 102.
Figure 105:
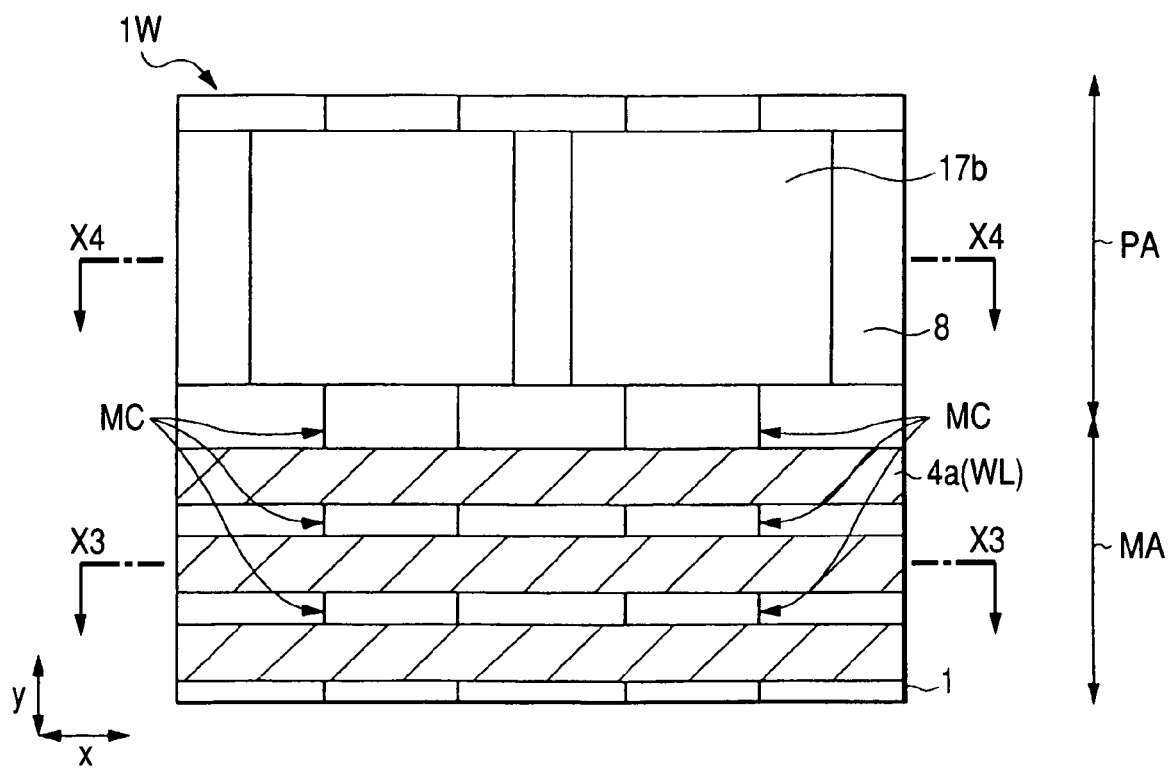
FIG. 105 is a plan view of the wafer in a step of the method of manufacturing the semiconductor device, subsequent to the step shown in FIG. 102.
Figure 106:
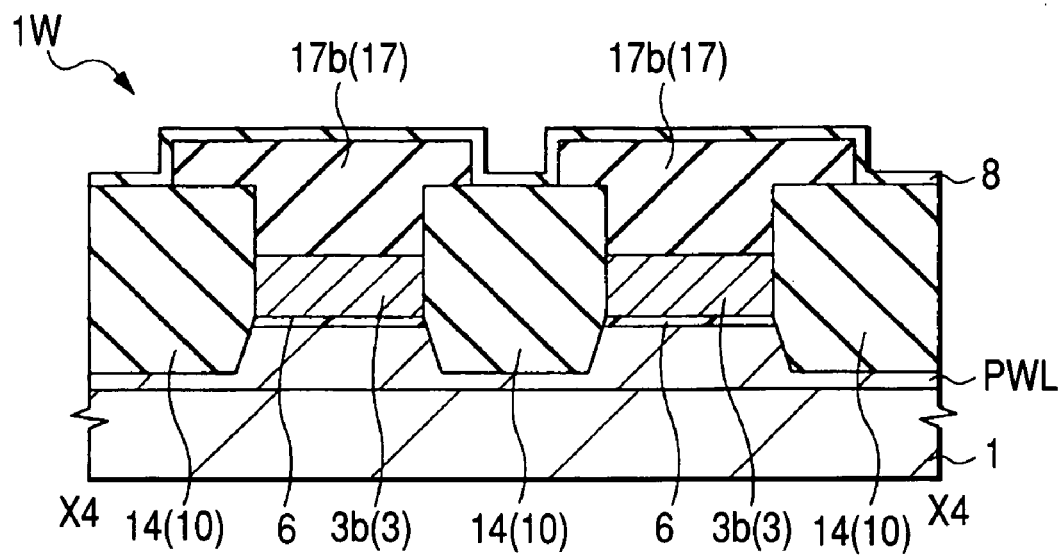
FIG. 106 is a sectional view taken on line X4—X4 in FIG. 105.
Figure 107:
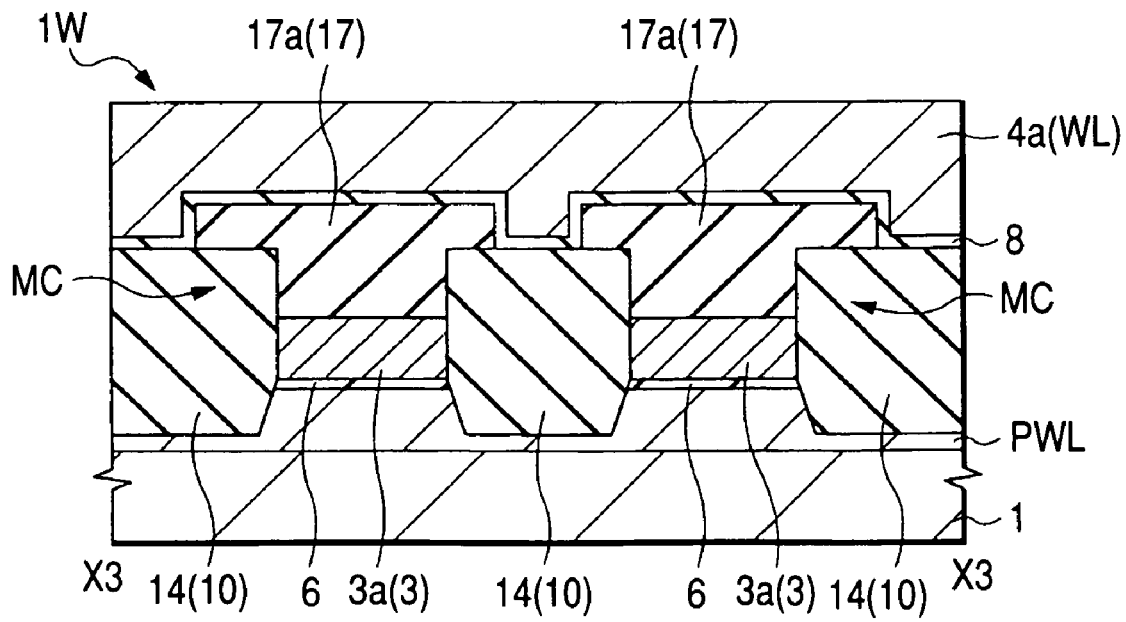
FIG. 107 is a sectional view taken on line X3—X3 in FIG. 105.
Figure 108:
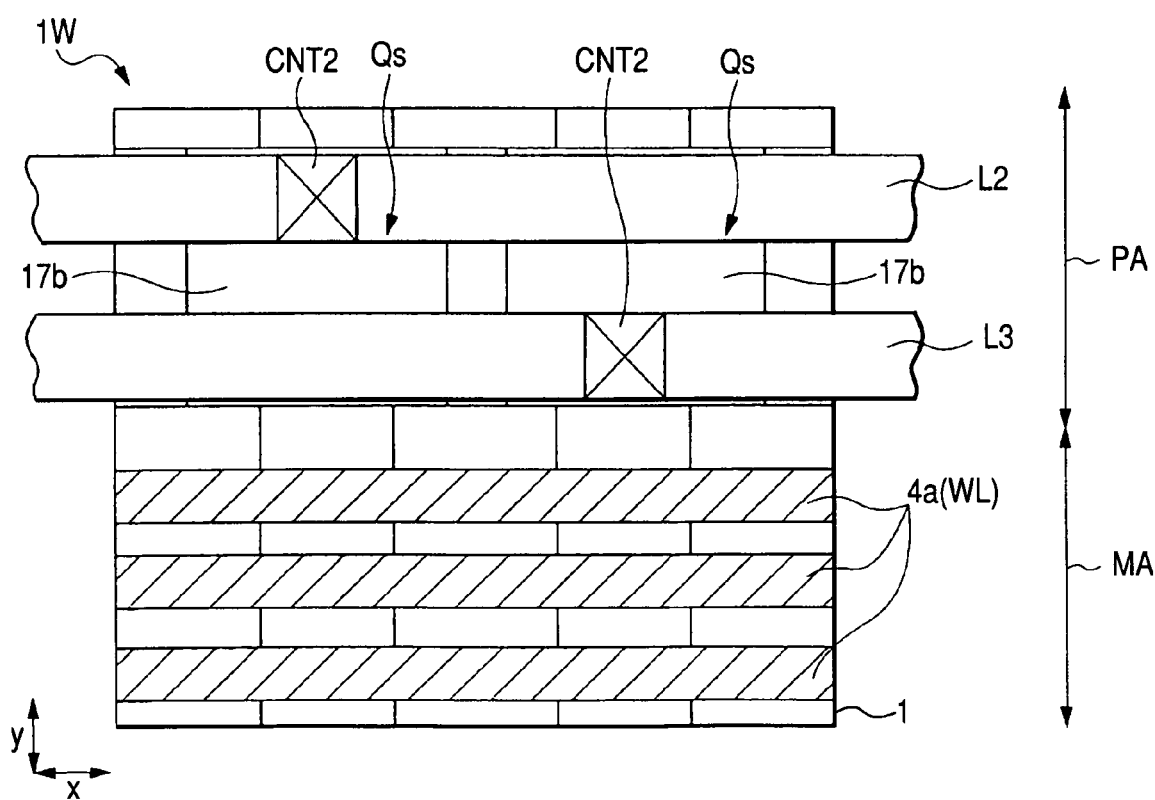
FIG. 108 is a plan view of the wafer in a step of the method of manufacturing the semiconductor device, subsequent to the step shown in FIG. 105.

FIG. 102 is a plan view of the wafer 1W in a step of the method of manufacturing the semiconductor device, subsequent to the step shown in FIG. 100, showing the boundary between the memory region MA and the peripheral circuit region PA of the wafer 1W, and the surroundings thereof, and FIGS. 103, and 104 are sectional views taken on lines X4—X4 and X3—X3 of FIG. 102, respectively. Further, FIG. 105 is a plan view of the wafer 1W in a step of the method of manufacturing the semiconductor device, subsequent to the step shown in FIG. 102, showing the boundary between the memory region MA and the peripheral circuit region PA of the wafer 1W, and the surroundings thereof, and FIGS. 106, and 107 are sectional views taken on lines X4—X4 and X3—X3 of FIG. 105, respectively. Still further, FIG. 108 is a plan view of the wafer 1W in a step of the method of manufacturing the semiconductor device, subsequent to the step shown in FIG. 105, showing the boundary between the memory region MA and the peripheral circuit region PA of the wafer 1W.

First, by patterning the conductor film 4 by use of lithographic and dry etching techniques, band-like patterns of second gate electrode 4*a*, extending in the x-direction in FIG. 102, that is, word lines WL, are formed as shown in FIGS. 102 through 104. At this point in time, the conductor film 4 in a select nMIS forming region is removed. Subsequently, a resist pattern (third masking pattern) in the shape of patterns parallel with the word line WL is formed in the select nMIS forming region, thereby covering gate portions in the select nMIS forming region. Thereafter, by etching away portions of the insulator film 8 and the conductor films 17, 3, exposed out of the resist pattern as well as the patterns of the second gate electrodes 4a, there are formed first gate electrodes 17a, 3a, thereby completing memory cells MC. There are also formed gate electrodes 17b, 3b of each of select nMISes Qs. In this stage, the gate electrodes 17b, 3b, of the select nMISes Qs are individually separated from each other. With the NAND flash memory as well, pitch relaxation of global bit lines can be carried out as with the case of the embodiment 7, however, with the techniques examined by the inventor, there arises a problem in that the number of the select nMISes Qs increases, resulting in an increase in the area thereof. As shown in FIG. 108, by forming wiring layers L2, L3, formed of a metal layer, on top of contact holes CNT2 reaching the gate electrodes 17b, 3b, of the select nMISes Qs, respectively, it becomes possible to form two of the select nMISes Qs within an area corresponding to one of the select nMISes.

Embodiment 9

With the embodiment 7, the contact holes reaching the respective gate electrodes of the select nMISes separated from each other are formed, and every other one of the gate electrodes is connected to separate metal wires, respectively, thereby accommodating two of the select nMISes within the area for just one of the select nMISes. With an embodiment 9, second gate electrodes (control gate electrodes, that is, word lines) are used for wiring to respective gate electrodes of select nMISes.

Figure 109:
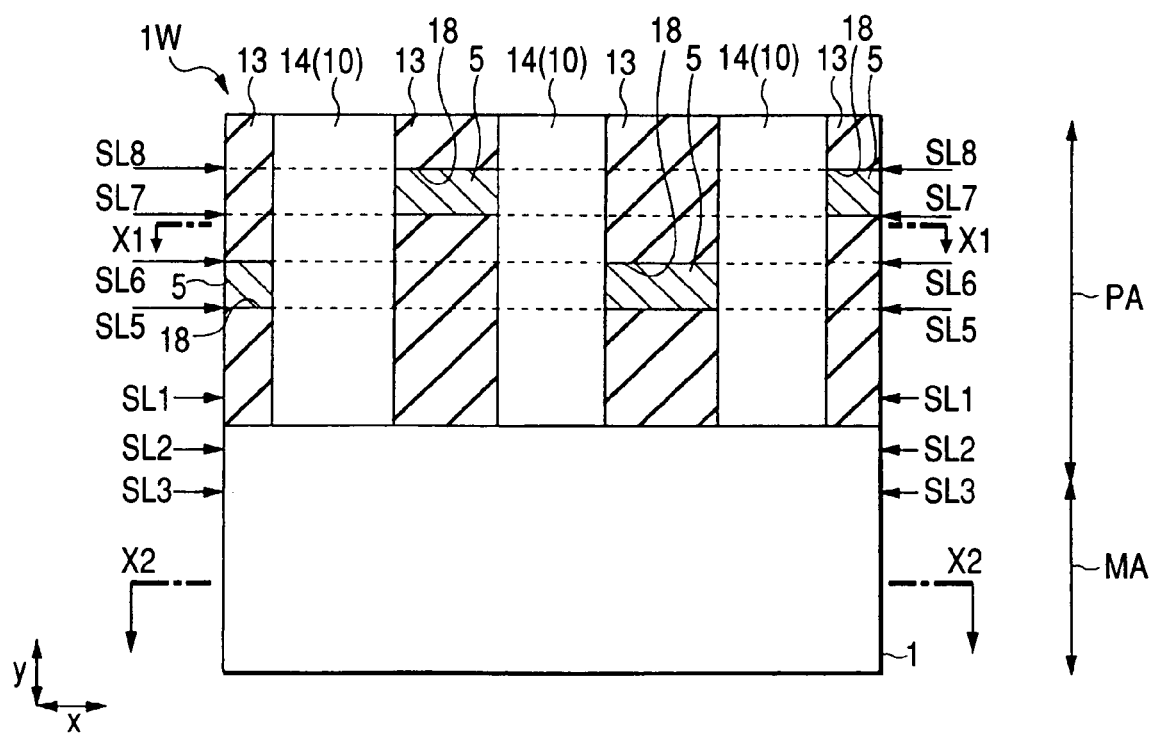
FIG. 109 is a plan view of the principal part of a wafer, in a step of a method of manufacturing a semiconductor device according to a still further embodiment of the invention.
Figure 110:
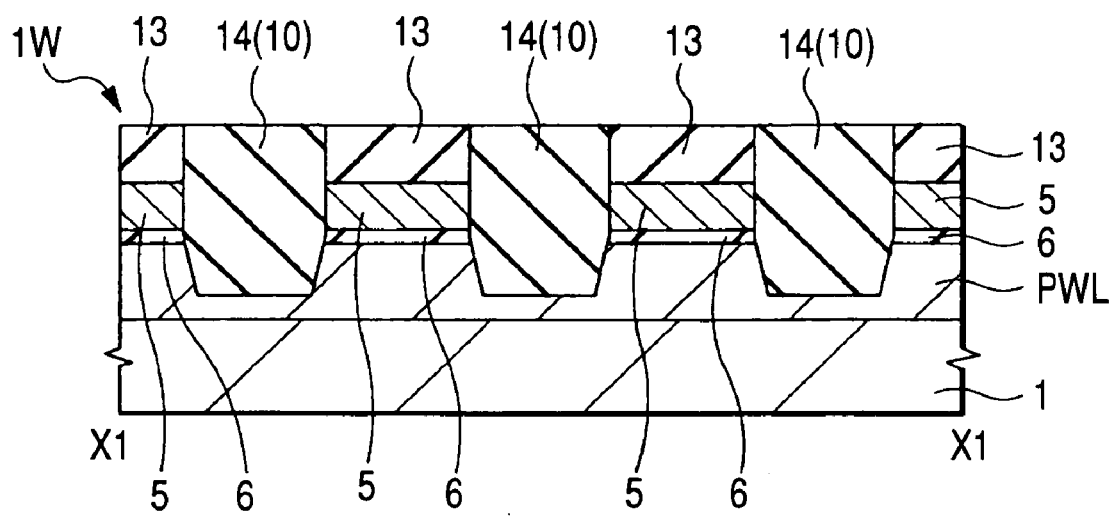
FIG. 110 is a sectional view taken on line X1—X1 in FIG. 109.
Figure 111:
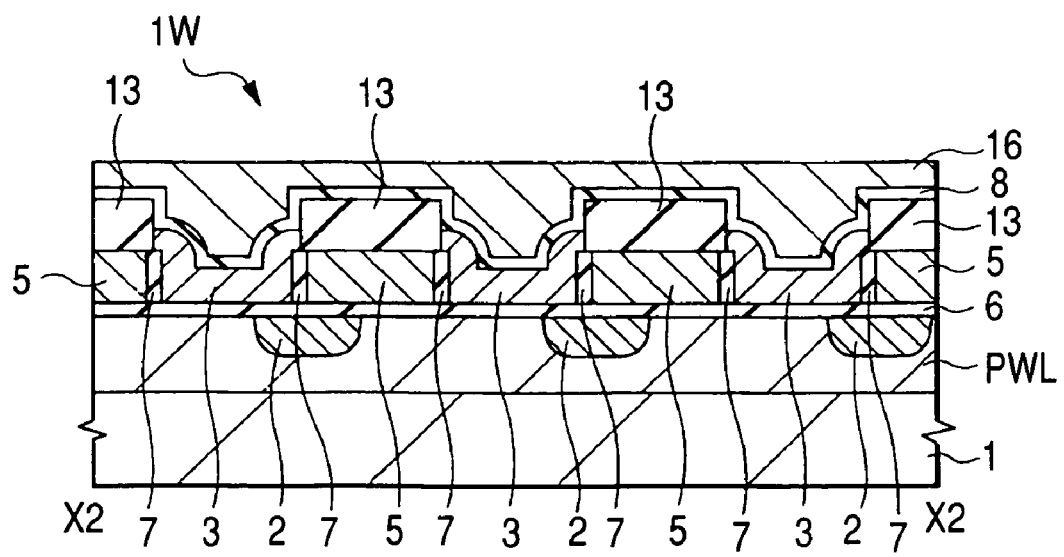
FIG. 111 is a sectional view taken on line X2—X2 in FIG. 109.
Figure 112:
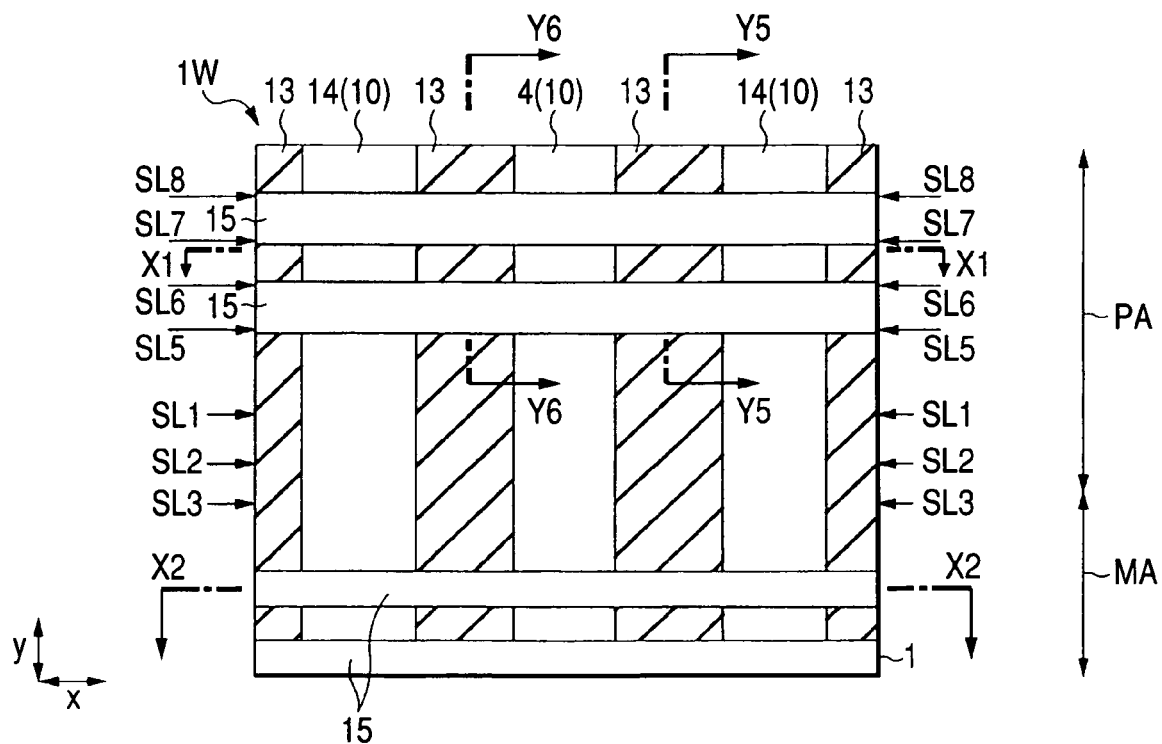
FIG. 112 is a plan view of the wafer in a step of the method of manufacturing the semiconductor device, subsequent to the step shown in FIG. 108.
Figure 113:
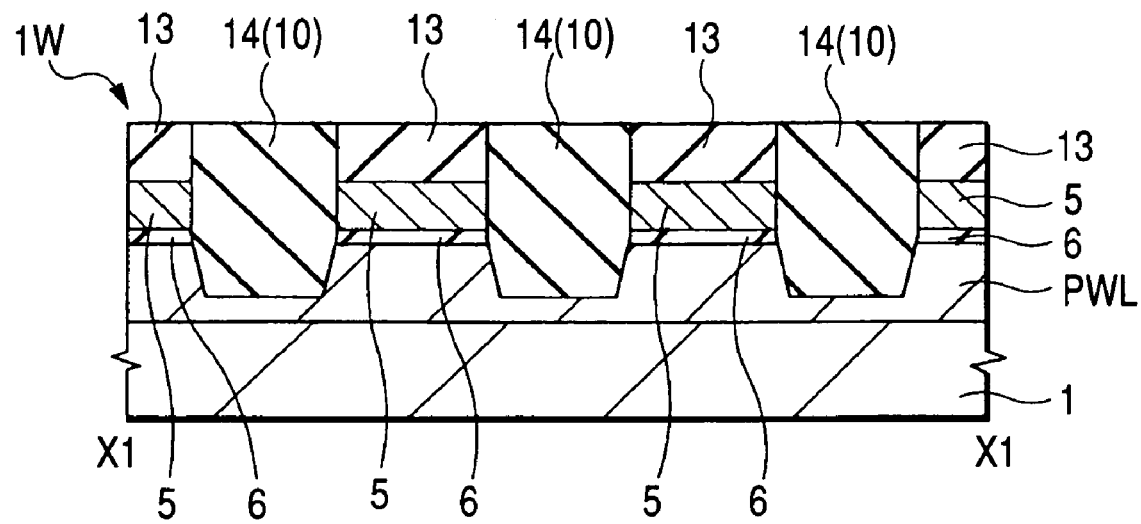
FIG. 113 is a sectional view taken on line X1—X1 in FIG. 112.
Figure 114:
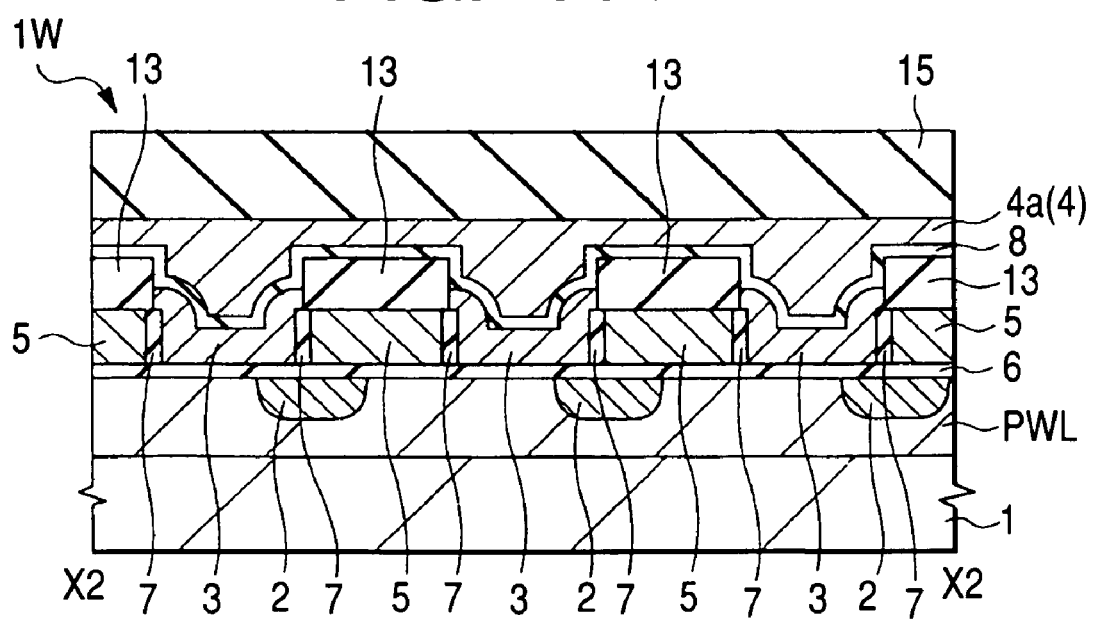
FIG. 114 is a sectional view taken on line X2—X2 in FIG. 112.
Figure 115:
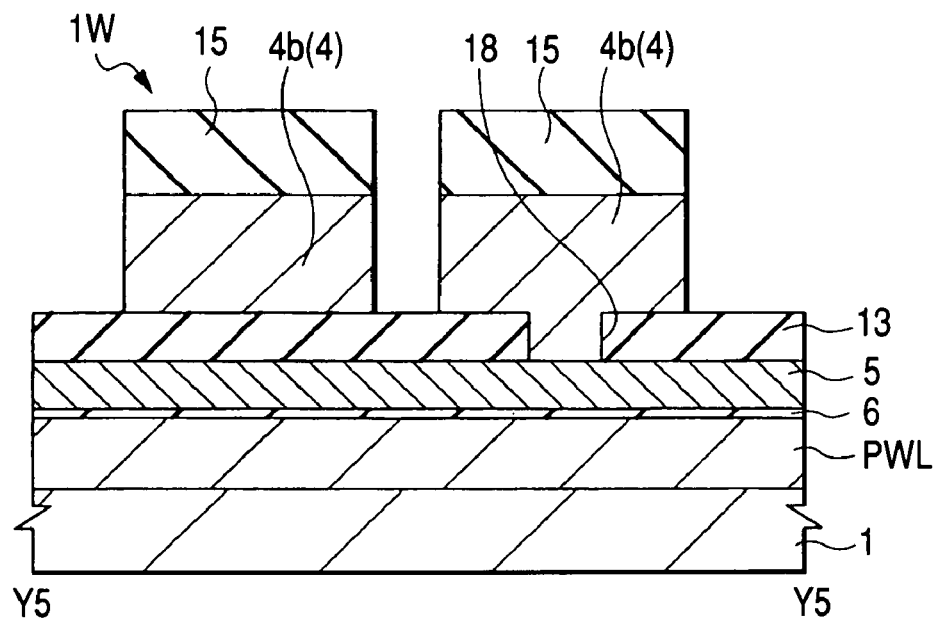
FIG. 115 is a sectional view taken on line Y5—Y5 in FIG. 112.
Figure 116:
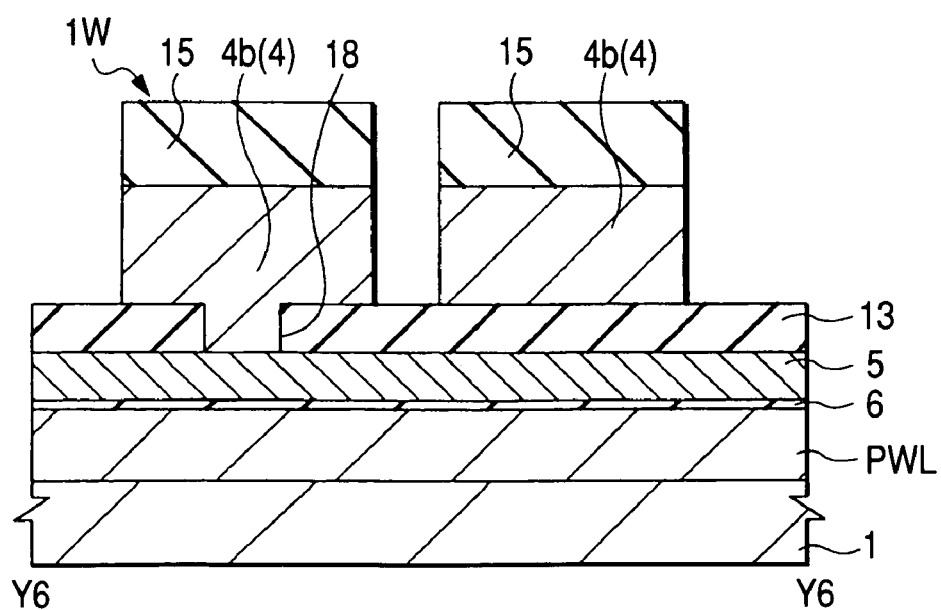
FIG. 116 is a sectional view taken on line Y6—Y6 in FIG. 112.
Figure 117:
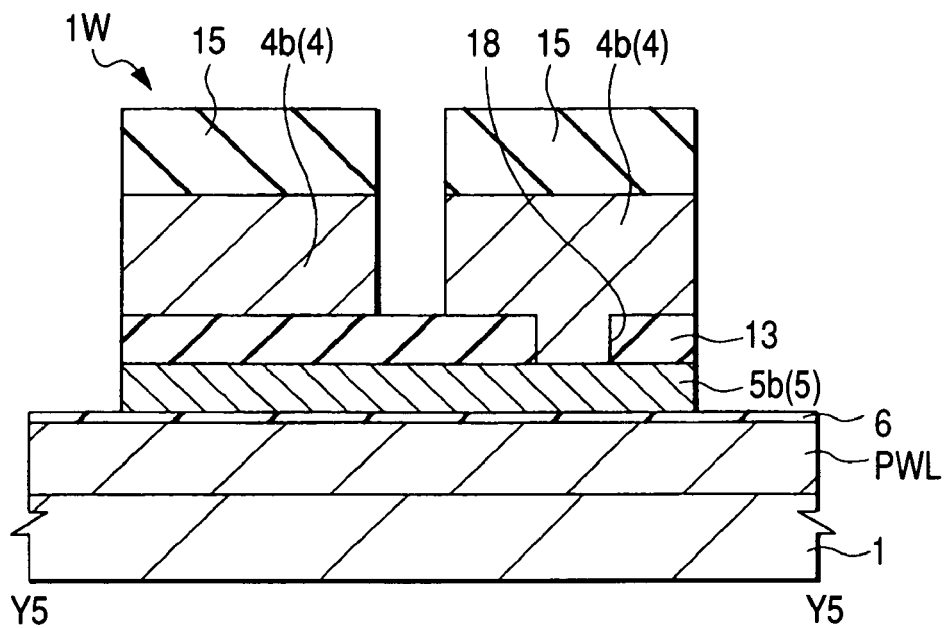
FIG. 117 is a sectional view of the wafer, taken on line Y5—Y5 in FIG. 112, in a step of the method of manufacturing the semiconductor device, subsequent to the step shown in FIG. 112.
Figure 118:
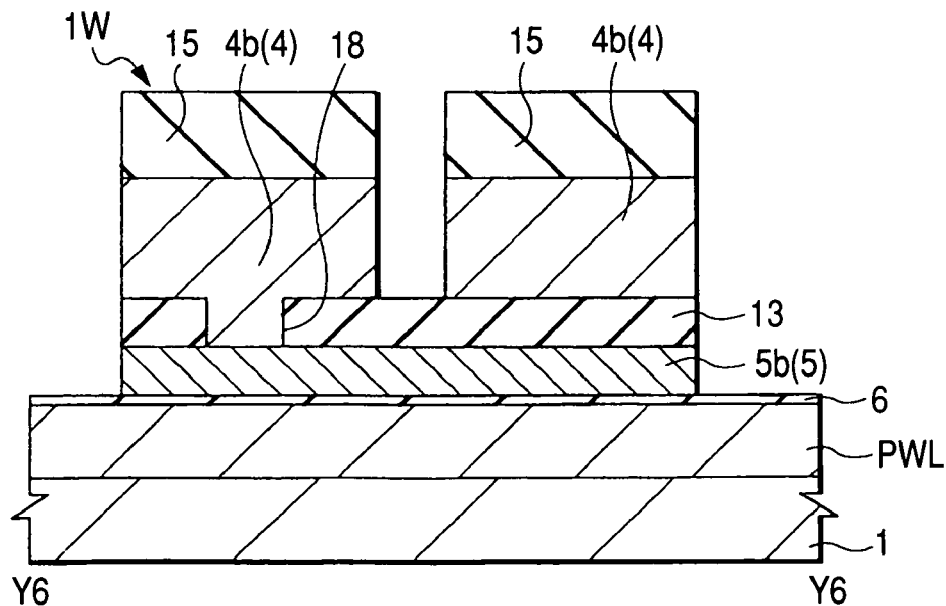
FIG. 118 is a sectional view of the wafer, taken on line Y6—Y6, in FIG. 112, in a step of the method of manufacturing the semiconductor device, subsequent to the step shown in FIG. 112.

FIG. 109 is a plan view of a wafer 1W in a step of the method of manufacturing a semiconductor device according to the embodiment 9, showing the boundary between a memory region MA and a peripheral circuit region PA of the wafer 1W, and the surroundings thereof, and FIGS. 110, and 111 are sectional views taken on lines X1—X1 and X2—X2 of FIG. 109, respectively. Further, FIG. 112 is a plan view of the wafer 1W in a step of the method of manufacturing the semiconductor device, subsequent to the step shown in FIG. 109, showing the boundary between the memory region MA and the peripheral circuit region PA of the wafer 1W, and the surroundings thereof, and FIGS. 113, and 114 are sectional views taken on lines X1—X1 and X2—X2 of FIG. 112, respectively. FIGS. 115, and 116 are sectional views taken on lines Y5—Y5, and Y6—Y6 of FIG. 112, respectively. Furthermore, FIGS. 117, and 118 are sectional views of the wafer 1W in a step of the method of manufacturing the semiconductor device, subsequent to the step shown in FIG. 112, taken on lines Y5—Y5, and Y6—Y6 of FIG. 112, respectively.

First, as shown in FIGS. 109 through 111, after the step of the embodiment 2, shown in FIGS. 55 through 57, a conductor film 16 in a select nMIS forming region is removed, and subsequently, portions of an insulator film 13 are removed by the common lithographic and dry etching techniques, thereby defining openings 18 exposing portions of a conductor film 5 underlying the insulator film 13, respectively. If dry etching techniques is employed on condition that an insulator film 14 is not removed, patterning can be performed using a resist mask in the shape of stripe-like pattern extending in the x-direction in FIG. 109. A layout at this point in time is adopted such that every other one of the exposed portions of the conductor film 5, across stripe-like patterns of the insulator film 13 and the conductor film 5, adjacent to each other, is staggered in the y-direction. Respective boundaries of the exposed portions are denoted by boundary lines SL5, SL6, SL7, and SL8, respectively, and between the boundary lines SL6, SL7, a region is provided where the exposed portions of the conductor film 5 do not exist on any of the stripe-like patterns of the insulator film 13 and the conductor film 5.

Subsequently, as shown in FIGS. 112 through 116, after depositing a conductor film 4, which is material for word lines, an insulator film 15 is deposited on top of the conductor film 4. Thereafter, the insulator film 15 and the conductor film 4 are patterned by use of lithographic and dry etching techniques. By so doing, second gate electrodes 4a (refer to FIGS. 1 through 4 etc.) are formed in a memory region MA and patterns of gate wiring layers 4b are formed in a peripheral circuit region PA. At this point in time, two band-like patterns of the gate wiring layers 4b and the insulator film 15, in the peripheral circuit region PA, are formed so as to completely cover a region sandwiched between the boundary lines SL7, SL8 and a region sandwiched between the boundary lines SL5, SL6 such that there exists spacing between the respective band-like patterns of the insulator film 15. Further, the gate wiring layers 4b are in contact with the conductor film 5 through the respective openings 18 to be electrically connected therewith. Thereafter, an insulator film 8 for use as an interpoly dielectric film and first gate electrodes 3a (refer to FIGS. 1 through 4 etc.) are sequentially etched in that order in the memory region MA to thereby complete respective nonvolatile memory cells MC.

Subsequently, after covering the memory region MA in whole and respective gaps between the patterns of the insulator films 13 and the gate wiring layers 4b, adjacent to each other, with a resist, portions of the insulator films 13 and the insulator film 5, exposed out of the resist, are sequentially etched away. As a result, third gate electrodes 5a are formed in the memory region MA while respective gate electrodes 5b (5) of select transistors are formed in the peripheral circuit region PA as shown in FIGS. 117 and 118. The select nMISes (refer to FIGS. 1 through 4 etc.) are formed by forming diffusion layers for use as a source and a drain, respectively, for the respective select nMISes through implantation of channel ions, and after forming an interpoly dielectric film (not shown), there are formed contact holes reaching word lines WL, a well PWL, the third gate electrodes 5a, the respective gate wiring layers 4b for the select nMISes Qs, and the diffusion layer of each of the select nMISes Qs, on the side thereof, opposite from the memory cells MC, respectively, Subsequently, a metal film is deposited to be patterned into wiring layers, thereby completing memory cells MC.

With a semiconductor device according to the embodiment 9, even in the case of implementing pitch relaxation of global bit lines, it is possible to eliminate an increase in area occupied by the select nMISes Qs.

Embodiment 10

With the embodiment 8, the contact holes reaching the respective gate electrodes of the select nMISes separated from each other are formed, and every other one of the contact holes is connected to separate metal wires, respectively, thereby accommodating two of the select nMISes within the area for just one of the select nMISes. With an embodiment 10, material for control gate electrodes (second gate electrodes) is used for wiring to respective gate electrodes of select transistors.

Figure 119:
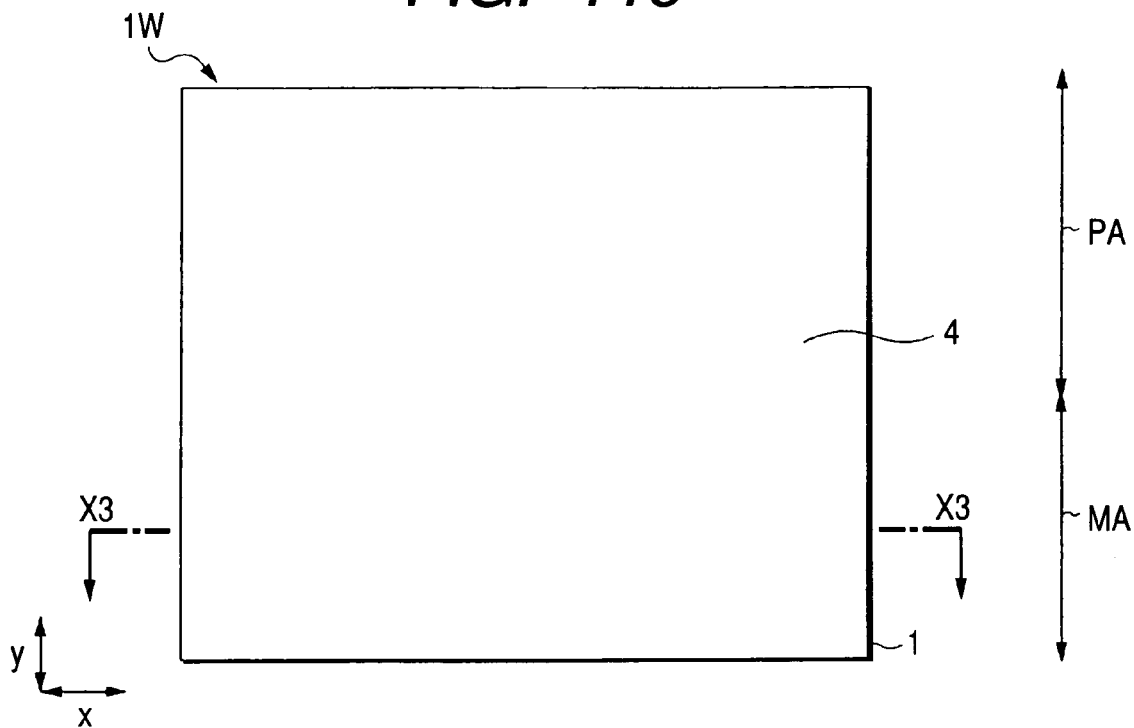
FIG. 119 is a plan view of the principal part of a wafer, in a step of a method of manufacturing a semiconductor device according to another embodiment of the invention.
Figure 120:
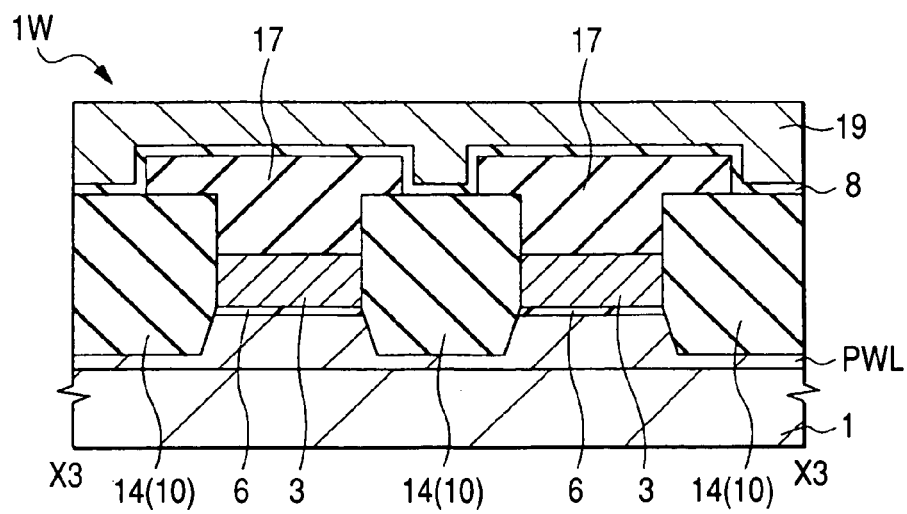
FIG. 120 is a sectional view taken on line X3—X3 of FIG. 119.
Figure 121:
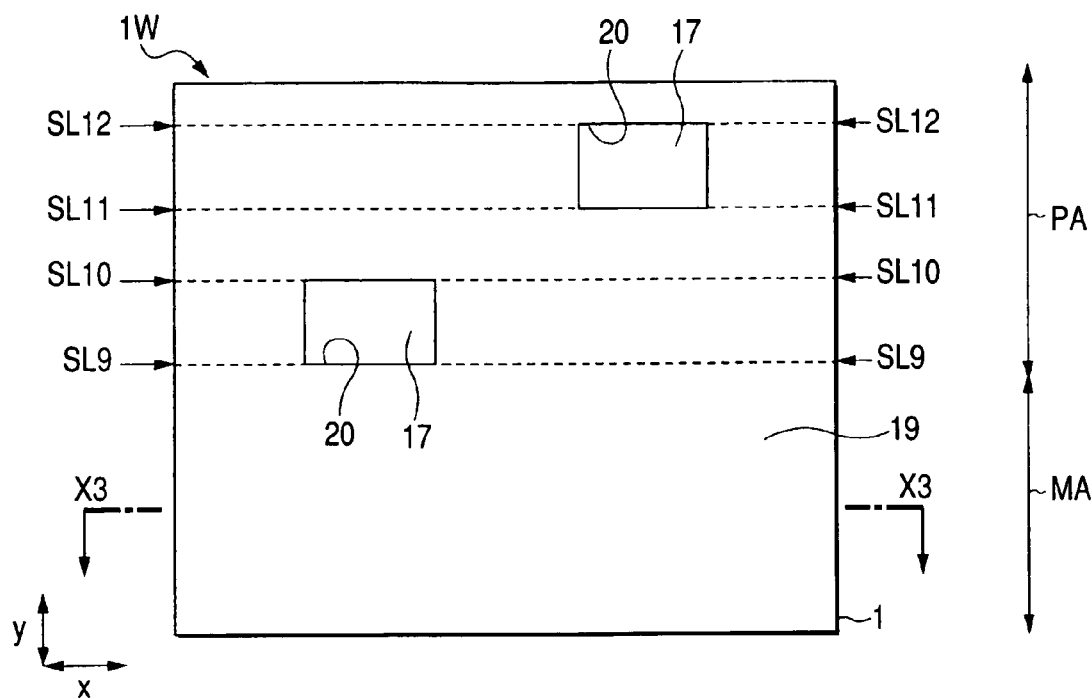
FIG. 121 is a plan view of the wafer in a step of the method of manufacturing the semiconductor device, subsequent to the step shown in FIG. 119.
Figure 122:
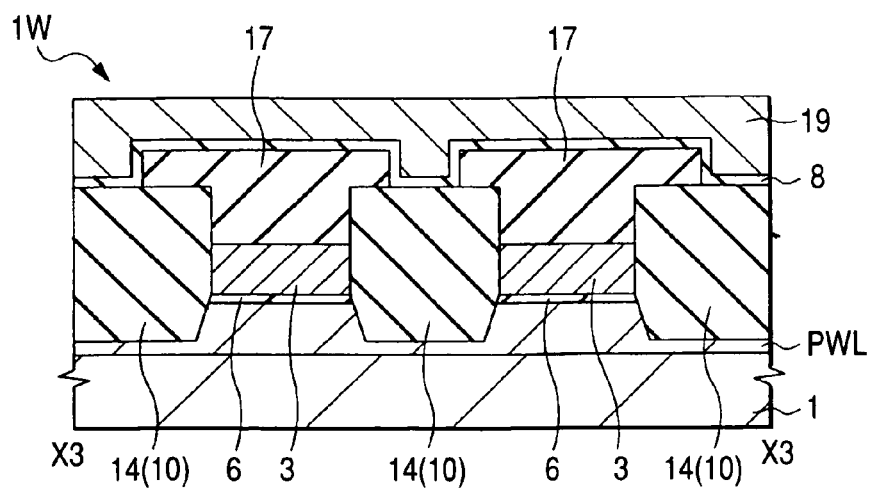
FIG. 122 is a sectional view taken on line X3—X3 in FIG. 121.
Figure 124:
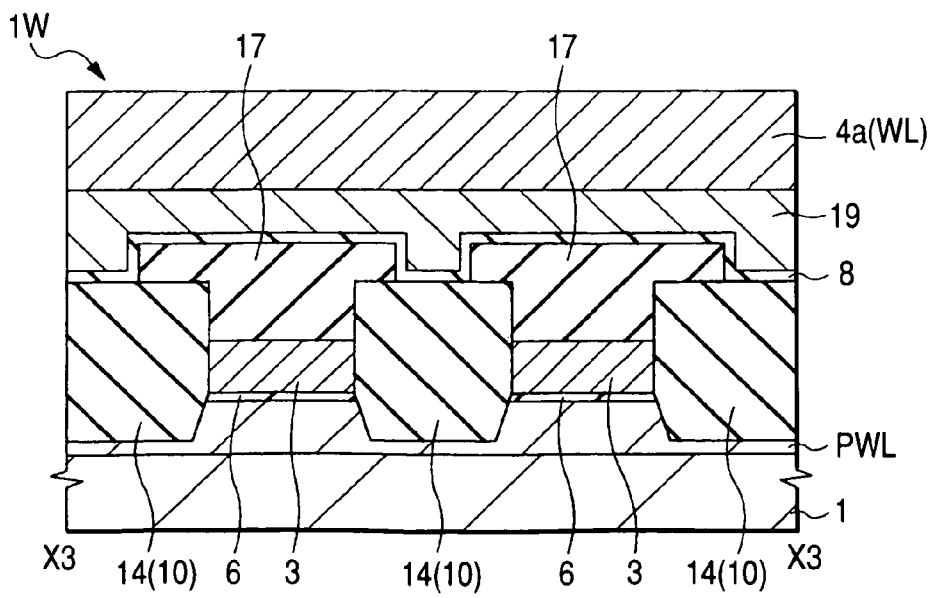
FIG. 124 is a sectional view taken on line X3—X3 in FIG. 123.
Figure 125:
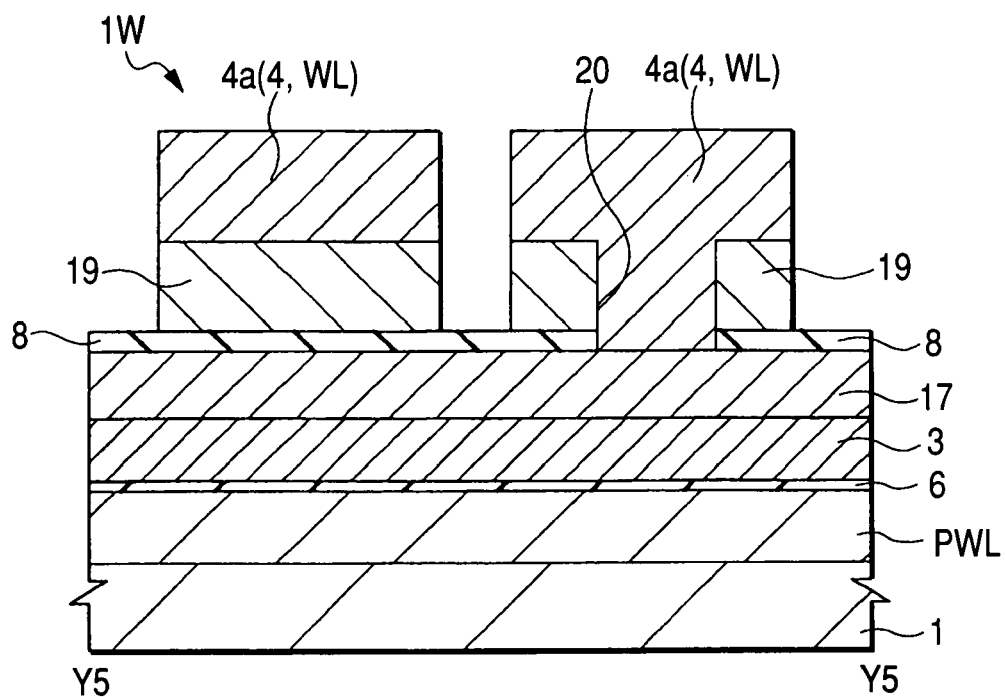
FIG. 125 is a sectional view taken on line Y5—Y5 in FIG. 123.
Figure 126:
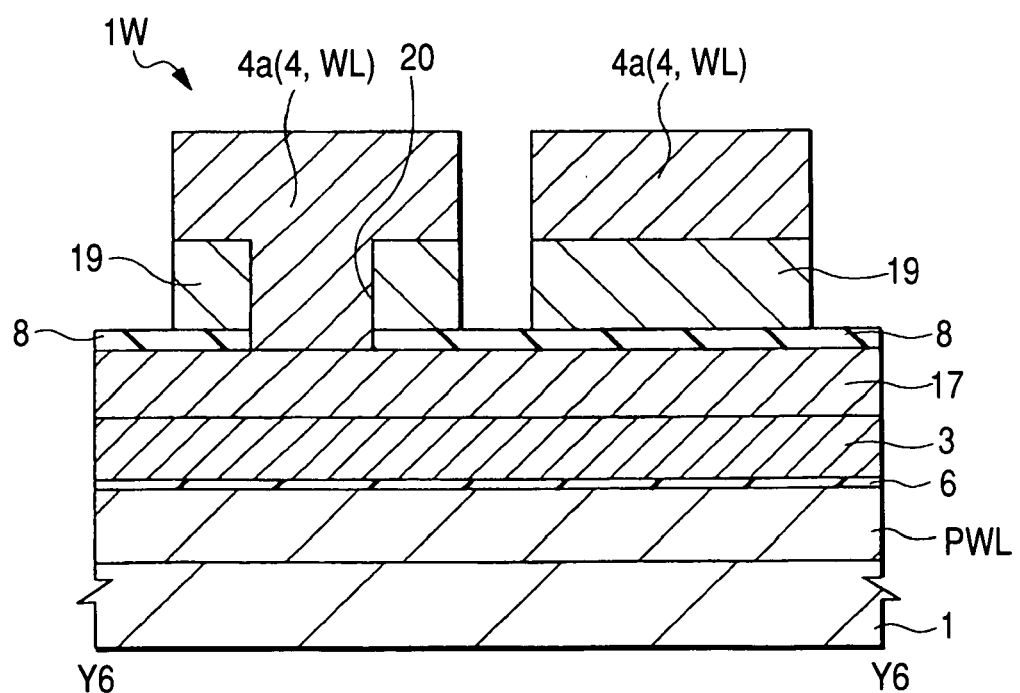

FIG. 119 is a plan view of a wafer 1W in a step of a method of manufacturing a semiconductor device according to the present embodiment, showing the boundary between a memory region MA and a peripheral circuit region PA of the wafer 1W, and the surroundings thereof, and FIG. 120 is a sectional view taken on line X3—X3 of FIG. 119. Further, FIG. 121 is a plan view of the wafer 1W in a step of the method of manufacturing the semiconductor device, subsequent to the step shown in FIG. 119, showing the boundary between the memory region MA and the peripheral circuit region PA of the wafer 1W, and FIG. 122 is a sectional view taken on line X3—X3 of FIG. 121. Furthermore, FIG. 123 is a plan view of the wafer 1W in a step of the method of manufacturing the semiconductor device, subsequent to the step shown in FIG. 121, showing the boundary between the memory region MA and the peripheral circuit region PA of the wafer 1W, and FIG. 124 is a sectional view taken on line X3—X3 of FIG. 123, FIGS. 125, 126 being sectional views taken on lines Y5—Y5 and Y6—Y6 of FIG. 123, respectively.

First, as shown in FIGS. 119 and 120, following the step of the embodiment 8 described with reference to FIGS. 98 and 99, after depositing an insulator film 8 for use as an interpoly dielectric film between respective first gate electrodes and second gate electrodes on the top surface of a substrate 1, a conductor film (ninth conductor film) 19 made up of, for example, a polysilicon film with low resistance is deposited on top of the insulator film 8. Subsequently, the conductor film 19 and the insulator film 8 are patterned by use of lithographic and dry etching techniques as shown in FIGS. 121 and 122. More specifically, by removing portions of the conductor film 19 and the insulator film 8 in the peripheral circuit region PA, openings 20 each exposing a portion of the conductor film 17 are formed. Thereafter, a conductor film (tenth conductor film) 4 is deposited on the top surface of the substrate 1, and subsequently, the conductor film 4 is patterned by use of lithographic and dry etching techniques as shown in FIGS. 123 through 126. More specifically, a second gate electrodes 4a (that is, a word line WL) is formed in the memory region MA, and gate wiring layers 4b are formed in the peripheral circuit region PA. At this point in time, two band-like patterns of the gate wiring layers 4b in the peripheral circuit region PA are formed so as to completely cover a region sandwiched between boundary lines SL9, SL10 and a region sandwiched between boundary lines SL11, SL12 such that there exists spacing between the respective band-like patterns of the gate wiring layers 4b. Further, the gate wiring layers 4b are in contact with the conductor film 17 through the respective openings 18 to be electrically connected therewith.

Figure 123:
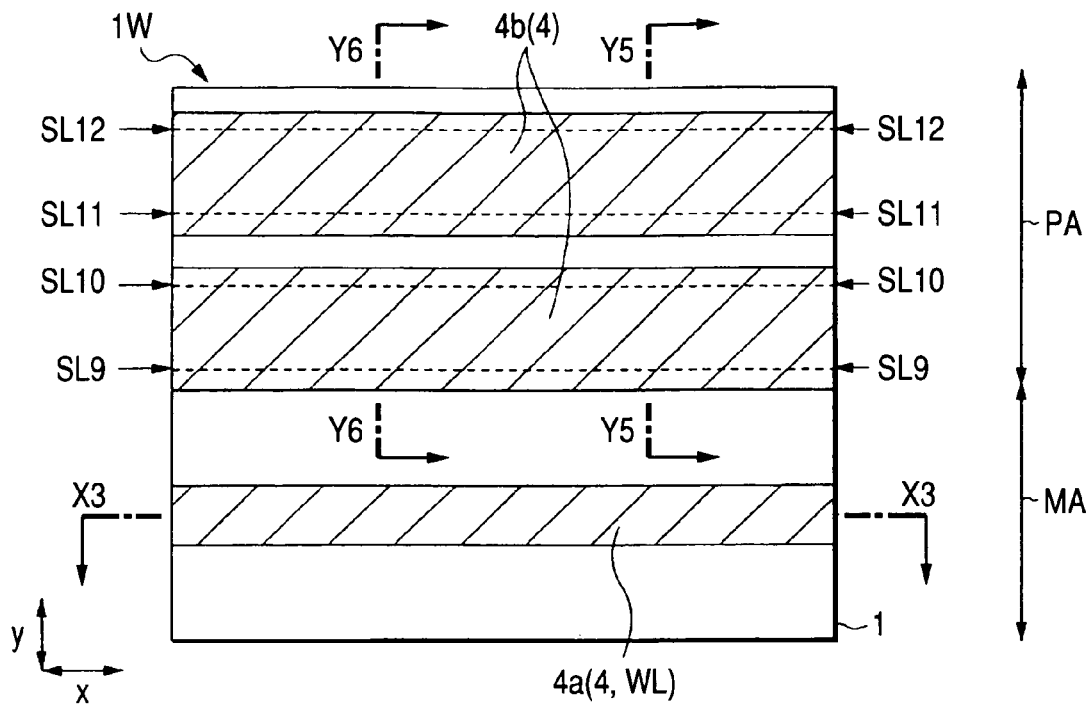
FIG. 123 is a plan view of the wafer in a step of the method of manufacturing the semiconductor device, subsequent to the step shown in FIG. 121.
Figure 127:
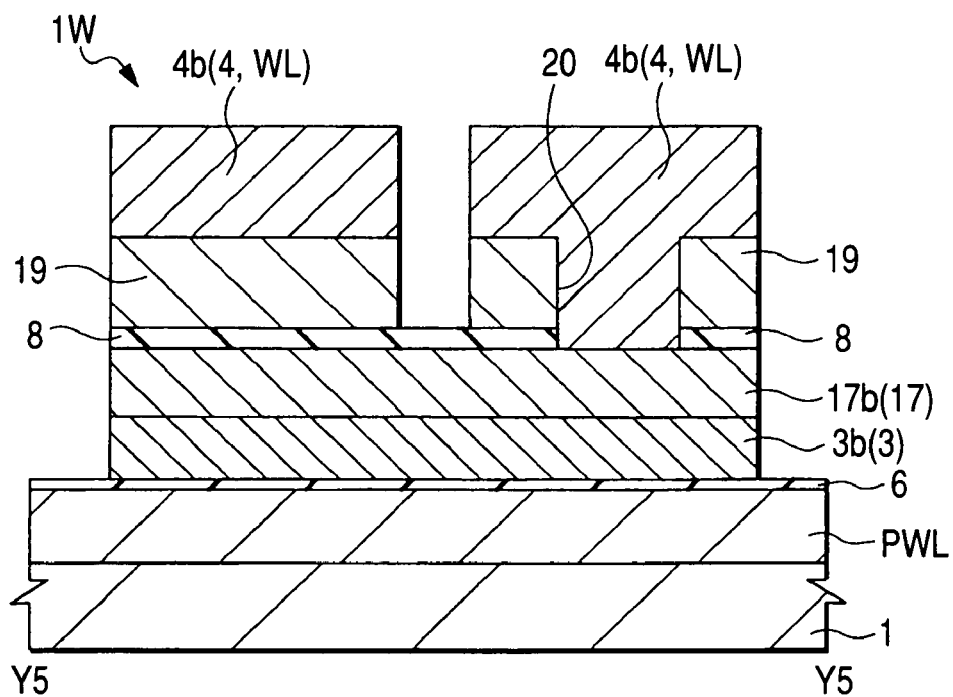
Figure 128:
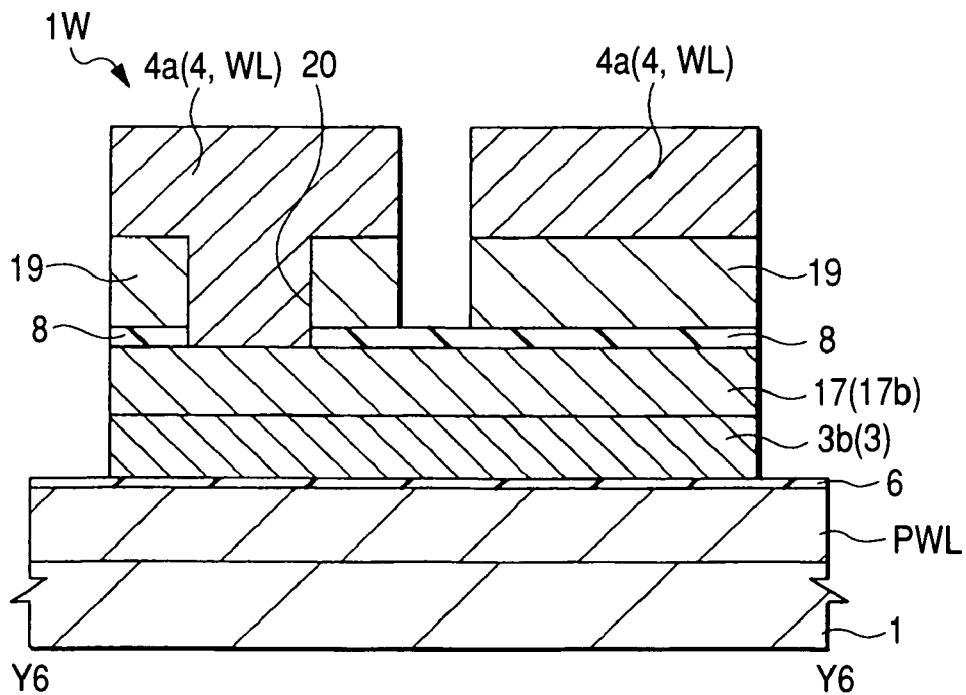

FIGS. 127 and 128 are sectional views taken on lines Y5—Y5 and Y6—Y6 of FIG. 123, respectively, in a step of the method of manufacturing the semiconductor device, subsequent to the step shown in FIG. 123. By covering the spacing between the two gate wiring layers 4b with a resist, the insulator film 8 serving as the interpoly dielectric film, and the conductor films 17, 3 are sequentially etched in that order. As a result, first gate electrodes 3a are formed in the memory region MA, thereby completing memory cells MC. Further, respective gate electrodes 3b, 17b of select nMISes Qs are formed in the peripheral circuit region PA. As shown in FIGS. 127 and 128, the respective gate wiring layers 4b are electrically continuous with the gate electrodes 17b, 3b through the openings 20, respectively. Subsequently, diffusion layers for use as a source and a drain, respectively, for the select nMISes, are formed through implantation of channel ions, and after forming an interpoly dielectric film (not shown), there are formed contact holes reaching word lines WL, a well PWL, the gate wiring layers 4b, and the diffusion layer of each of the select nMISes Qs, on the side thereof, away from the memory cells. Subsequently, a metal film is deposited to be patterned into wiring layers, thereby completing the semiconductor device having nonvolatile memory cells MC.

With the semiconductor device according to the present embodiment, even in the case of implementing pitch relaxation of global bit lines, it is possible to eliminate an increase in area occupied by the select nMISes Qs.

While the preferred embodiments of the invention developed by the inventor have been described with a certain degree of particularity as above, it is to be understood that the scope of the invention is not limited thereto and obviously modifications and variations are possible without departing from the spirit and scope of the invention.

For example, with those embodiments described in the foregoing, there have been described the cases where the well is of a p-type, the select transistors are of an n-channel type, and the memory cells are of an n-channel type, however, the invention is not limited thereto, and those conductivity types may be reversed.

Although there have been described hereinbefore the various cases where the invention of the inventor is applied to the method of manufacturing the flash memory in an application field which is the background of the invention developed by the inventor, the scope of the invention is not limited thereto and the invention is applicable to a method of manufacturing a mixed semiconductor device with a flash memory and logic gates, mounted on the same semiconductor substrate.

Advantageous effects obtained by the representative embodiments of the invention disclosed by the present application are summarized as follows.

That is, after forming the gate insulator film of the transistors for the peripheral circuit region, the isolation grooves are formed in a self-aligned manner in the peripheral circuit region, using the patterns of the conductor films for forming the electrodes in the memory region, as the etching mask, and the isolation parts are formed by filling up the isolation grooves, so that it is possible to enhance reliability of a semiconductor device having a nonvolatile memory.

What is claimed is:
1. A semiconductor device comprising
a semiconductor substrate having a memory region and a peripheral circuit region;
a plurality of nonvolatile memory cells disposed in said memory region;
a plurality of transistors disposed in said peripheral circuit region;
a first wiring layer extending in a first direction; and
a second wiring layer, insulated from said first wiring layer, extending in said first direction,
wherein each said transistor is a transistor to select said memory cell,
wherein each said transistor is disposed along said first direction through each isolation region,
wherein a pair of diffusion layers for use as a source and a drain of said transistor are disposed in a second direction crossing said first direction, wherein said first wiring layer is electrically connected to the electrode corresponding to the odd-number-th one of a plurality of the electrodes of said transistors, and wherein said second wiring layer is electrically connected to the electrode corresponding to the even-number-th one of a plurality of the electrodes of said transistors.

2. A semiconductor device according to claim 1, wherein a contact hole formed between the odd-number-th one of a plurality of the electrodes and said first wiring layer and a contact hole formed between the even-number-th one of a plurality of electrodes and said second wiring layer are disposed so as to stagger with each other in said second direction.

3. A semiconductor device according to claim 1, wherein said first wiring layer and said second wiring layer are disposed over the gate electrode of said transistor in a region between a pair of diffusion layers for use as a source and a drain of said transistor.

4. A semiconductor device according to claim 1, further comprising a plurality of global bit lines, wherein each said transistors is disposed between each said global bit lines and one of said memory cells.

5. A semiconductor device according to claim 4, wherein one global bit line exists every two transistors adjacent to each other.

6. A semiconductor device according to claim 1, wherein said transistor is formed in an active region in said peripheral region, and wherein the width of said active region in said first direction and the width of the electrode of said transistor in said first direction are equal.

7. A semiconductor device according to claim 1, wherein in said memory cells comprises a floating gate and a control gate.

8. A semiconductor device comprising:

a semiconductor substrate having a memory region and a peripheral circuit region;

a plurality of nonvolatile memory cells disposed in said memory region;

a plurality of transistors disposed in said peripheral circuit region;

a first wiring layer extending in a first direction; and a second wiring layer, insulated from said first wiring layer, extending in said first direction, and a plurality of global bit lines extending in a second direction crossing said first direction, wherein each said transistors is disposed along said first direction through each isolation region, wherein a pair of diffusion layers for use as a source and a drain of said transistor are disposed in a second direction, wherein one of said diffusion layers is connected to said global bit line, wherein the other of said diffusion layers is connected to a local source line or a local bit line of said memory cell, and wherein a position where the gate electrode of said transistor and said first wiring are connected and a position where the gate electrode of said transistor and said second wiring are staggered in said second direction.

9. A semiconductor device according to claim 8, wherein said first wiring layer and said second wiring layer are disposed over the gate electrode of said transistor in a region between a pair of diffusion layers for use as a course and a drain of said transistor.

10. A semiconductor device according to claim 8, wherein one global bit line exists every two local bit lines.

11. A semiconductor device according to claim 8, wherein said transistor is formed in an active region in said peripheral region, and wherein the width of said active action in said first direction and the width of the electrode of said transistor in said first direction are equal.

12. A semiconductor device according to claim 8, wherein each said memory cells comprises a floating gate and a control gate.

* * * * *